US010410781B2

United States Patent
Araki et al.

(10) Patent No.: US 10,410,781 B2
(45) Date of Patent: Sep. 10, 2019

(54) SUPERCONDUCTOR AND METHOD FOR MANUFACTURING SAME

(71) Applicant: Kabushiki Kaisha Toshiba, Minato-ku (JP)

(72) Inventors: Takeshi Araki, Koto (JP); Hiroyuki Fuke, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 526 days.

(21) Appl. No.: 15/420,809

(22) Filed: Jan. 31, 2017

(65) Prior Publication Data

US 2018/0012689 A1 Jan. 11, 2018

Related U.S. Application Data

(63) Continuation of application No. PCT/JP2015/059002, filed on Mar. 24, 2015.

(51) Int. Cl.
*H01F 6/06* (2006.01)
*H01B 12/06* (2006.01)
(Continued)

(52) U.S. Cl.
CPC .............. *H01F 6/06* (2013.01); *H01B 12/06* (2013.01); *H01F 1/0571* (2013.01);
(Continued)

(58) Field of Classification Search
None
See application file for complete search history.

(56) References Cited

U.S. PATENT DOCUMENTS 6,602,588 B1 *  8/2003 Kwon .................. H01L 39/128
                                                257/E39.011
7,833,941 B2 * 11/2010 Araki ................. C23C 18/1216
                                                505/123

(Continued)

FOREIGN PATENT DOCUMENTS

JP           64-69562      3/1989
JP           10-125146     5/1998
(Continued)

OTHER PUBLICATIONS

International Search Report dated Jun. 30, 2015 in PCT/JP2015/059002 filed on Mar. 24, 2015 (with English translation).

(Continued)

*Primary Examiner* — Colleen P Dunn
(74) *Attorney, Agent, or Firm* — Oblon, McClelland, Maier & Neustadt, L.L.P.

(57) ABSTRACT

According to an embodiment, a superconductor includes a base member, and a superconducting layer provided on the base member. The superconducting Layer has a first surface on the base member side, and a second surface on the side opposite to the first surface. The lattice constant of the base member substantially matches the lattice constant of the superconducting layer. The superconducting layer includes $REA_{1-x}REB_xBa_2Cu_3O_{7-z}$. The x is not less than 0.01 and not more than 0.40. The z is not less than 0.02 and not more than 0.20. The REA includes at least one of Y, Eu, Gd, Tb, Dy, Ho, Er, Tm, Yb, or Lu. The REB includes at least one of Nd or Sm. The superconducting layer includes a first surface-side region including a portion of the first surface. The first surface-side region includes a first region having an orientation property, and a second region.

15 Claims, 32 Drawing Sheets

(51) Int. Cl.
  *H01F 1/057* (2006.01)
  *H01L 39/12* (2006.01)
  *H01L 39/24* (2006.01)

(52) U.S. Cl.
  CPC ........ *H01L 39/126* (2013.01); *H01L 39/2425* (2013.01); *H01L 39/2451* (2013.01); *H01L 39/2483* (2013.01)

(56) References Cited

U.S. PATENT DOCUMENTS

| | | | |
|---|---|---|---|
| 7,871,663 | B1 | 1/2011 | Barnes et al. |
| 8,389,045 | B2 * | 3/2013 | Araki ................. C23C 18/1216 29/599 |
| 2004/0029738 | A1 * | 2/2004 | Adachi ................. C30B 25/02 505/100 |
| 2005/0159298 | A1 | 7/2005 | Rupich et al. |
| 2006/0153969 | A1 | 7/2006 | Araki et al. |
| 2008/0139393 | A1 * | 6/2008 | Araki ................. C23C 18/1216 505/123 |
| 2008/0153709 | A1 | 6/2008 | Rupich et al. |
| 2011/0124508 | A1 | 5/2011 | Miura et al. |
| 2011/0172103 | A1 * | 7/2011 | Araki ................. C23C 18/1216 505/123 |

FOREIGN PATENT DOCUMENTS

| | | |
|---|---|---|
| JP | 2002-527345 | 8/2002 |
| JP | 2003-59352 | 2/2003 |
| JP | 2006-44963 | 2/2006 |
| JP | 2007-526199 | 9/2007 |
| JP | 2008-137833 | 6/2008 |
| JP | 2009-164010 | 7/2009 |

OTHER PUBLICATIONS

Written Opinion dated Jun. 30, 2015 in PCT/JP2015/059002 filed on Mar. 24, 2015.
Takeshi Araki, et al., "High-Critical-Temperature Sm- and Nd-Based Superconductors Produced by Metal Organic Deposition Using Trifluoroacetates and Pentafluoropropionates", Japanese Journal of Applied Physics, vol. 44, (36), 2005, 3 pgs.

* cited by examiner

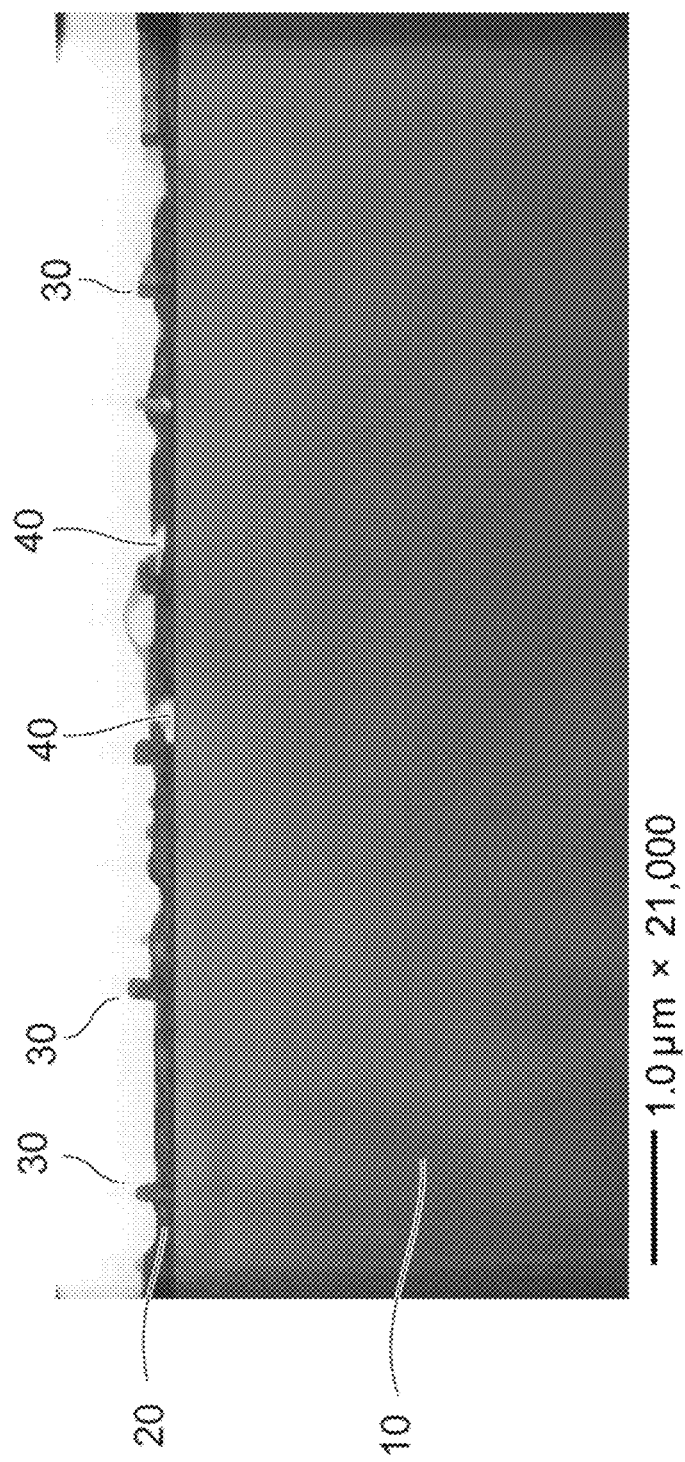

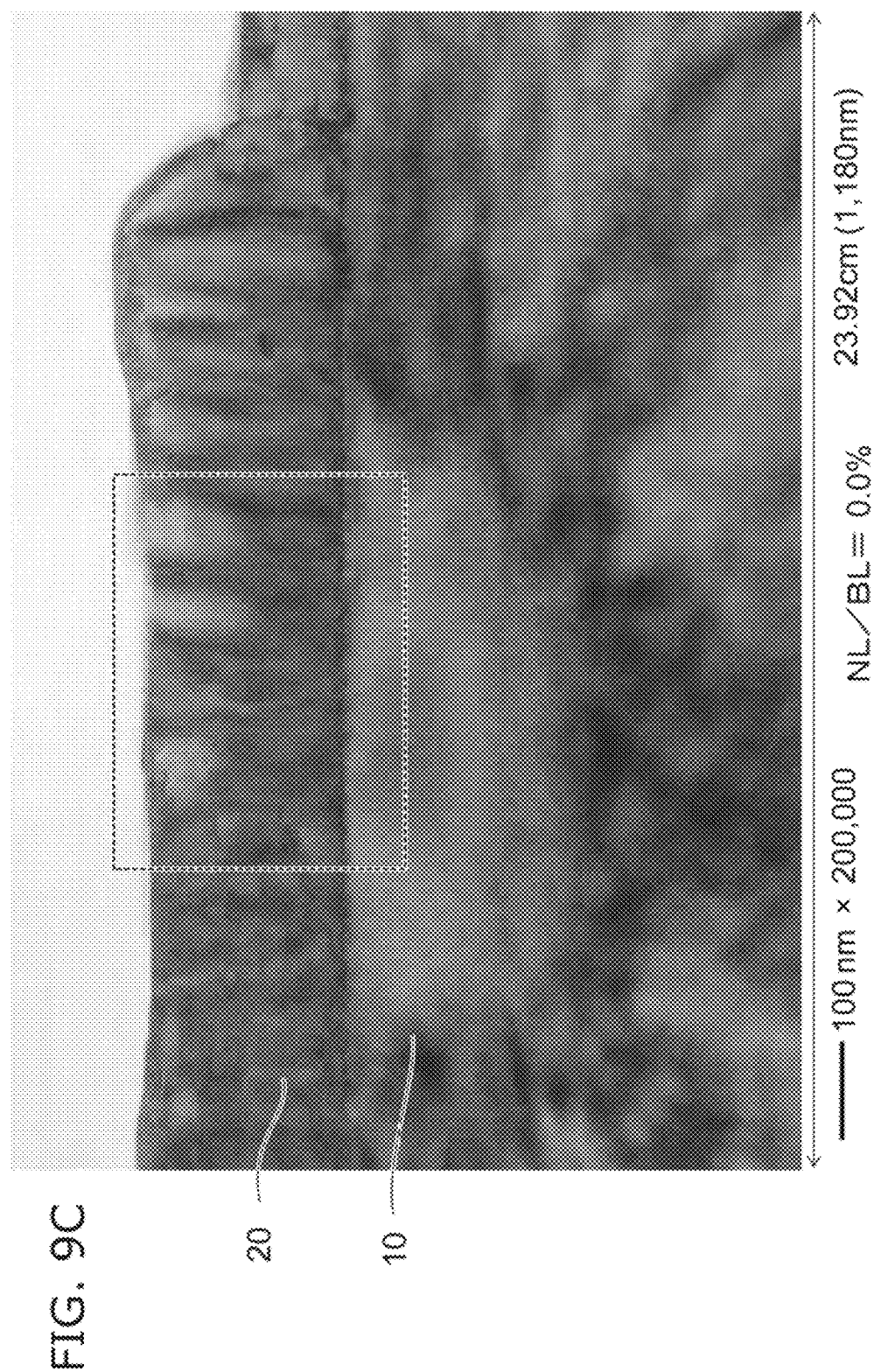

SUPERCONDUCTOR AND METHOD FOR MANUFACTURING SAME

CROSS-REFERENCE TO RELATED APPLICATIONS

This is a continuation application of International Application PCT/JP2015/059002, filed on Mar. 24, 2015; the entire contents of which are incorporated herein by reference.

FIELD

Embodiments of the invention relate to a superconductor and a method for manufacturing the superconductor.

BACKGROUND

There are expectations for applications of superconductors in, for example, power transmission cables, fusion reactors, magnetically levitated trains, particle accelerators, magnetic diagnostic devices (MRI), etc. It is desirable to increase the critical current density of the superconductor. Thereby, a large current can be caused to flow through the same cross-sectional area.

BRIEF DESCRIPTION OF THE DRAWINGS

FIG. 7A to FIG. 7H are cross-section TEM images of the sample;

FIG. 9A to FIG. 9F are cross-section TEM images of the sample;

DETAILED DESCRIPTION

Figure 1A:
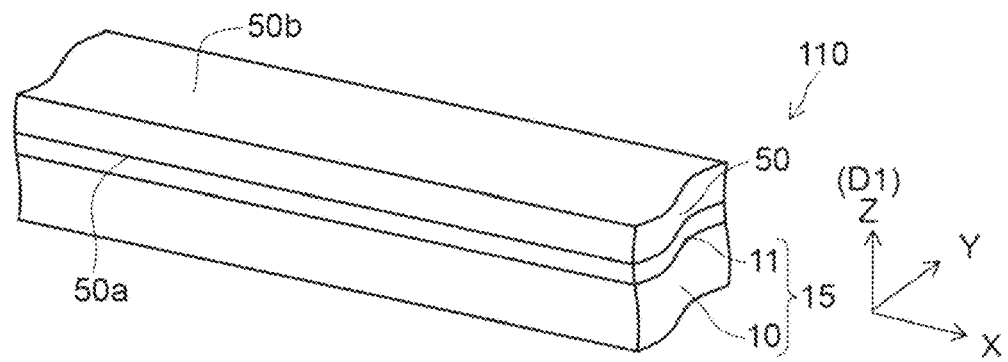
FIG. 1A to FIG. 1C are schematic views showing the superconductor according to the embodiment.

According to an embodiment of the invention, a superconductor includes a base member, and a superconducting layer provided on the base member. The superconducting layer has a first surface on the base member side, and a second surface on the side opposite to the first surface. The lattice constant of the base member substantially matches the lattice constant of the superconducting layer. The superconducting layer includes $REA_{1-x}REB_xBa_2Cu_3O_{7-z}$. The x is not less than 0.01 and not more than 0.40. The z is not less than 0.02 and not more than 0.20. The REA includes at least; one of Y, Eu, Gd, Tb, Dy, Ho, Er, Tm, Yb, or Lu. The REB includes at least one of Nd or Sm. The superconducting layer includes a first surface-side region including a portion of the first surface. The thickness of the first surface-side region along a first direction is 70% of the average thickness of the superconducting layer along the first direction, where the first direction is from the first surface toward the second surface. The length of the first surface-side region along a second direction parallel to the first surface is 2 micrometers. The first surface-side region includes a first region having an orientation property, and a second region. The orientation property in the second region is lower than the orientation property in the first region. The length of the second region along the second direction is not more than 0.15 times the length of the first surface-side region.

Various embodiments will he described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

A superconductor according to an embodiment relates to, for example, a superconducting wire and applications of the superconducting wire. The embodiment relates to, for example, an oxide superconducting cable. For example, the oxide superconducting cable is used in at least one of a superconducting power transmission cable, a superconducting coil, a superconducting magnet, an MRI device, a magnetically levitated train, or SMES (Superconducting Magnetic Energy Storage).

Figure 1B:
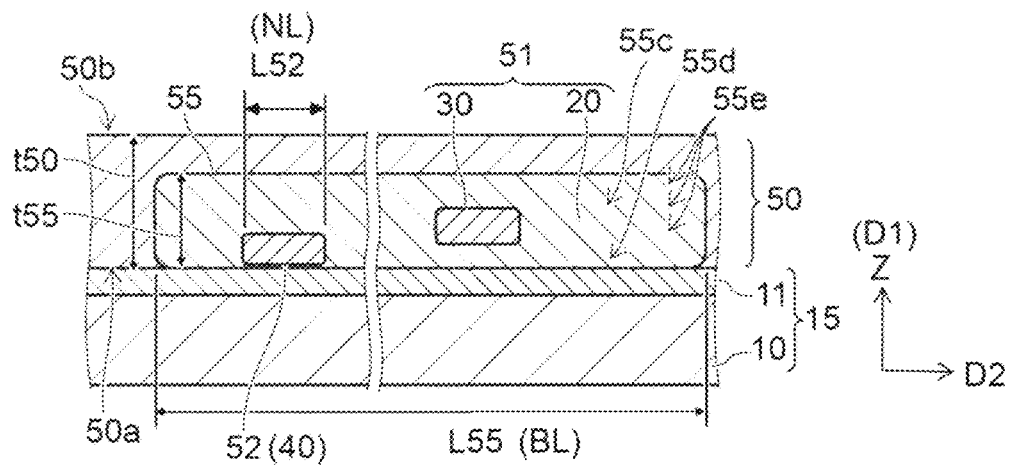
Figure 1C:
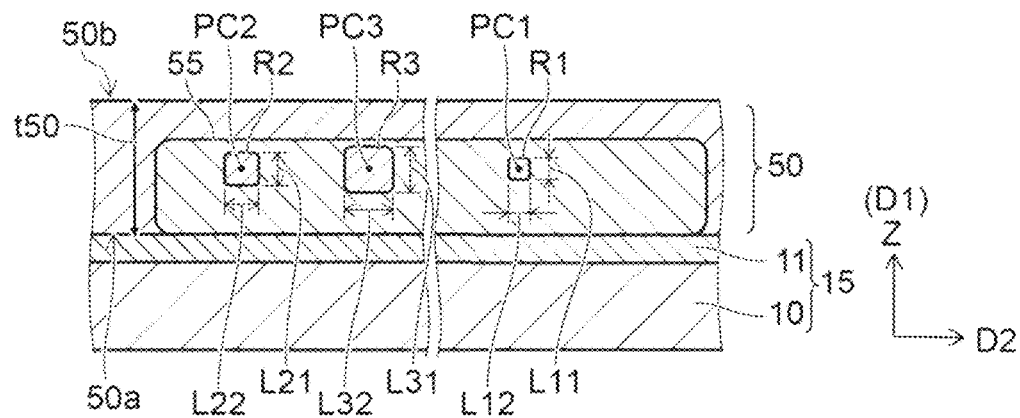

FIG. 1A to FIG. 1C are schematic views showing the superconductor according to the embodiment.

FIG. 1A is a perspective view; FIG. 1B is a cross-sectional view; and FIG. 1C is a cross-sectional view.

As shown in FIG. 1A, a superconductor 110 according to the embodiment includes a base member 15 and a superconducting layer 50. The superconducting layer 50 is provided on the base member 15.

In the example, the base member 15 includes a substrate 10 and a foundation layer 11. The foundation layer 11 is provided between the substrate 10 and the superconducting layer 50. In other words, the foundation layer 11 is provided on the substrate 10; and the superconducting layer 50 is provided on the foundation layer 11.

The superconducting layer 50 includes $REA_{1-x}REB_xBa_2Cu_3O_{7-z}$. The composition ratio x is, for example, not less than 0.01 and not more than 0.40. The composition ratio z is, for example, not less than 0.02 and not more than 0.20. The REA includes at least one of Y, Eu, Gd, Tb, Dy, Ho, Er, Tm, Yb, or Lu. The REB includes at least one of Nd or Sm.

In the embodiment, the REB includes, for example, Sm. In such a case, the composition ratio x is not less than 0.01 and not more than 0.40. In the embodiment, in the case where the REB includes Nd, the composition ratio x is, for example, not less than 0.01 and not more than 0.30.

As shown in FIG. 1A, the superconducting layer 50 has a first surface 50a and a second surface 50b. The first surface 50a is the surface on the base member 15 side. The first surface 50a opposes the base member 15. The second surface 50b is the surface on the side opposite to the first surface 50a. The first surface 50a is, for example, the lower surface; and the second surface 50b is, for example, the upper surface.

For example, a first direction D1 from the first surface 50a toward the second surface 50b is taken as a Z-axis direction. One direction perpendicular to the Z-axis direction is taken as an X-axis direction. A direction perpendicular to the Z-axis direction and the X-axis direction is taken as a Y-axis direction.

The substrate 10 is, for example, a monocrystalline substrate. The substrate 10 includes, for example, at least one of $LaAlO_3$, $SrTiO_3$, $NdGaO_3$, $Al_2O_3$, MgO, or YSZ (yttria-stabilized zirconia).

In the case where the foundation layer 11 is provided, the foundation layer 11 includes, for example, at least one of $CeO_2$, $LaMnO_3$, $SrTiO_3$, or $LaAlO_3$. The foundation layer 11 may be, for example, one layer. The foundation layer 11 may include multiple layers. The foundation layer 11 may include, for example, a stacked body of a $CeO_2$ layer, a YSZ layer, and a $Y_2O_3$ layer.

For example, the lattice constant of the base member 15 substantially matches the lattice constant of the superconducting layer 50. The lattice constant is the lattice length along one direction substantially perpendicular to the first direction D1 (the Z-axis direction). In such a case, three types of matching exist.

For example, the lattice constant of the base member 15 is substantially the same as the lattice constant of the superconducting layer 50. In other words, the lattice constant of the base member 15 is not less than 0.93 times and not more than 1.07 times the lattice constant of the superconducting layer 50.

Or, the lattice constant of the base member 15 is substantially the same as $2^{1/2}$ times the lattice constant of the superconducting layer 50. In other words, the lattice constant of the base member 15 is not less than 1.32 times and not more than 1.54 times the lattice constant of the superconducting layer 50.

Or, the lattice constant of the base member 15 is substantially the same as $(1/(2^{1/2}))$ times the lattice constant of the superconducting layer 50. In other words, the lattice constant of the base member 15 is not less than 0.649 times and not more than 0.758 times the lattice constant of the superconducting layer 50.

The lattice constant of the superconducting layer 50 along a direction perpendicular to the first direction D1 is taken as a first lattice constant, where the first direction D1 is from the first surface 50a toward the second surface 50b. In such a case, the base member 15 has one of a second lattice constant, a third lattice constant, or a fourth lattice constant, where the second lattice constant is along the perpendicular direction recited above and is not less than 0.93 times and not more than 1.107 times the first lattice constant, the third lattice constant is along the perpendicular direction recited above and is not less than 1.32 times and not more than 1.54 times the first lattice constant, and the fourth lattice constant is along the perpendicular direction recited above and is not less than 0.649 times and not more than 0.758 times the first lattice constant.

For example, the substrate 10 has one of a lattice constant along the perpendicular direction recited above that is not less than 0.93 times and not more than 1.107 times the first lattice constant, a lattice constant along the perpendicular direction recited above that is not less than 1.32 times and not more than 1.54 times the first lattice constant, or a lattice constant along the perpendicular direction recited above that is not less than 0.649 times and not more than 0.758 times the first lattice constant.

For example, the foundation layer 11 has one of a lattice constant along the perpendicular direction recited above that is not less than 0.93 times and not more than 1.107 times the first lattice constant, a lattice constant along the perpendicular direction recited above that is not less than 1.32 times and not more than 1.54 times the first lattice constant, or a lattice constant along the perpendicular direction recited above that is not less than 0.649 times and not more than 0.758 times the first lattice constant.

As shown in FIG. 1B, the superconducting layer 50 includes a first surface-side region 55. The first surface-side region 55 includes a portion of the first surface 50a.

A thickness t55 of the first surface-side region 55 along the first direction D1 is 70% of an average thickness t50 of the superconducting layer along the first direction D1. In other words, the first surface-side region 55 is the region from the first surface 50a to the position of 70% of the average thickness t50 of the superconducting layer 50.

The length along a second direction D2 of the first surface-side region 55 is taken as a length L55. The second direction D2 is a direction parallel to the first surface 50a. In the embodiment, the length L55 is, for example, 2 micrometers (μm).

For example, the first surface-side region 55 includes a first region 51 and a second region 52. The first region 51 has an orientation property. The second region 52 is arranged with the first region 51 in a direction (that may be, for example, the second direction D2) crossing the first direction D1. The orientation property of the second region 52 is lower than the orientation property of the first region 51. The second region 52 is, for example, a non-oriented region 40.

The superconducting layer 50 includes, for example, a c-axis orientation region 20. The superconducting layer 50 may include, for example, an a/b-axis orientation region 30. The a/b-axis orientation region 30 is a region having the a-axis orientation or the b-axis orientation. The superconducting layer 50 may further include, for example, the non-oriented region 40.

The first region 51 includes the c-axis orientation region 20. The first region 51 may include, for example, the a/b-axis orientation region 30. For example, the first region 51 has a perovskite structure.

In the embodiment, the amount of the second region 52 (e.g., the non-oriented region 40) in the first surface-side region 55 is low. In the embodiment, the amount of the first region 51 (e.g., the c-axis orientation region 20, the a/b-axis orientation region 30, etc.) in the first, surface-side region 55 is high.

A length L52 of the second region 52 along the second direction D2 is not more than 0.15 times (e.g., less than 0.15 times) the length L55 of the first surface-side region 55. The length L52 may be not more than 0.147 times the length L55. The length L52 may be not more than 0.123 times the length L55. The length L52 may be not more than 0.118 times the length L55. The length L52 may be not more than 0.08 times the length L55.

In such a superconductor 110, the critical current density can be high.

In the embodiment, there are cases where the first surface-side region 55 includes multiple second regions 52. In such a case, the length L52 is the total of the lengths along the second direction D2 of the multiple second regions 52. In such a case, the length L52 may be not more than 0.15 times (e.g., less than 0.15 times) the length L55. The length L52 may be not more than 0.147 times the length L55. The length L52 may be not more than 0.123 times the length L55. The length 152 may be not more than 0.118 times the length L55.

In the embodiment, there are cases where the first surface-side region 55 includes the multiple second regions 52; and two or more of the multiple second regions 52 overlap in the first direction D1. In such a case, the two or more second regions 52 that overlap in the first direction D1 are considered to be one second region 52. Then, the length along the second direction D2 of the region considered to be the one second region 52 is the total of the lengths along the second direction D2 of at least one of the two or more second regions 52 overlapping in the first direction D1. In such a case, the two or more second regions 52 that overlap in the first direction D1 are considered to be one second region 52; and the length L52 is the total of the lengths along the second direction D2 of the multiple second regions 52. In such a case, this is not more than 0.15 times (e.g., less than 0.15 times) the length L55 of the first surface-side region 55 of the second region 52. The length L52 may be not more than 0.147 times the length L55. The length L52 may be not more than 0.123 times the length L55. The length L52 may be not more than 0.118 times the length L55.

In the embodiment, the second region 52 (e.g., the non-oriented region 40) may not exist in the first surface-side region 55. In other words, the second region 52 (e.g., the non-oriented region 40) does not exist for lengths in the range, of 2 μm. In other words, the first surface-side region 55 having a length of 2 μm is made of the first region 51 (e.g., the c-axis orientation region 20, the a/b-axis orientation region 30, etc.). In other words, the first surface-side region 55 is made of the c-axis orientation region 20 and the a/b-axis orientation region 30 (the a-axis orientation region and the b-axis orientation region).

In such a superconductor 110, the critical current density can be high.

In the embodiment, the average thickness (the average thickness along the first direction D1) of the superconducting layer 50 is, for example, 200 nanometers or more. The thickness may be 220 nanometers or more. The thickness may be 1 μm or more.

In the embodiment, the concentration of fluorine in the first surface-side region 55 is not less than $2 \times 10^{16}$ atoms/cm$^3$ and not more than $5 \times 10^{19}$ atoms/cm$^3$. The concentration of carbon in the first surface-side region 55 is not less than $1 \times 10^{18}$ atoms/cm$^3$ and not more than $5 \times 10^{20}$ atoms/cm$^3$.

The concentration of fluorine (e.g., the residual fluorine amount) and the concentration of carbon (e.g., the residual carbon amount) recited above are, for example, amounts obtained by TFA-MOD (Metal Organic Deposition using a TriFluoroAcetate). The characteristics degrade when the residual carbon amount increases. By using the heat treatment pattern according to the embodiment, etc., the residual carbon amount can be suppressed; and good superconducting characteristics are obtained. In the case where the residual fluorine amount is not excessively high, good conducting characteristics are obtained.

In the superconductor 110 according to the embodiment as shown in FIG. 1C, the superconducting layer 50 includes a first partial region R1, a second partial region R2, and a third partial region R3.

The center in the first direction D1 of the first partial region R1 is a first center position PC1.

The center in the second direction D2 of the first partial region R1 is the first center position PC1.

The length along the first direction D1 of the first partial region R1 is taken as a length L11.

The length along the second direction D2 of the first partial region R1 is taken as a length L12.

The distance along the first direction D1 between the first center position PC1 and the first surface 50a is ½ of the first thickness t50.

The center in the first direction D1 of the second partial region R2 is a second center position PC2.

The center in the second direction D2 of the second partial region R2 is the second center position PC2.

The length along the first direction D1 of the second partial region R2 is taken as a length L21.

The length along the second direction D2 of the second partial region R2 is taken as a length L22.

The distance along the first direction D1 between the second center position PC2 and the first surface 50a is ½ of the first thickness t50.

The center in the first direction D1 of the third partial region R3 is a third center position PC3.

The center in the second direction D2 of the third partial region R3 is the third center position PC3.

The length along the first direction D1 of the third partial region R3 is taken as a length L31.

The length along the second direction D2 of the third partial region R3 is taken as a length L32.

The distance along the first direction D1 between the third center position PC3 and the first surface 50a is ½ of the first thickness t50.

For example, the first thickness t50 is 100 nm or more. In such a case, for example, the length L11 and the length L12 recited above each are 2 nm; the lengths L21 and L22 recited above each are 10 nm; and the lengths L31 and L32 recited above each are 50 nm.

In such a case, the amount (the amount of all) of the metallic element included in the first partial region R1 is taken as an amount Ta1. On the other hand, the amount of the REB included in the first partial region R1 is taken as an amount Tb1. In such a case, the ratio of the amount of the REB included in the first partial region R1 to the amount of the metallic element included in the first partial region R1 is taken as a first ratio RR1. The first ratio RR1 is Tb1/Ta1. The amount (the amount of all) of the metallic element included in the second partial region R2 is taken as art amount Ta2. On the other hand, the amount of the REB included in the second partial region R2 is taken as an amount Tb2. In such a case, the ratio of the amount of the REB included in the second partial region R2 to the amount of the metallic element included in the second partial region R2 is taken as a second ratio RR2. The second ratio RR2 is Tb2/Ta2. The amount (the amount of all) of the metallic element included in the third partial region R3 is taken as an amount Ta3. On the other hand, the amount of the REB included in the third partial region R3 is taken as an amount Tb3. In such a case, the ratio of the amount of the REB included in the third partial region R3 to the amount of the metallic element included in the third partial region R3 is taken as a third ratio RR3. The third ratio RR3 is Tb3/Ta3.

In the embodiment, the variance of the first ratio RR1, the second ratio RR2, and the third ratio RR3 is not more than 0.325 times the average (the arithmetic average) of the first ratio RR1, the second ratio RR2, and the third ratio RR3. In other words, the fluctuation of the amount of the REB included in these regions is small.

Thus, in the superconducting layer 50, the amounts relating to the REB (e.g., the first ratio RR1, the second ratio RR2, the third ratio RR3, etc.) are uniform. Thereby, a superconductor can be provided in which it is possible to increase the critical current density.

In the embodiment, for example, the concentration of the REB in the portion of the first surface-side region 55 proximal to the first surface 50a is higher than the concentration of the REB in the portion of the first surface-side region 55 distal to the first surface 50a.

In other words, as shown in FIG. 1B, the first surface-side region 55 includes a third region 55c and a fourth region 55d. The fourth region 55d is provided between the third region 55c and the base member 15. The fourth region 55d has the first surface 50a. The thickness along the first direction D1 of the fourth region 55d is 50 nm. The portion (the upper portion) of the first surface-side region 55 other than the fourth region 55d is the third region 55c. The ratio (a fourth region ratio) of the ratio of the amount of the REB included in the fourth region 55d to the amount of the metallic element (the amount of all of the metallic elements) included in the fourth region 55d is not less than the ratio (a third region ratio) of the amount of the REB included in the third region 55c to the amount of the metallic element (the amount of all of the metallic elements) included in the third region 55c. For example, the fourth region ratio may be higher than 1 times the third region ratio. For example, the fourth region ratio may be not more than 3.5 times the third region ratio.

For example, the concentration (the ratio) of the REB in the third region 55c of the first surface-side region 55 is relatively uniform. In other words, in the case where multiple fifth regions 55e (referring to FIG. 1B) are included in the third region 55c, the amount (the ratio) of the REB in the multiple fifth regions 55e is relatively uniform. For example, the third region 55c includes the multiple fifth regions 55e. For example, the multiple fifth regions 55e are arranged along the first direction D1. The length along the first direction D1 of each of the multiple fifth regions 55e is 10 nm. The length along the second direction D2 of each of the multiple fifth regions 55e is 10 nm. The amount of the REB in each of such multiple fifth regions 55e is relatively uniform. For example, each of the multiple fifth regions 55e has a ratio (a fifth region ratio) of the amount of the REB included in each of the multiple fifth regions 55e to the amount of the metallic element included in the multiple fifth regions 55e. In such a case, the variance of the fifth region ratios of the multiple fifth regions 55e is not more than 0.18 times the average (the arithmetic average) of the fifth region ratios of the multiple fifth regions 55e. Because the amount (the ratio) of the REB in the multiple fifth regions 55e is uniform, good characteristics (a high Jc value) are obtained easily.

An example of a method for manufacturing the superconductor 110 according to the embodiment will now be described.

FIG. 2A to FIG. 2D are schematic views illustrating the method for manufacturing the superconductor according to the embodiment.

Figure 2A:
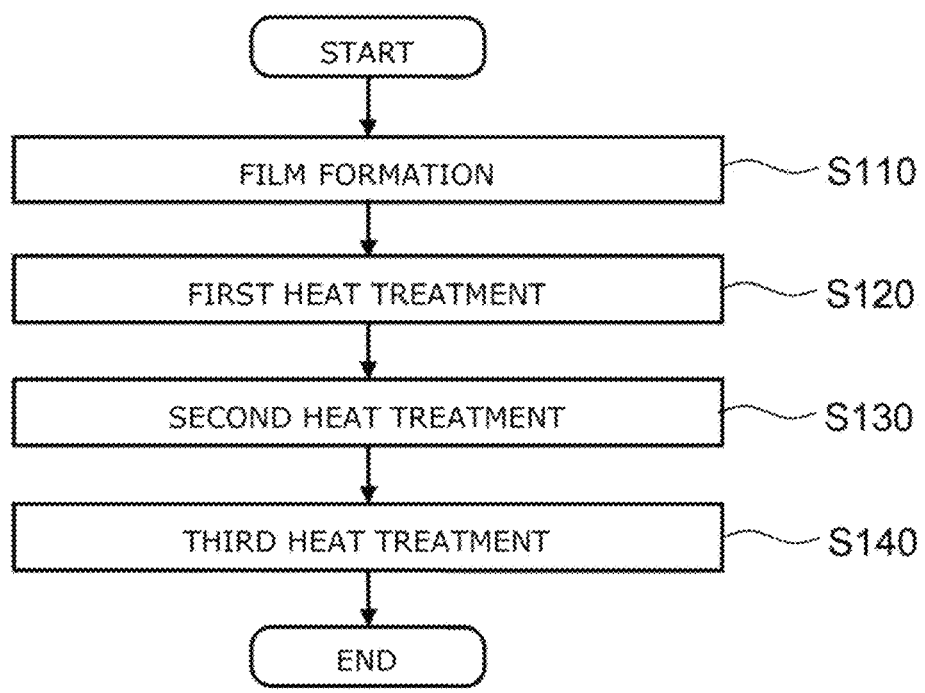
FIG. 2A to FIG. 2D are schematic views illustrating the method for manufacturing the superconductor according to the embodiment.

FIG. 2A is a flowchart illustrating the method for manufacturing the superconductor according to the embodiment.

Figure 2B:
Figure 2C:
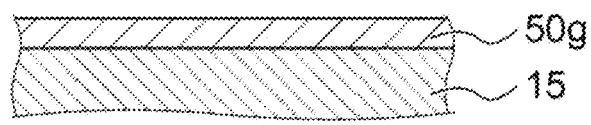
Figure 2D:
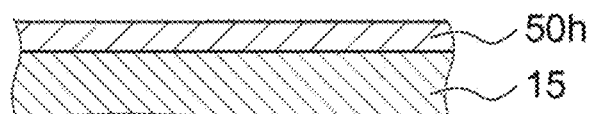

FIG. 2B to FIG. 2D are schematic cross-sectional views illustrating the method for manufacturing the superconductor according to the embodiment.

As shown in FIG. 2A, the manufacturing method includes a film formation process (step S110), a first heat treatment process (step S120), a second heat treatment process (step S130), and a third heat treatment process (step S140).

In the film formation process as shown in FIG. 2B, a film 50f that includes a solution is formed on the base member 15 by coating a solution including a trifluoroacetate, a pentafluoropropionic acid salt, and methanol on the base member 15. The trifluoroacetate includes a REA including at least one of Y, Eu, Gd, Tb, Dy, Ho, Er, Tm, Yb, or Lu, and a REB including at least one of Nd or Sm. On the other hand, the pentafluoropropionic acid salt recited above includes the REB recited above.

In the first heat treatment process, heat treatment of the film 50f recited above is performed at a first temperature.

In the second heat treatment process as shown in FIG. 2C, first layer 50g that has a perovskite structure is formed from the film 50f by performing heat treatment of the film 50f recited above at a second temperature that is higher than the first temperature after the first heat treatment process.

In the third heat treatment process as shown in FIG. 2D, a second layer 50h that includes $REA_{1-x}REB_xBa_2Cu_3O_{7-x}$ is formed by performing heat treatment of the first layer 50g in an atmosphere including oxygen. The composition ratio x is not less than 0.01 and not more than 0.40. The composition ratio z is not less than 0.02 and not more than 0.20.

In the embodiment, at least one of three groups bonded to the REB included in the solution recited above is trifluoroacetic acid.

By such a manufacturing method, a method for manufacturing a superconductor can be provided in which it is possible to increase the critical current density.

The first temperature recited above is not less than 200° C. and not more than 450° C. The first heat treatment process includes decomposing at least a portion of an organic substance included in the film 50f. The second temperature recited above is not less than 700° C. and not more than 900° C. Thereby, the first layer 50g that has the perovskite structure is formed. In the composition of the second layer 50h, the number of oxygen atoms (i.e., the "7-z" recited above) is not less than 6.80 and not more than 6.98. Good superconducting characteristics are obtained. The number of oxygen atoms may be not less than 6.85 and not more than 6.95. Better superconducting characteristics are obtained.

In the embodiment, the solution recited above may further include at least one of a heptafluorobutyl acid salt including the REB or a nonafluoropentanoic acid salt including the REB.

In the embodiment, first, to synthesize a Sm salt having high purity, for example, Sm-pentafluoropropionic acid (Sm-PFP) is synthesized and refined by using the following method.

In Sm-PFP, not less than ⅓ of the PFP groups is replaced with a trifluoroacetic acid (TFA) group. The replacement is performed at conditions at which a decomposition reaction (e.g., esterification) substantially does not occur. The replacement reaction does not occur easily. Therefore, the replacement reaction is implemented in a state in which a large amount of the Sm-PFP salt is diluted with methanol. After the replacement reaction, refining and concentrating are performed under conditions at which the esterification is suppressed. Thereby, a substance is made in which a portion of the PFP is replaced with TFA.

A solution is prepared by mixing a first substance and a second substance. The first substance includes REB and TFA. In the first substance, a portion of the PFP bonded to the REB is replaced with TFA. The second substance includes Ba and Cu. In the prepared solution, the metal mole ratio REB:Ba;Cu substantially is 1:2:3. Then, a superconducting film is made using the solution.

The number of the PFP bonded to the REB (e.g., Sm) is 3 in the initial processing. In the embodiment, the number of the PFP is reduced. When the number of refinings is increased, it is difficult to excessively increase the number of refinings because the esterification also increases. Therefore, for example, the refining is implemented by setting the number of refinings to be 1 to 7 times. When mixing YBCO and the substance in which the portion of the PFP is replaced with TFA, the proportion of the substance in which the portion of the PFP is replaced with TFA is set to be, for example, 40 mol % or less in the case where the substance in which the portion of the PFP is replaced with TFA is Sm-PFP. In the case where the substance in which the portion of the PFP is replaced with TFA is Nd-PFP, the proportion is set to be, for example, 30 mol % or less. Thereby, a superconductor is obtained in which the properties of a SmBCO superconductor or a NdBCO superconductor are partially obtained; Sm or Nd is dispersed uniformly in the Y sites; and the formation of the non-oriented region 40 is suppressed.

In the embodiment, a designated element may be used as "Y." The designated element is any heavy rare earth element of Eu to Lu. The element that is used enters the Y sites; and a superconductor is obtained. The solution synthesis process of the designated element is the same as the synthesis process in the case where Y is used. Synthesis and refining using a TFA salt are possible in solution synthesis from a metallic acetate including the REA; and PFP is unnecessary.

Experiments performed by the inventor of the application will now be described.

Figure 3A:
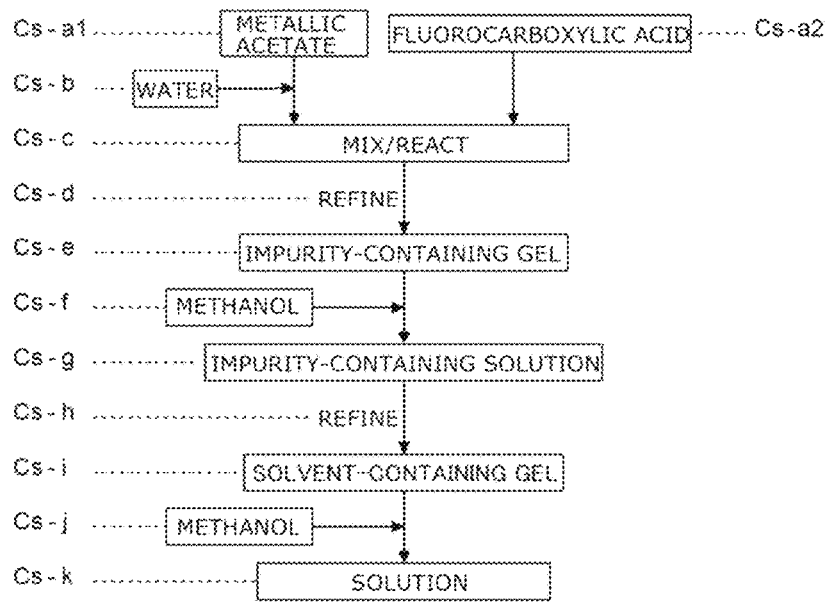
FIG. 3A to FIG. 3C are flowcharts relating to the experiments.
Figure 3B:
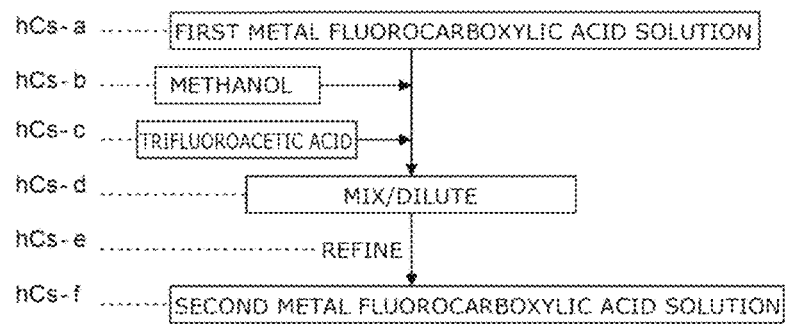

FIG. 3A and FIG. 3B are flowcharts relating to the experiments.

FIG. 3A is a flowchart illustrating a preparation method of a coating solution.

As shown in FIG. 3A, for the source material solution of the SmBCO and NdBCO superconductors, first, a half solution of a Sm-PFP and Nd-PFP methanol solution is prepared; and pentafluoropropionic acid is used as the fluorocarboxylic acid. In other cases, trifluoroacetic acid is used as the fluorocarboxylic acid regardless of how many types of metallic acetates and when half solutions (e.g., a solution in which the metal-ion mole ratio Y:BaLCu is 1:2:3, a solution in which the metal-ion mole ratio Ba:Cu is 2:3, etc.) are included. For the metallic acetate including the metal of the REA other than Sm and Nd, esterification which is a decomposition reaction does not occur easily; refining at strong conditions is possible; and good superconducting characteristics are obtained easily.

FIG. 3B is a refining flowchart of a Sm-PFP or Nd-PFP methanol solution which is a half solution.

The refining is performed multiple times. In the refining of the first time, the fluorocarboxylic acid of step hCs-a is only pentafluoropropionic acid. In the refining of second and subsequent times, the fluorocarboxylic acid of step hCs-a is a mixture of pentafluoropropionic acid and trifluoroacetic acid.

Figure 3C:
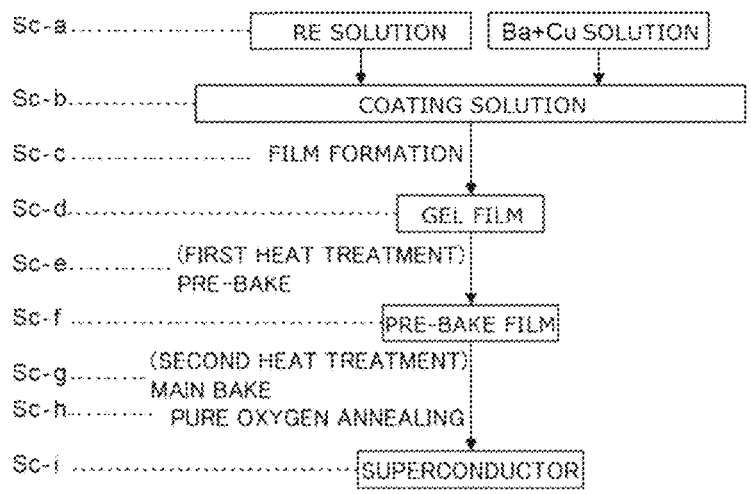

FIG. 3C is a flowchart illustrating a method for manufacturing the superconductor.

A coating solution is obtained based on a RE solution and a "Ba+Cu" solution. A gel film is obtained by coating the coating solution. A first heat treatment (a pre-bake in step Sc-e) and a second heat treatment (a main bake in step Sc-g) are performed. Subsequently, for example, "pure oxygen annealing" (step Sc-h) processing is performed. Thereby, the superconductor is obtained. In the pure oxygen annealing, the concentration of the oxygen included in the atmosphere is, for example, not less than 10% and not more than 100%. In the embodiment, the concentration of oxygen in the pure oxygen atmosphere is, for example, not less than 10% and not more than 100%.

Figure 4:
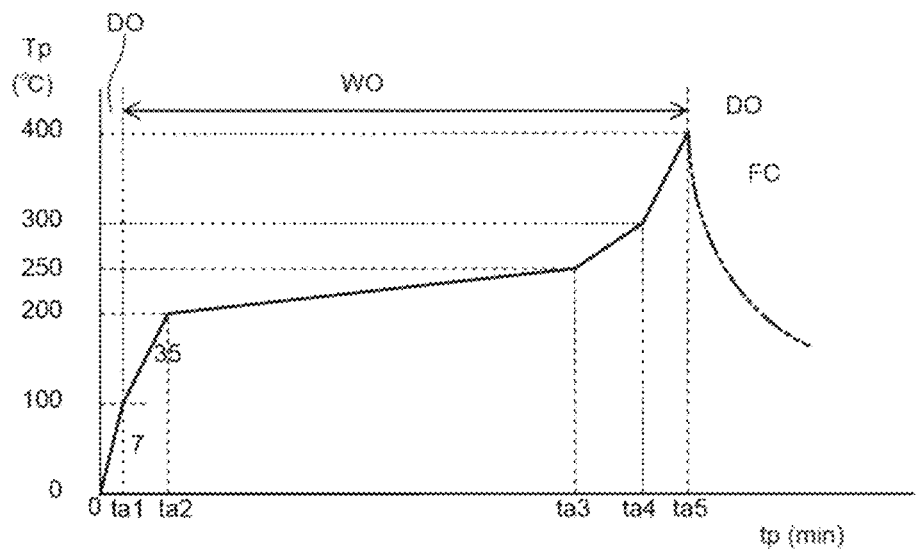
FIG. 4 is a schematic view illustrating the first heat treatment.

FIG. 4 is a schematic view illustrating the first heat treatment.

The horizontal axis of FIG. 4 is a time tp (minutes); and the vertical axis is a temperature Tp (° C.). A temperature increase in a dry oxygen atmosphere DO is performed between time 0 to ta1. A temperature increase in a wet oxygen atmosphere WO is performed between time ta1 to time ta5. At this time, the increase rates of the temperature are mutually-different for the intervals ta1 to ta2, ta2 to ta3, ta3 to ta4, and ta4 to ta5. Time ta1 is, for example, 7 minutes; and time ta1 is, for example, 35 minutes. The lengths of the intervals ta2 to ta3, ta3 to ta4, and ta4 to ta5 may be modified. The temperature corresponding to time ta2 to ta4 is the temperature range where the decomposition reaction occurs. There are many cases where the processing corresponding to this interval is the heat treatment having the longest time among the processing that is performed. The decomposition temperature can be set to be high; and the interval can be set to be short. FIG. 4 is an example of the decomposition heat treatment; and as long as the heat treatment corresponds to the heat treatment illustrated in FIG. 4, these intervals and temperatures may be modified. From time ta5 onward, furnace cooling FC is performed in the dry oxygen atmosphere DO.

Figure 5:
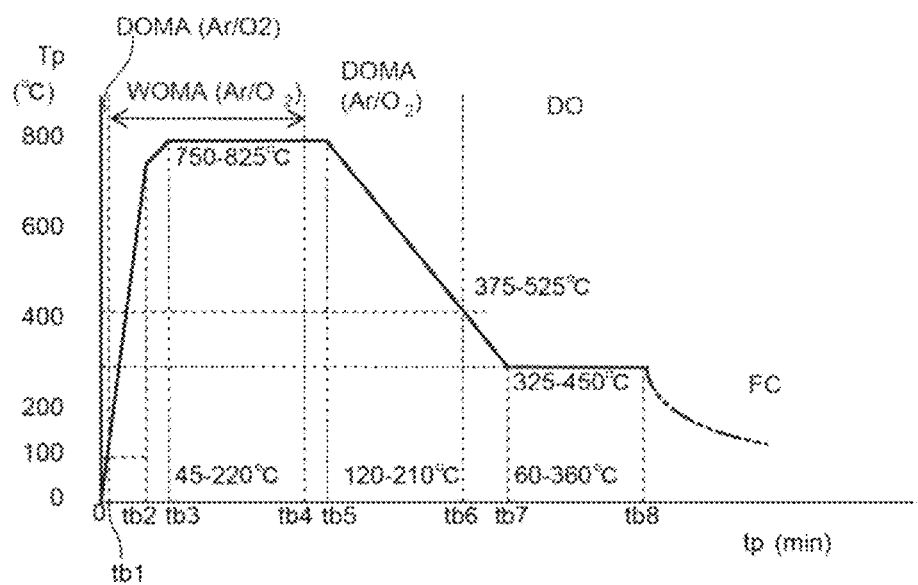
FIG. 5 is a schematic view illustrating the second heat treatment.

FIG. 5 is a schematic view illustrating the second heat treatment.

The horizontal axis of FIG. 5 is the time tp (minutes); and the vertical axis is the temperature Tp (° C.). From time 0 to tb1, a temperature increase is performed in a dry $Ar/O_2$ atmosphere DOMA including Ar and $O_2$. The heat treatment is performed in a wet $Ar/O_2$ atmosphere WOMA from time tb1 to time tb4. A temperature reduction is performed in the dry $Ar/O_2$ atmosphere DOMA from time tb4 to time tb6. From time tb6 onward, the furnace cooling FC is performed in the dry oxygen atmosphere DO.

The experiments will now be described in detail.

(First Experiment)

According to the solution flowchart of FIG. 3A, a coating solution for a YBCO superconductor is synthesized and refined. Namely, powders of hydrates of $Y(OCOCH_3)_3$, $Ba(OCOCH_3)_2$, and $Cu(OCOCH_3)_2$ are dissolved in deionized water as a metallic acetate. At this time, the metal mole ratio Y:Ba:Cu is 1:2:3. Mixing and stirring with a reaction equimolecular amount of $CF_3COOH$ is performed; the obtained mixed solution is placed in an eggplant-shaped flask; reacting and refining in a depressurized rotary evaporator are performed for 12 hours; and a semi-transparent blue substance 1MAi (first experiment, Material A with impurity) is obtained. Water and acetic acid which are reaction by-products of the solution synthesis are included in the semi-transparent blue substance 1MAi at about 7 wt %.

Methanol (step Cs-f of FIG. 3A) that corresponds to a weight of about 100 times the obtained semi-transparent blue substance 1MAi is added to the semi-transparent blue substance 1MAi; and the substance 1MAi is dissolved completely. A semi-transparent blue substance 1MA is obtained by placing the solution in the rotary evaporator and again performing the reacting and the refining in the depressurized rotary evaporator for 12 hours. The semi-transparent blue substance 1MA is dissolved in methanol (step Cs-j of FIG. 3A). 1.50 mol/l by metal ion basis of a coating solution 1Cs—Y (first experiment, Coating Solution for Y-based superconductor) was obtained by diluting using a volumetric flask.

Separately from the description recited above, a half solution that includes Ba and Cu is synthesized and refined using the same method. Namely, powders of hydrates of $Ba(OCOCH_3)_2$ and $Cu(OCOCH_3)_2$ are dissolved in deionlzed water. At this time, the metal mole ratio Ba:Cu is 2:3. Mixing and stirring with a reaction equimolecular amount of $CF_3COOH$ is performed; the obtained mixed solution is placed in an eggplant-shaped flask; reacting and refining are performed in a depressurised rotary evaporator for 12 hours; and a semi-transparent blue substance 1MBi is obtained. Water and acetic acid which are reaction by-products of the solution synthesis are included in the semi-transparent blue substance 1MBi at about 7 wt %.

Methanol (step Cs-f of FIG. 3A) that corresponds to a weight of about 100 times the obtained semi-transparent blue substance 1MBi is added to the semi-transparent blue substance 1MBi; and the substance 1MBi is dissolved completely. A semi-transparent, blue substance 1MB is obtained by placing the solution in the rotary evaporator and again performing the reacting and the refining in the depressurized rotary evaporator for 12 hours. The semi-transparent blue substance 1MB is dissolved in methanol (step Cs-j of FIG. 3A). 1.50 mol/l by metal ion basis of a half coating solution 1hCs—BaCu (first experiment, half coating Solution Ba and Cu) was obtained by diluting using a volumetric flask.

Separately from the two types of substances recited above, a half solution that includes Sm is synthesized and refined. Namely, a powder of a hydrate of $Sm(OCOCH_3)_3$ is dissolved in deionlzed water. Mixing and stirring with a reaction equimolecular amount of $CF_3CF_2COOH$ is performed; the obtained mixed solution is placed in an eggplant-shaped flask; reacting and refining is performed in a depressurized rotary evaporator for 12 hours; and a semi-transparent yellow substance 1MCi is obtained.

Methanol (step Cs-f of FIG. 3A) that corresponds to a weight of about 100 times the obtained semi-transparent yellow substance 1MCi is added to the semi-transparent, yellow substance 1MCi; and the substance 1MCi is dissolved completely. A semi-transparent yellow substance 1MC is obtained by placing the solution in the rotary evaporator and again performing the reacting and the refining in the depressurized rotary evaporator for 12 hours. The semi-transparent yellow substance 1MC is dissolved in methanol (step Cs-j of FIG. 3A). 1.20 mol/l by metal ion basis of a half coating solution 1hCs—Sm1 (first experiment, Half coating Solution Sm step 1) is obtained by diluting using a volumetric flask.

A coating solution 1Cs-Sm was prepared by mixing the half coating solution 1hCs—BaCu and the half coating solution 1hCs—Sm1. The metal mole ratio Sm:Ba:Cu is 1:2:3. The concentration of all of the metal ions (the concentration of Sm+Ba+Cu) of the obtained coating solution is 1.33 mol/l.

The solution that is obtained by mixing the coating solutions 1Cs—Y and 1Cs—Sm is 1Cs—YSm. The solution has a metal mole ratio Y:Sm of 95:5.

Film formation of a superconductor on a $LaAlO_3$ monocrystalline substrate was performed using the coating solution 1Cs—Sm. The film formation was performed using spin coating with a maximum rotation speed of 4000 rpm; a pre-bake was performed in a pure oxygen atmosphere at 400° C. or less using the profile shown in FIG. 4; a main bake was performed in 20 ppm of oxygen-mixed argon gas at 800° C. using the profile shown in FIG. 5; annealing was performed in pure oxygen at 375° C. or less; and a sample 1FS—Sm (first experiment, Film of Superconductor, SmBCO) which is a superconducting film was obtained.

Separately, film formation of a superconductor on a $LaAlO_3$ monocrystalline substrate was performed using the coating solution 1Cs—YSm. Film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 1FS—YSm (first experiment, Film of Superconductor, YBCO+SmBCO) which is a superconducting film was obtained.

Figure 6A:
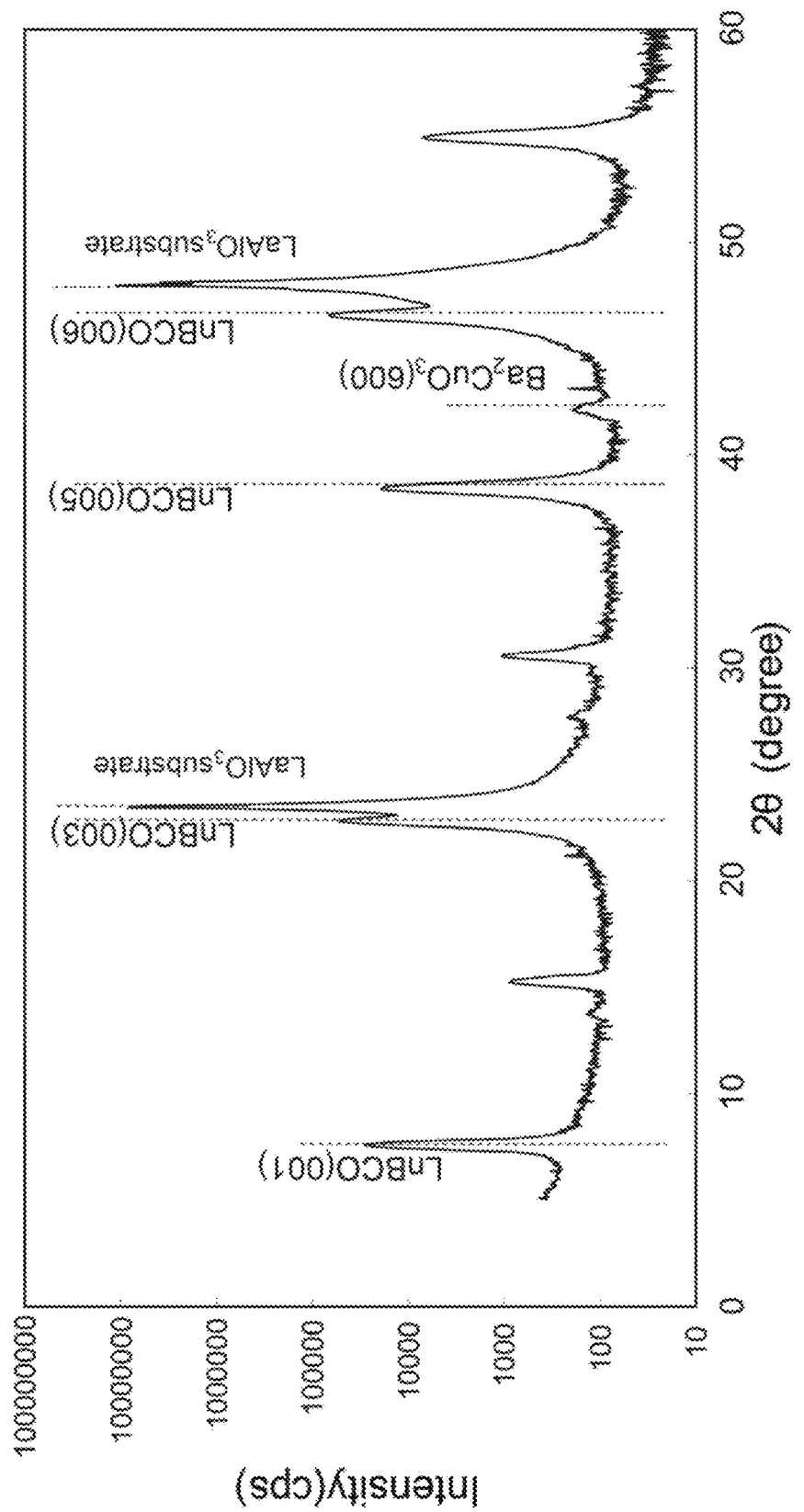
FIG. 6A and FIG. 6B are charts showing evaluation results of the samples.
Figure 6B:
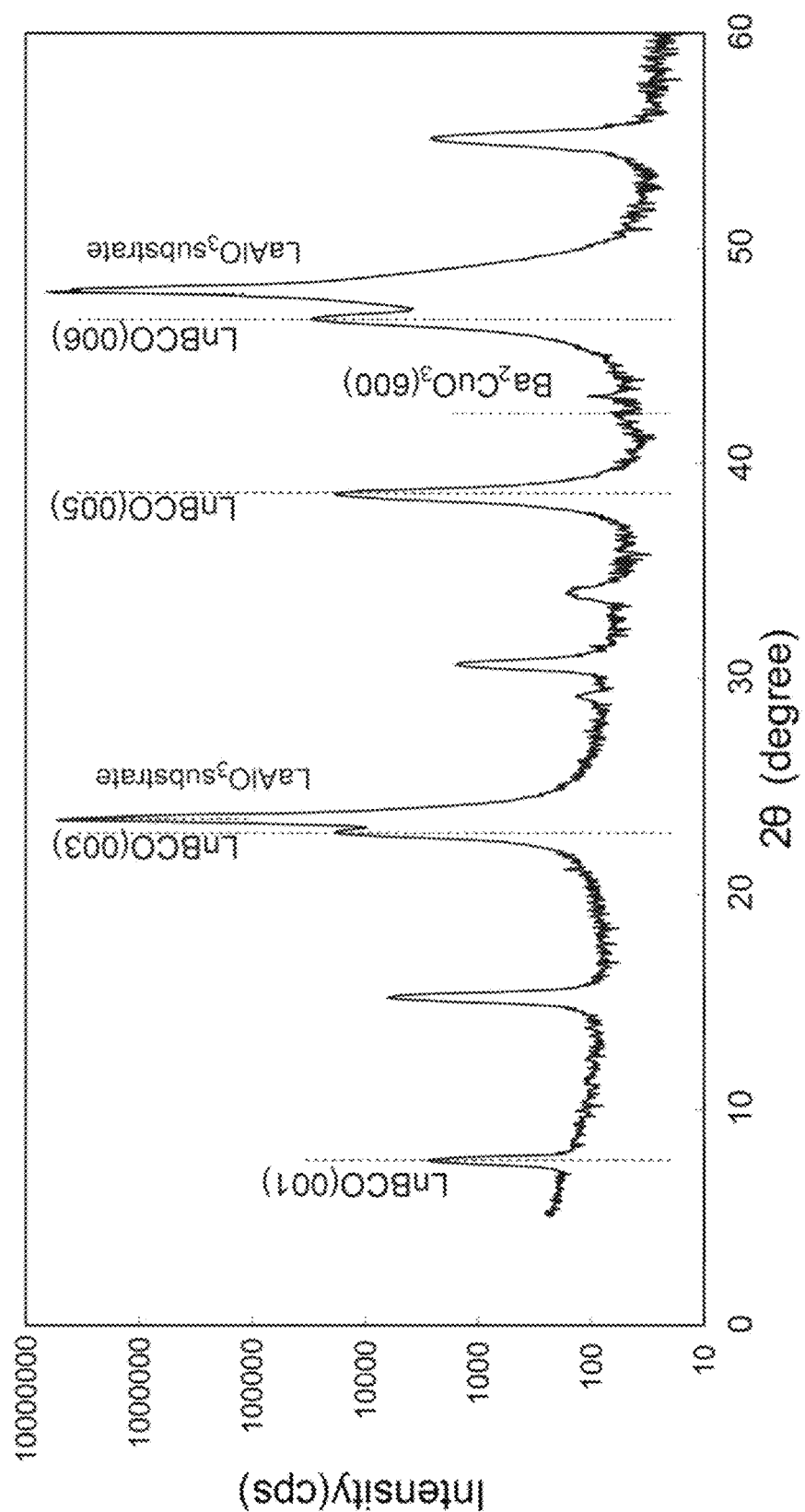

FIG. 6A and FIG. 6B are charts showing evaluation results of the samples.

These figures illustrate XRD measurement results. These results are based on a 2θ/ω method. The horizontal axes of these figures are the angle 2θ. The vertical axes are the detected peak intensity. FIG. 6A corresponds to the sample 1FS—YSm. FIG. 6B corresponds to 1FS—Sm. These figures are phase identification graphs of a SmBCO superconductor and a 5% mixed SmBCO+YBCO superconductor using 2θ/ω measurements of XRD measurements.

In FIG. 6B, a characteristic (006) peak (the position where 2θ is 46.53 degrees) is observed for SmBCO. 2θ that corresponds to the (006) peak Is 46.68 degrees for YBCO. Further, in FIG. 6B, a trend in which the characteristic (001), (003), and (006) peaks are strong is observed for SmBCO. The Jc value (the critical current density) of the sample was 5.42 $MA/cm^2$ (77 K and 0 T). It is considered that the thickness of the SmBCO superconducting layer is 113 nm. The thickness is thinner than a standard YBCO film because the solution for the SmBCO could be obtained only as a diluted solution. The viscosity decreases if the solution concentration is low. It is known that the thickness after the film formation decreases exponentially if the viscosity decreases; and the obtained thickness becomes thin.

FIG. 6A shows the XRD measurement results of 1FS—YSm. A trend is shown in which the (003), (005), and (006) peaks which are characteristic of the YBCO film are strong. 2θ at the position of the (006) peak is 46.68 degrees and is the same position as YBCO. Comparing 1FS—YSm and 1FS—Sm, it can be seen that the intensities of the peaks decrease markedly for 1FS—YSm. For a normal YBCO film, the (006) peak intensity at these measurement conditions is about 150000 cps. Accordingly, the (006) peak intensity of the measurement results shown in FIG. 6A is a rather weak peak. The Jc value of the sample was low and was 1.3 $MA/cm^2$ (77 K and 0 T). There are many cases where the Jc value fluctuates greatly for the superconductor obtained from the coating solution in which the YBCO solution and the SmBCO solution are mixed. This experimental result suggests that a cause of a disturbance of the reproducibility is included in the interior of the superconducting layer.

Cross-section transmission electron microscope (TEM) observation was performed to verify the internal structure of the sample 1FS—YSm.

FIG. 7A to FIG. 7H are cross-section TEM images of the sample.

These figures are cross-section TEM images of a "5% mixed SmBCO+YBCO superconducting film."

In these figures, the substrate 10 (the monocrystalline substrate) and the superconducting layer are observed. The superconducting layer includes the c-axis orientation region 20, the a/b-axis orientation region 30, and the non-oriented region 40.

In FIG. 7A, the magnification is 21000 times. The long region in the vertical direction of the figure observed in FIG. 7A corresponds to the a/b-axis orientation region 30 (a/b-axis orientation particles). It can be seen from FIG. 7A as well that a/b-axis orientation particles having a surface area ratio of about 10% can be observed.

Figure 7B:
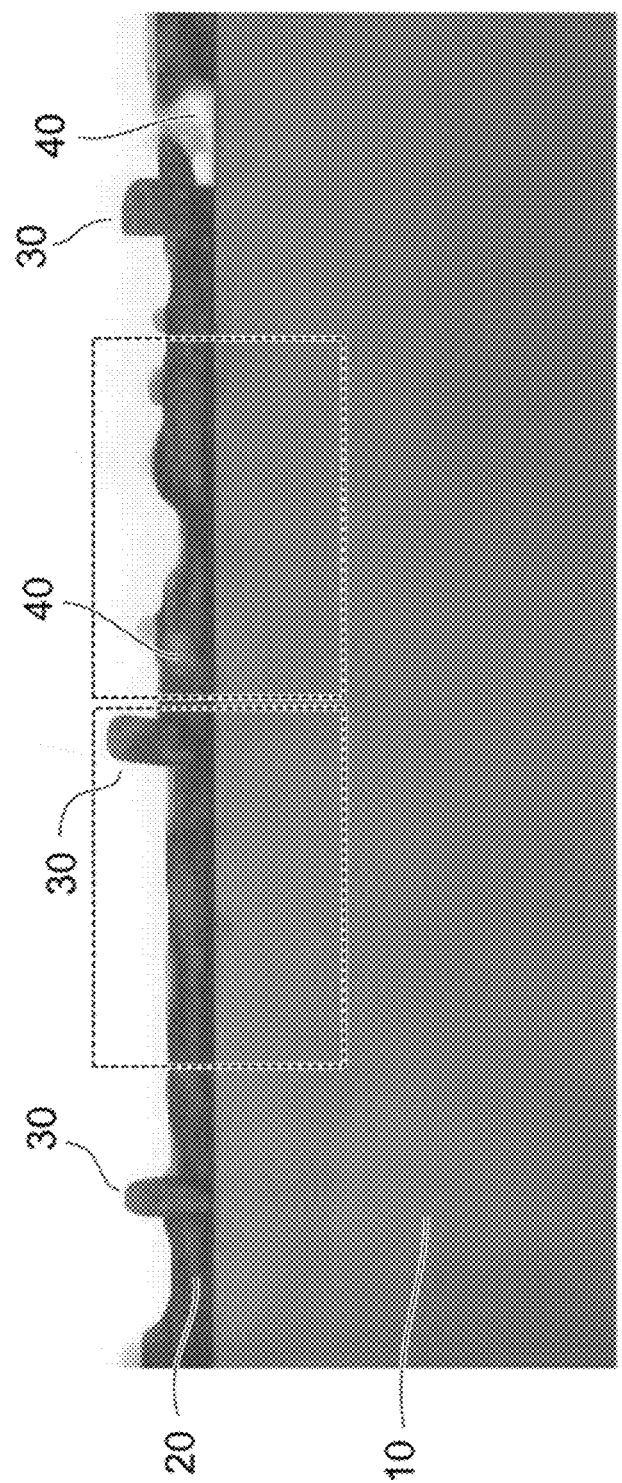
Figure 7C:
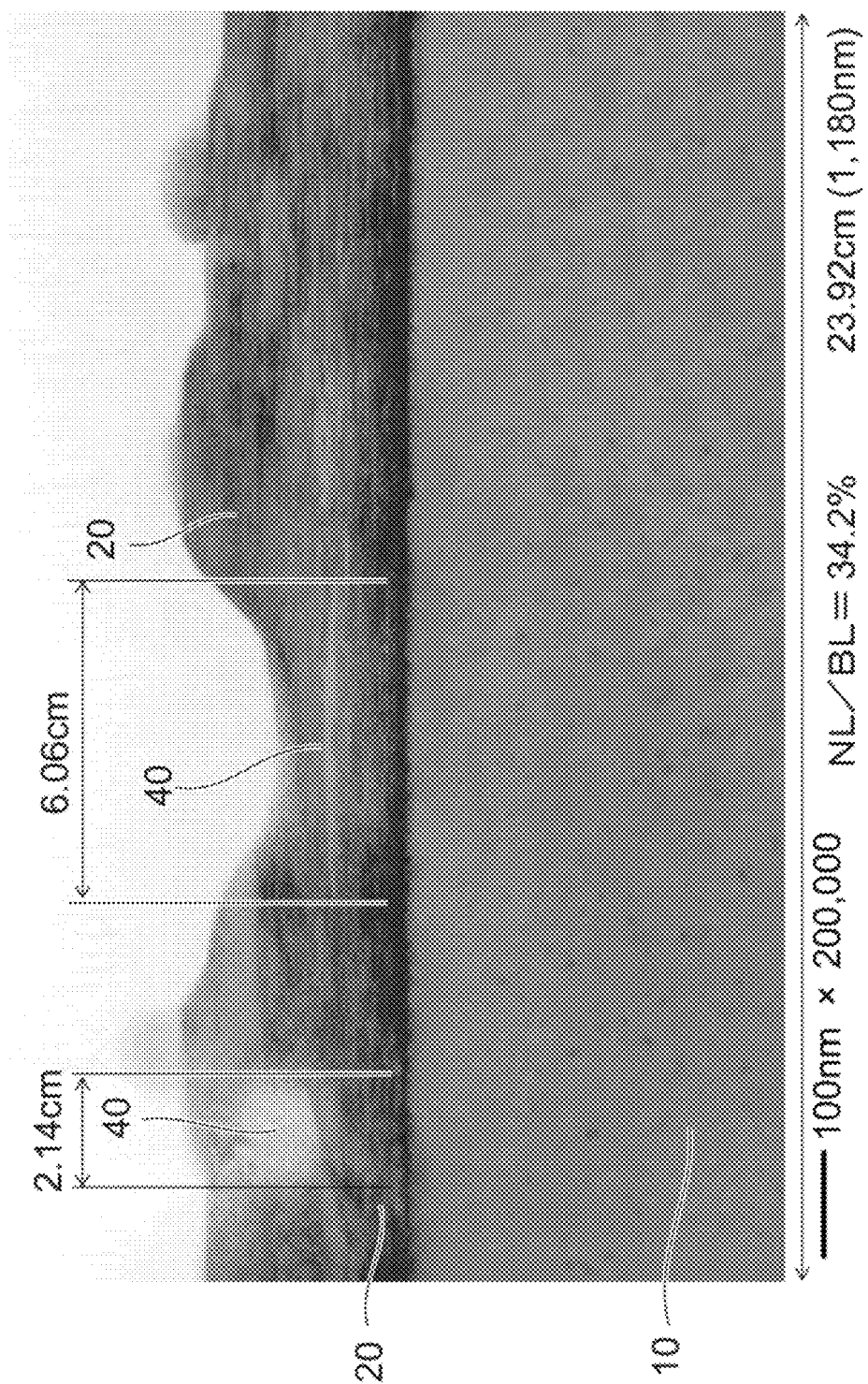
Figure 7D:
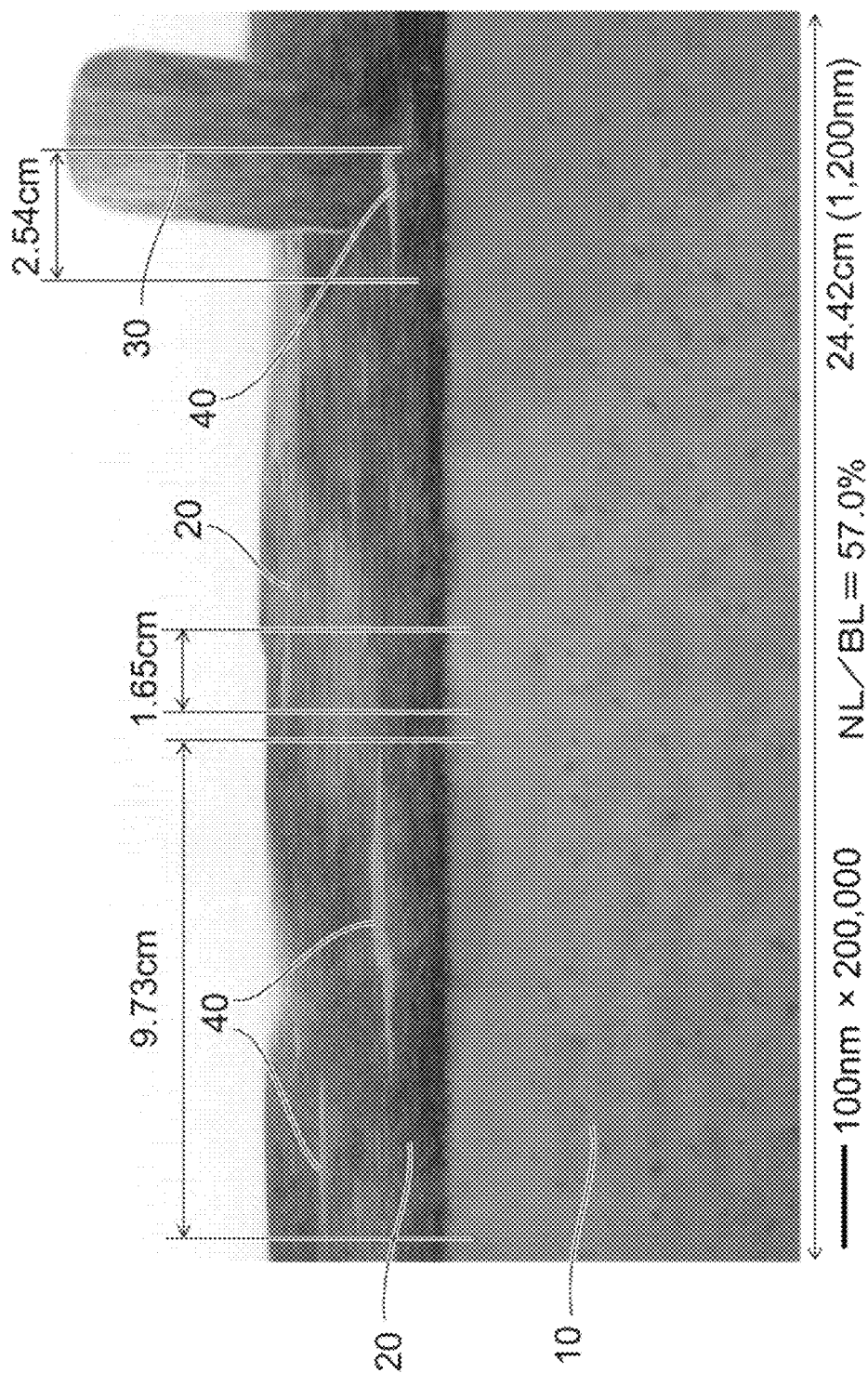

FIG. 7B is an observation image in which FIG. 7A is enlarged to 52000 times. FIG. 7C and FIG. 7D are enlarged views of the broken line portions of FIG. 7B. The magnification in FIG. 7B is 52000 times; and a distinct oriented structure cannot be observed from the observation image. However, a slightly rough oriented structures can be observed in FIG. 7C and FIG. 7D which are observation images of 200000 times.

In FIG. 7C, it was found that the ab-plane that should be parallel to the substrate 10 is in a slightly rough state. Additionally, the non-oriented region 40 that is a cause of characteristic degradation can be observed. The non-oriented region 40 causes film separation from the substrate 10, etc. About how much of the non-oriented region 40 exists is evaluated quantitatively using the length of the non-oriented region 40 projected onto a plane parallel to the monocrystalline substrate. The reason that the evaluation is performed using the projected region is as follows.

The non-oriented region 40 in the superconductor does not directly cause the superconducting characteristics to degrade greatly. This is because the superconducting current can flow and detour around the non-oriented region 40. However, if the c-plane is disturbed by the non-oriented region 40, the disturbance may cause characteristic degradation. The non-oriented region 40 greatly affects physical damage such as cracks, film separation, etc. Thereby, the superconducting characteristics may decrease to zero. Therefore, the length of the projection region has meaning for the evaluation of how much the non-oriented region 40 has enlarged.

Here, one continuous region parallel to the substrate surface of the sample for which the evaluation is performed is used as a reference region. The length in a direction parallel to the substrate surface of the reference region is taken as a reference length BL. The total length of the non-oriented region 40 when the non-oriented region 40 is projected onto the reference region is taken as NL. A non-oriented region ratio Rnb is defined as NL/BL.

The state of the non-oriented region 40 is different by location. In the observation region of the sample, the maximum distance between the multiple non-oriented regions 40 was 0.80 μm. Therefore, it is considered that a stable value of the non-oriented region ratio Rnb is obtained if the length of the reference region (the reference length BL) is set to about 2 μm. Therefore, for this sample, the reference length BL was set to 1 μm, 2 μm, or 4 μm; and the values of the non-oriented region ratio Rnb were verified. The results are summarized in Table 1.

TABLE 1

| BL | Rnb (%) (=NL/BL) | | |
|---|---|---|---|
| | 1.0 (μm) | 2.0 (μm) | 4.0 (μm) |
| Position 1 | 56.8 | 48.9 | 48.1 |
| Position 2 | 48.0 | 46.9 | 48.4 |
| Position 3 | 43.4 | 47.4 | 46.3 |

TABLE 1-continued

| BL | Rnb (%) (=NL/BL) | | |
|---|---|---|---|
| | 1.0 (μm) | 2.0 (μm) | 4.0 (μm) |
| Position 4 | 45.7 | 46.9 | 46.5 |
| Position 5 | 51.3 | 48.2 | 45.4 |
| Position 6 | 48.1 | 45.4 | 44.8 |
| Position 7 | 45.0 | 42.3 | |
| Position 8 | 42.7 | 43.0 | |
| Position 9 | 39.6 | 43.4 | |
| Position 10 | 35.2 | 47.7 | |
| Position 11 | 45.2 | | |
| Position 12 | 55.2 | | |
| Ave | 46.4 | 46.0 | 46.6 |
| σ | 6.1 | 2.3 | 1.5 |

Table 1 is the analysts results of the non-oriented region ratio Rnb (=NL/BL). Table 1 shows the calculation results of the non-oriented projection ratio.

The non-oriented region ratio Rnb (NL/BL) is calculated as follows. The reference region is provided for the cross-section TEM observation. The reference region is a region that is continuous in a direction parallel to the substrate upper surface in a field of view having a magnification of 200000 times. The length along the parallel direction of the reference region is 1 μm, 2 μm, or 4 μm. The non-oriented region 40 is discriminable at the magnification of 200000 times. In the setting of the reference region, the magnification is 200000 times or more and may be 500000 times or less. The reference region has a line configuration extending in a direction parallel to the substrate upper surface. The non-oriented region 40 is projected onto the reference region (the reference line); the total length of the projected portion is taken as NL. Then, the non-oriented region ratio Rnb is obtained from NL/BL.

In the embodiment, the non-oriented region 40 is the region discriminated to be non-oriented. The non-oriented region 40 is a region where the dots showing the atoms cannot be discriminated in TEM electron microscopy of 2100000 times which is a high-resolution observation. For example, the dots that show the atoms are not observed in FIG. 7G (520,000 times) in which a portion of the non-oriented region 40 of FIG. 7D is enlarged. In FIG. 7H (2100000 times) as well, the dots that show the atoms cannot be confirmed. In the TEM observation, the observation is performed using the average of a region of about 50 nm in the thickness direction. Therefore, there is a possibility that a region where the atoms are ordered exists locally. However, in the case where the proportion of the region where the atoms are ordered to the entire region is extremely low, the dots of the atoms cannot be discriminated by the TEM observation of 2100000 times. The non-oriented region 40 is a region that can be treated as substantially non-oriented. In this specification, the region of the TEM observation where the atomic image (the dots) cannot be observed is taken as the non-oriented region 40. The region of the TEM observation where the atomic image (the dots) can be observed is taken to be an oriented region.

From Table 1, when the reference length BL is 1 μm, the non-oriented region ratio Rnb is 35.2% to 56.8%; and the distribution of the non-oriented region ratio Rnb is relatively large. When the reference length BL is 2 μm, the non-oriented region ratio Rnb is 42.3% to 48.9%; and the distribution of the non-oriented region ratio Rnb is small. When the reference length BL was 4 μm, the non-oriented region ratio Rnb became 44.8% to 48.4%. The average value Ave and the standard deviation σ of the samples are as recited in Table 1.

From the results of Table 1, it is considered that the state of the non-oriented region 40 can be evaluated appropriately if the evaluation of the non-oriented region 40 is performed by setting the reference length BL to 2 µm. When the reference length BL is set to 2 µm, the average value Ave of the non-oriented region ratio Rnb is 46.0% for 1FS—YSm made by the method of the first experiment. The standard deviation σ is 2.3. 6σ is 32.2%.

On the other hand, there is the following first reference example. In the first reference example, the replacement is performed by directly adding trifluoroacetic acid after preparing samarium pentafluoropropionic acid. The experiment of the first reference example is performed from the analogy that replacement with pentafluoropropionic acid occurs easily for trifluoroacetic acid which has a strong hydrophilic property.

In the first reference example, a large amount of the solvent (methanol) is necessary to perform the replacement for changing the PFP salt to the TFA salt. It is described in a second experiment described below that the replacement does not proceed sufficiently in the first reference example, even in the case where a large amount of solvent is used. In the method of the first reference example, it is difficult to dissolve into the large amount of methanol and to efficiently replace the PFP with TFA.

Table 2 shows the non-oriented region ratio Rnb for first to third reference samples Rsp-1 to 3 made by the method according to the first reference example. "1FS—YSm" in Table 2 is the sample according to the first experiment shown in Table 1.

TABLE 2

|  | Rnb (%) (=NL/BL) (BL = 2 µm) |
| --- | --- |
| 1FS-YSm | 46.0 |
| Rsp-1 | 37.8 |
| Rsp-2 | 40.8 |
| Rsp-3 | 47.8 |
| Ave | 43.1 |
| σ | 4.6 |
| Ave-6σ | 15.4 |

As shown in Table 2, in the reference sample according to the method of the first reference example, the non-oriented region ratio Rnb is 37.8% to 47.8%. In the sample including the non-oriented region 40, the multiple non-oriented regions 40 exist dispersed in the sample. In such a case, there are many cases where the non-oriented region ratio Rnb has a proportion of about 30%. In the technology of the first reference example, etc., it is difficult to set the non-oriented region ratio Rnb to 15% or less.

Figure 7E:
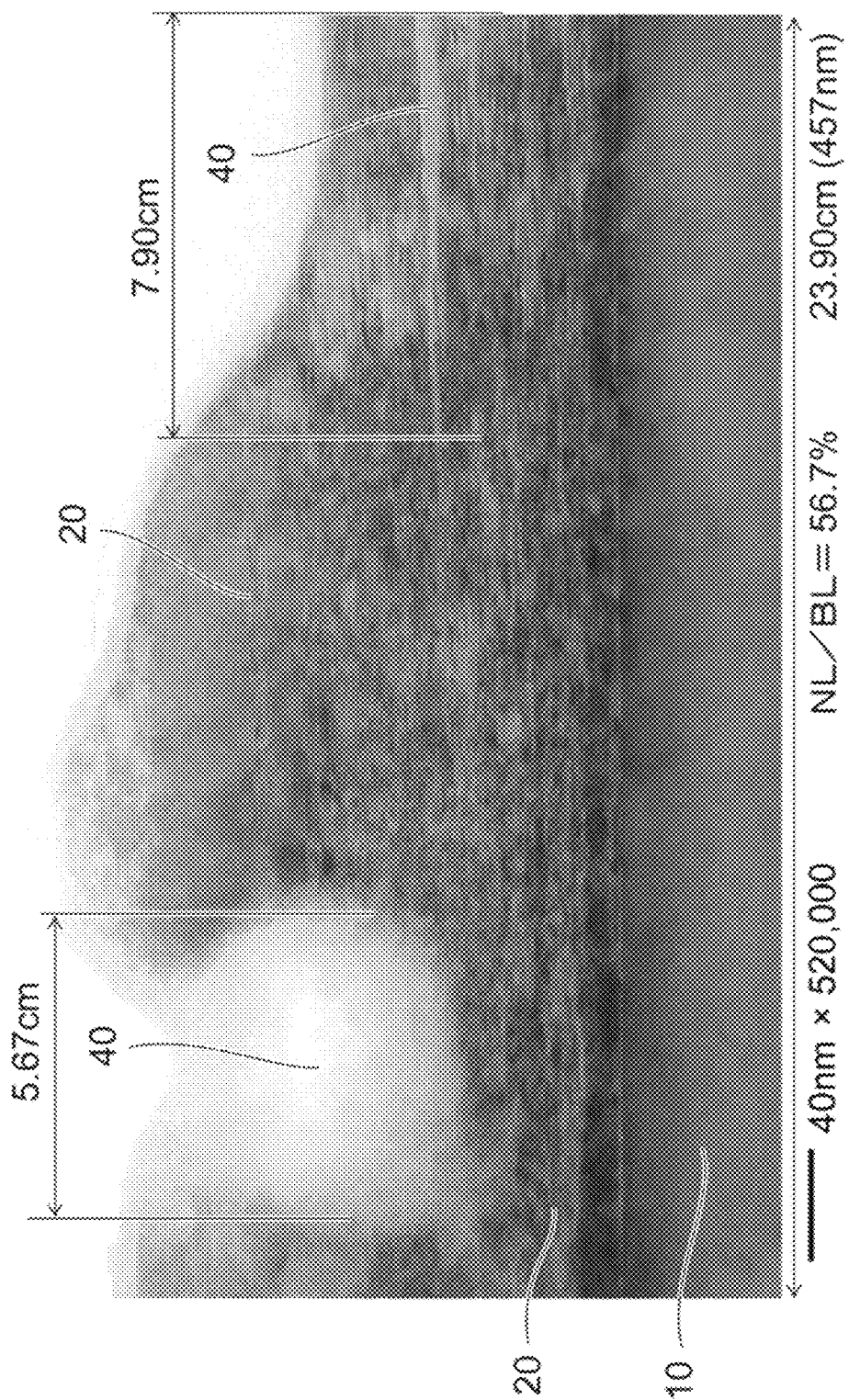
Figure 7F:
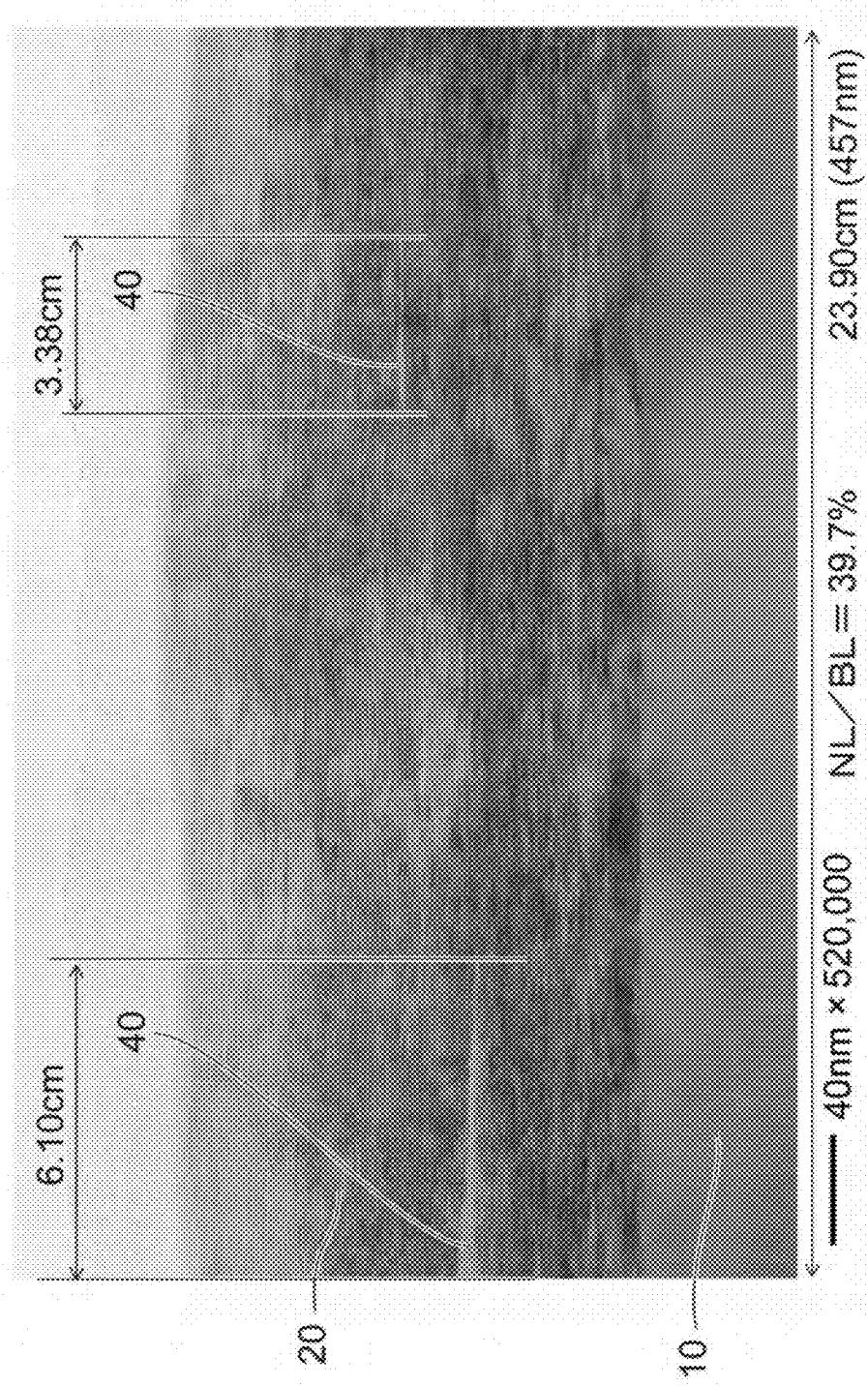
Figure 7G:
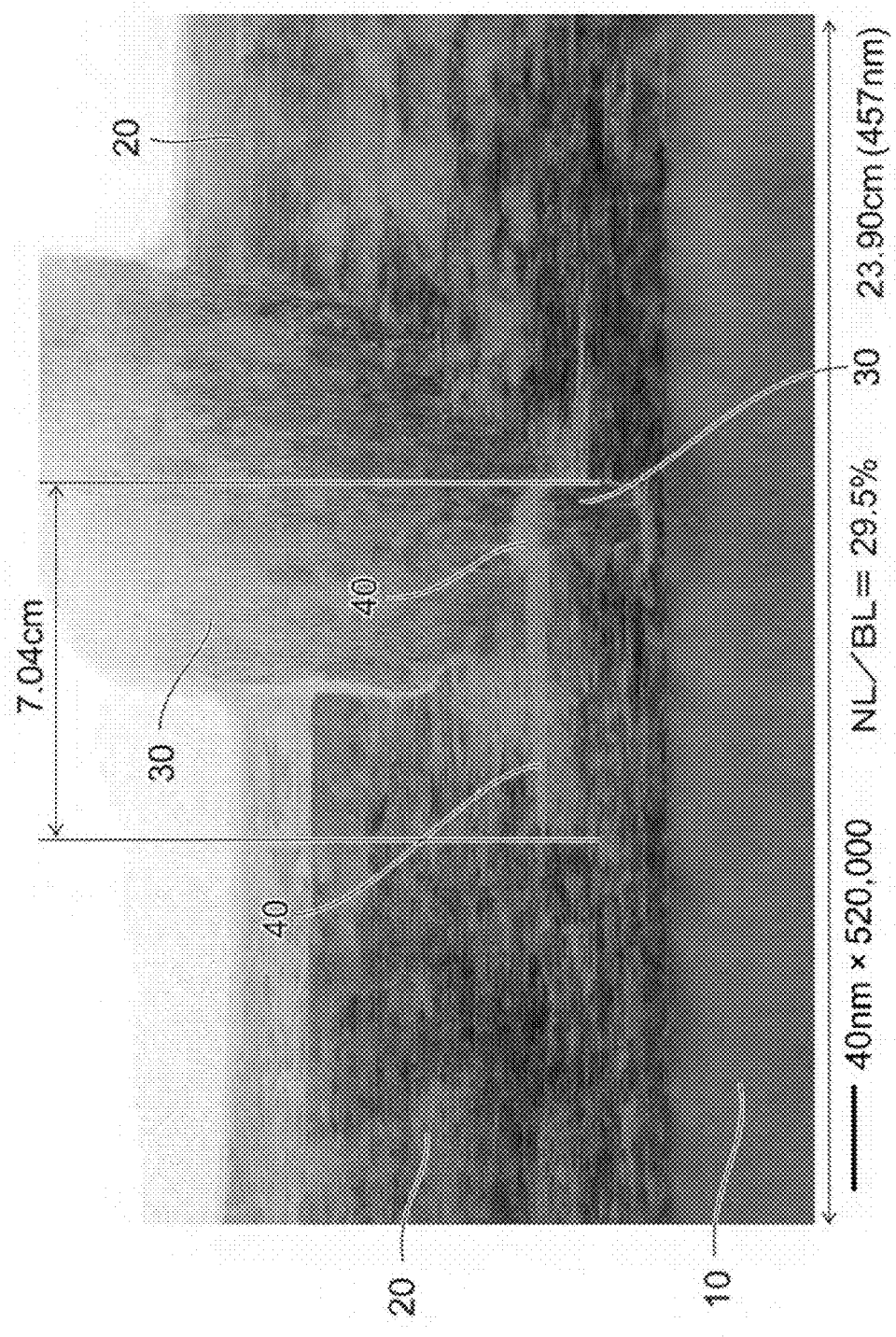
Figure 7H:
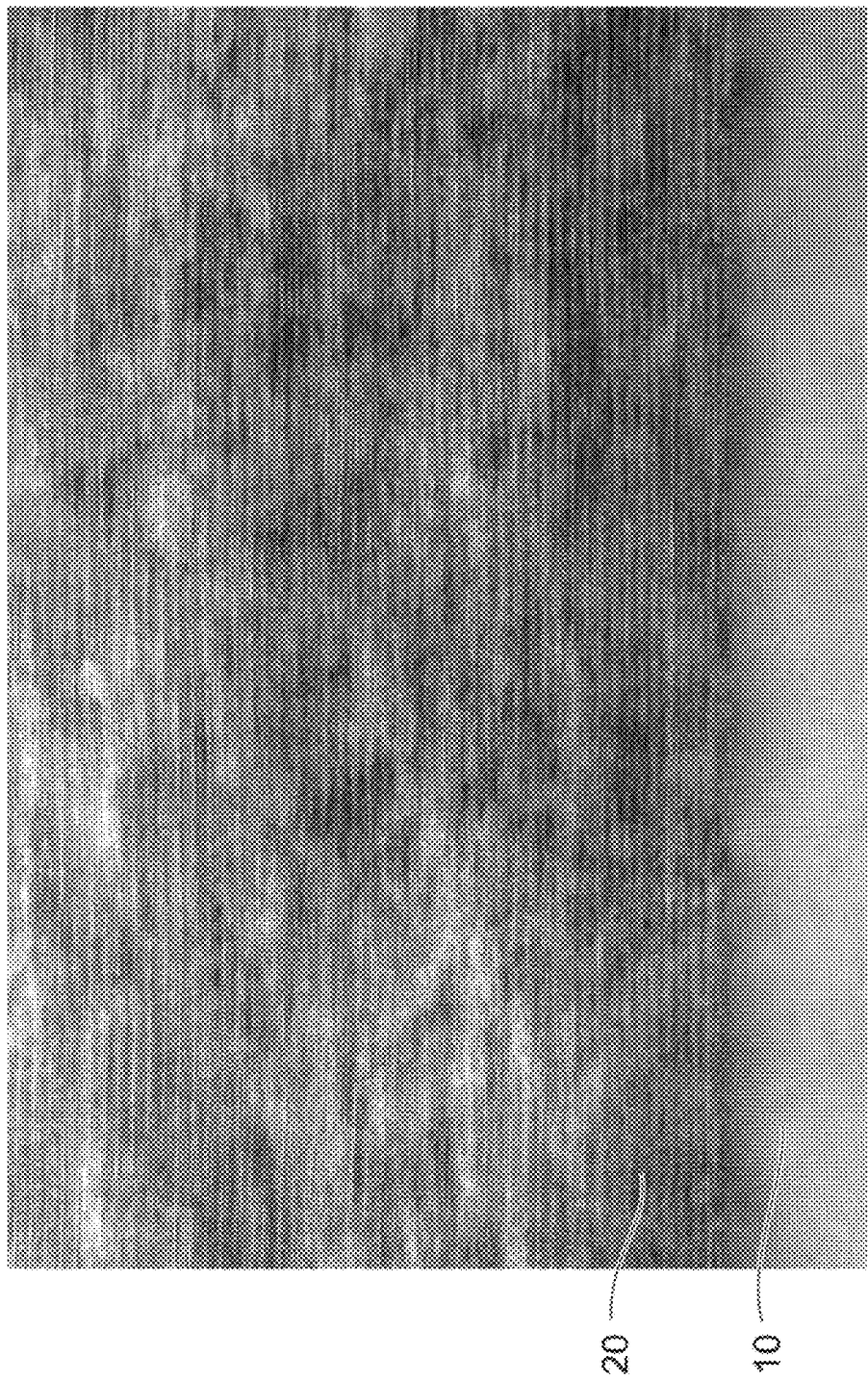

FIG. 7E, FIG. 7F, and FIG. 7G show the results of 1FS—YSm obtained in the first experiment and observed at 520000 times.

In FIG. 7E, the non-oriented region 40 that has the thin layer configuration on the right of the figure exists; the non-oriented region 40 that has the clump configuration on the left exists; and the non-oriented region ratio Rnb is calculated to be 56.7%.

In FIG. 7F, the non-oriented region 40 that has a thin layer configuration exists; and the non-oriented region ratio Rnb is calculated to be 39.7%.

In FIG. 7G, the non-oriented region 40 that extends in the vertical direction in the figure exists. The non-oriented region ratio Rnb is calculated to be 29.5%. It is considered that these non-oriented regions 40 have a negative effect over a long period of time.

The calculation of the non-oriented region ratio Rnb is performed based on the region where the interface between the substrate of the superconducting layer to the upper portion of the layer are observable. TFA-MOD is grown from a pseudo-liquid phase; and an unevenness of ±70 nm from the average thickness occurs. In the upper portion of the layer where the amount of the liquid is low, the composition shifts easily even in normal growth. Therefore, practically, the evaluation is performed based on the region where the average thickness is 70% or less.

FIG. 7H is an observation image of 1FS—YSm at 2100000 times. FIG. 7H is a high-magnification observation result. In FIG. 7H, a structure can be observed in which the ab-plane fluctuates extremely. From the observation image, the non-oriented region 40 cannot be observed. This is because the observation is an enlargement of only the substrate vicinity. As the definition of the non-oriented region 40, the observation is performed in a field of view that, can be observed from the interface between the substrate of the superconducting layer to the upper portion of the layer; the standard observation magnification is set to 200000 times; and a continuous reference region (projection evaluation) of 2 µm is used. Then, the evaluation is possible by observing at about such a magnification. Thereby, the quantitative evaluation of the non-oriented region 40 is possible.

From the results of the first experiment, it can be seen that a markedly disadvantageous condition as the superconductor is made when the SmBCO coating solution and the YBCO coating solution are mixed. The SmBCO coating solution includes a methanol solution of Sm-PFP, Ba-TFA, and Cu-TFA. It is known that the gel film that is obtained by the film formation includes a solute, and methanol molecules interposed between the solute. The volume ratio of the methanol molecules in the gel film is about 30 vol %. The majority of the methanol evaporates in the pre-bake. At this time, the methanol and the TFA group are attracted strongly by hydrogen bonding. On the other hand, the degree that the methanol and the PFP group are attracted to each other is low compared to that between the methanol and the TFA group. Therefore, in the case where a small amount of a PFP salt is mixed, the metal species to which the PFP bonds greatly segregates.

If the proportion of the SmBCO and the YBCO is set to 5:95, the Sm-PFP becomes a small amount. The concentration of the metal ions is about 0.83%. Under these conditions, the Sm-PFP segregates particularly easily on the substrate 10.

On the other hand, in the case where a large amount of the PFP salt is included, there is a possibility that the segregation becomes small because many molecules exist to which the force from the methanol is not applied. In the case where Sm-PFP, Ba-TFA, and Cu-TFA are used, the PFP ratio in which the concentration of the PFP is about 16.7% is extremely high compared to the experiments described below. The PFP is not subjected to the Coulomb force easily when the methanol evaporates in the pre-bake. Therefore, in the case where a small amount of PFP exists in a large amount of TFA, the PFP moves relatively in a direction toward the substrate. On the other hand, in the case where a large amount of the PFP exists, because a large amount of substances try to move in a direction toward the substrate, the movement does not occur easily; and the segregation is relaxed. In such a case, the PFP that could not move causes residual carbon because the molecular weight is larger than that of TFA. Due to the residual carbon, the tendency of the characteristics to degrade becomes strong. The tendency was pronounced in the case where the film thickness exceeded 150 nm. The trend of the increase of the residual carbon increased when the thickness increased.

PFP decomposes at a temperature higher than TFA. Therefore, in the case where the superconducting layer is thick, the likelihood of the PFP becoming an easily-evaporating component and scattering decreases compared to the TPA. If the residual carbon increases, the proportion of the non-oriented region 40 increases. Therefore, in the method of the first reference example, more of the non-oriented regions 40 are formed. This tendency becomes pronounced when the thickness of the superconducting layer is thick. It is considered that many non-oriented regions 40 are formed particularly where the thickness is 150 nm or more.

In a system including a large amount of PFP, when a large amount of the carbon residue exists at the substrate interface, etc., a randomly-oriented layer forms using the position of the carbon residue as a starting point. It is considered that it is difficult for a perovskite structure to be formed epitaxially on the randomly-oriented layer; and the characteristics degrade. It is considered that the characteristics of the SmBCO in particular degrade in the case where the superconducting layer is thick because of such a reason. The analysis results also match this model. The relatively high characteristics that were obtained in the case where the superconducting layer was thin also can be described similarly.

Only a small amount of Sm-PFP is included in 1FS—YSm. Because 5% of the SmBCO coating solution and 95% of the YBCO coating solution are mixed, the concentration of the Sm-PFP is 0.83%. In other words, the concentration of the Sm-PFP decreases. From this condition, only the Sm-PFP is not acted upon by the Coulomb force due to the hydrogen bonding when the methanol molecules evaporate and move upward. In such a case, because the amount of the Sm-PFP is a small amount, pronounced segregation occurs at the substrate interface. In the superconductor, Sm is an atom that enters the Y sites. Therefore, the stoichiometry undesirably shifts when the atoms exist concentratively at the substrate interface. The stoichiometry shift causes the formation of the non-oriented region 40. When the Sm concentrates at the substrate interface, a layer that does not have a perovskite structure is formed easily at the substrate interface. Therefore, the characteristics degrade easily because a structure is formed in which the structure fluctuation is large. As a result, the characteristics degrade markedly in the case where a small amount of the SmBCO coating solution is mixed. It is considered that a large amount of the non-oriented region 40 is thereby observed in the cross section observation image.

(Second Experiment)

It is considered that the negative effect observed in the first experiment would be improved if the PFP group bonded to the Sm were replaced with a TFA group. However, the replacement is not easy. To begin with, esterification occurs easily in Sm-TFA. The method of the first reference example recited above suppresses the esterification. According to the first reference example, a substance that does not include hydrogen is made if the PFP group and the TFA group make salts by bonding with a metal. A SmBCO superconductor in which an impurity (a by-product such as acetic acid, etc.) containing hydrogen is removed by solution refining is made by TFA-MOD. However, it is uncertain whether or not the replacement of the PFP with TFA will proceed. The following second experiment was performed as an associated experiment.

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. At this time, the metal mole ratio is 2:3. Mixing and stirring with a reaction equimolecular amount of $CF_3COOH$ is performed; the obtained mixed solution is placed in an eggplant-shaped flask (an egg-plant shaped flask); reacting and refining in a depressurized rotary evaporator are performed for 12 hours; and a semi-transparent blue substance 2MAi (second experiment, Material A with impurity) is obtained. Water and acetic acid which are reaction by-products of the solution synthesis are included in the semi-transparent blue substance 2MAi at about 7 wt %.

Methanol (step Cs-f of FIG. 3A) that corresponds to a weight of about 100 times the obtained semi-transparent blue substance 2MAi is added to the semi-transparent blue substance 2MAi; and the substance 2MAi is dissolved completely. A semi-transparent blue substance 2MA is obtained by placing the solution in the rotary evaporator and again performing the reacting and the refining in the depressurized rotary evaporator for 12 hours. The semi-transparent; blue substance 2MA is dissolved in methanol (step Cs-j of FIG. 3A). 1.50 mol/l by metal ion basis of a half coating solution 2hCs—BaCu (second experiment, half coating Solution Ba and Cu) was obtained by diluting using a volumetric flask.

Separately from the description recited above, a half solution that includes Sm is synthesized and refined. Namely, a powder of a hydrate of $Sm(OCOCH_3)_3$ is dissolved in deionlzed water. Mixing and stirring with a reaction equimolecular amount of $CF_3CF_2COOH$ is performed; the obtained mixed solution is placed in an eggplant-shaped flask; reacting and refining are performed in a depressurized rotary evaporator for 12 hours; and a semi-transparent yellow substance 2MBi is obtained.

Methanol (step Cs-f of FIG. 3A) that corresponds to a weight of about 100 times the obtained semi-transparent yellow substance 2MBi is added to the semi-transparent yellow substance 2MBi; and the substance 2MBi is dissolved completely. A semi-transparent yellow substance 2MB is obtained by placing the solution in the rotary evaporator and again performing the reacting and the refining in the depressurized rotary evaporator for 12 hours. The semi-transparent yellow substance 2MB is dissolved in methanol (step Cs-j of FIG. 3A). 1.20 mol/l by metal ion basis of a half coating solution 2hCs—Sm1 (second experiment, half coating Solution for SmBCO step 1) was obtained by diluting using a volumetric flask. After mixing methanol corresponding to 100 times 2hCs—Sm1 by volume into 2hCs—Sm1, a reaction equimolecular amount of TFA was mixed; low-pressure refining was performed at 100 hPa without heating; and a half coating solution 2hCs—Sm2 (same as above, step 2) was obtained. This operation was further repeated two times; and 2hCs—Sm3 and 2hCs—Sm4 were obtained.

Quantitative analysis of the PFP and the TFA was performed using high performance liquid chromatography.

Table 3 is analysis results of the high performance liquid chromatography relating to the residual PFP. A number of replacements N_rep (replaced), a PFP ratio A_PFP, and a TFA ratio A_TFA are shown in Table 3. The PFP ratio A_PFP is the ratio of the amount of PFP to the total of the amount of PFP and the amount of TFA per unit volume. The TFA ratio A_TFA is the ratio of the amount of TFA to the total of the amount of PFP and the amount of TFA per unit volume. Table 3 shows the amount of PFP replaced with TFA.

TABLE 3

|  | 1Cs-Sm1 | 1Cs-Sm2 | 1Cs-Sm3 | 1Cs-Sm4 |
|---|---|---|---|---|
| N_rep | 0 | 1 | 2 | 3 |
| A_PFP | 100 | 56 | 47 | 40 |
| A_TFA | 0 | 44 | 53 | 60 |

In Table 3, the number of replacements N_rep is 0 for a sample 1Cs—Sm1. The number of replacements N_rep is 1 for a sample 1Cs—Sm2. The number of replacements N_rep is 2 for a sample 1Cs—Sm3. The number of replacements N_rep is 3 for a sample 1Cs—Sm4.

Only PFP was detected from the half coating solution 2hCs—Sm1 which is before the replacement operation. In other words, in the PFP, the TFA ratio which may be included as an impurity is exceedingly low. For the half coating solution 2hCs—Sm2 for which one replacement is performed, 56% of the PFP remained under these conditions. In other words, only 44% of the TFA was replaced. It is considered that the estimated pH of TFA is −0.6; and the estimated pH of PFP is −1.0. The hydrophilic property of PFP is lower than the hydrophilic property of TFA; and the strong acidity of PFP is stronger than the strong acidity of TFA. It is difficult to replace the PFP with TFA.

Because PFP has strong acidity, the replacement of the PFP with TFA does not proceed easily. Because the degree of the dissociation of the PFP is higher than the degree of the dissociation of the TFA, if the TFA and the PFP are caused to coexist in the solution state, the TFA is easier to expel from the solution than the PFP. It is considered that the TFA ratio A_TFA of the HPLC thereby became 44%. In the embodiment, the PFP salt is dissolved in a large amount of solvent. Thereby, when mixed with the TFA, the esterification is suppressed. In the embodiment, the large amount of the PFP can be replaced by using relatively relaxed conditions.

There is a second reference example in which the replacement is performed by directly mixing the TFA salt into the PFP salt. In the second reference example, the movement of the PFP group and the TFA group is insufficient in the replacement in which the TFA is directly sprinkled into the PFP salt. The second experiment performed herein corresponds to the case where sufficient solvent is used in the second reference example. It is considered that the replacement amount of the second reference example accordingly is far less than the 44% obtained in the second experiment. It is estimated that the TFA ratio A_TFA is 10% to 15% in the second reference example. It is considered that the Sm-PFP cannot dissociate sufficiently because the solution is sprinkled as-is in the second reference example.

In the replacement of the PFP with TFA, the amount that realizes effects is estimable from the model. The Sm-PFP separates when the solvent (methanol) evaporates in the pre-bake because the PFP group for which hydrogen bonding does not occur easily bonds to all of the ligands. In the case where three PFP groups are bonded to the Sm, the effect of being pulled toward the upper portion occurs when the methanol evaporates if even one of the three PFP groups is replaced with TFA.

It will now be considered how the replacement proceeds in the replacement with TFA. The dissociation constant of PFP is larger than the dissociation constant of TFA. PFP bonds easily compared to TFA. Accordingly, even if the replacement amount with TFA increases, it is considered unlikely that Sm-TFAs would be formed for designated Sm-PFP by all of the PFP being replaced, with TFA and that Sm-TFA$_3$ would exist between Sm-PFP$_3$ and Sm-PFP$_3$ that are not replaced. Accordingly, it is natural to consider that the TFA ratio bonded to the Sm increases uniformly according to the replacement amount. For example, when the TFA ratio is 33%, it is considered that the TFA is bonded to all of the Sm. At this time, a constant effect is produced. When the TFA ratio is 67%, it is considered that, on average, two of the three groups bonded to one Sm are replaced with TFA. When the TFA ratio is 67% or more, it is considered that there are expectations for a particularly large effect. This model was discovered for the first time by the inventor of the application. The embodiment is proposed based on this model and associated experimental evidence.

In the case where the number of replacements is increased, the replacement, amount increases; and the decomposition clue to the esterification also is promoted. Therefore, there is a possibility that it is difficult to drastically increase the number. If is considered that a number of replacements of not more than about 7 times is practical. Even for the one-time replacement of the embodiment in which the replacement proceeds the least, 44% of the PFP is replaced with TFA. In the Sm(PFP)$_3$ in this state, on average, one of the PFP bonded to the Sm is replaced with TFA. Then, it is considered that a Sm salt that is bonded to two TFAs exists. It is considered that the effect of reducing the Sm segregation contributes thereby. Experiments and investigations were performed for such an effect.

(Third Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionlzed water. The metal mole ratio Ba:Cu is 2:3. Mixing and stirring with a reaction equimolecular amount of CF$_3$COOH is performed; the obtained mixed solution is placed in an eggplant-shaped flask; reacting and refining are performed in a depressurized rotary evaporator for 12 hours; and a semi-transparent blue substance 3MAi (third experiment, Material A with impurity) is obtained. Water and acetic acid which are reaction by-products of the solution synthesis are included in the semi-transparent blue substance 3MAi at about 7 wt %.

Methanol (step Cs-f of FIG. 3A) that corresponds to a weight of about 100 times the obtained semi-transparent blue substance 3MAi; is added to the semi-transparent blue substance 3MAi; and the substance 3MAi is dissolved completely. A semi-transparent blue substance 3MA is obtained by placing the solution in the rotary evaporator and again performing the reacting and the refining in the depressurized rotary evaporator for 12 hours. The semi-transparent blue substance 3MA is dissolved in methanol (step Cs-j of FIG. 3A), 1.50 mol/l by metal ton basis of a half coating solution 3hCs—BaCu (third experiment, half coating Solution Ba and Cu) was obtained by diluting using a volumetric flask.

Separately from the description recited above, a half solution that includes Sm is synthesized and refined. Namely, a powder of a hydrate of Sm(OCOCH$_3$)$_3$ is dissolved in deionized water. Mixing and stirring with a reaction equimolecular amount of CF$_3$CF$_2$COOH are performed; the obtained mixed solution is placed in an egg plant-shaped flask; reacting and refining are performed in a depressurized rotary evaporator for 12 hours; and a semi-transparent yellow substance 3MBi is obtained.

Methanol (step Cs-f of FIG. 3A) that corresponds to a weight of about 100 times the obtained semi-transparent yellow substance 3MBi is added to the semi-transparent yellow substance 3MBi; and the substance 3MBi is dissolved completely. A semi-transparent yellow substance 3MB is obtained by placing the solution in the rotary evaporator and again performing the reacting and the refining in the depressurized rotary evaporator for 12 hours. The semi-transparent yellow substance 3MB is dissolved in methanol (step Cs-j of FIG. 3A), 1.20 mol/l by metal ion basis of a half coating solution 3hCs—Sm1 (third experiment, half coating solution for SmBCO step 1) was obtained by diluting using a volumetric flask. A half coating solution 3hCs—Sm2 (same as above, step 2) was obtained by mixing a reaction equimolecular amount of TFA and performing low-pressure refining at 200 hPa without heating after mixing methanol corresponding to 100 times 3hCs—Sm1 by volume into 3hCs—Sm1.

A coating solution 3Cs—Sm was prepared by mixing the half coating solution 3hCs—BaCu and the half coating solution 3hCs—Sm2. The metal mole ratio Sm:Sa:Cu is 1:2:3. The concentration of all of the metal ions of the coating solution that is obtained is 1.33 mol/l.

A solution 3Cs—YSm is obtained by mixing the coating solution 1Cs—Y that is obtained by the method of the first experiment and a coating solution 3Cs—Sm2 of this preparation. The metal mole ratio Y:Sm is 95:5. The concentration of all of the metal ions of the coating solution is 1.48 mol/l.

Film formation of a superconductor on a $LaAlO_3$ monocrystalline substrate was performed by using the coating solution 3Cs—YSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 3FS—YSm (third experiment, Film of Superconductor, YBCO+SmBCO) which is a superconducting film was obtained.

3FS—YSm was measured using the 2θ/ω method of XRD measurement. The existence of an oriented unusual phase, etc., can be confirmed by the measurement. The film properties of the superconductor can be estimated from the intensity of the peak intensity of the superconductor.

Figure 8:
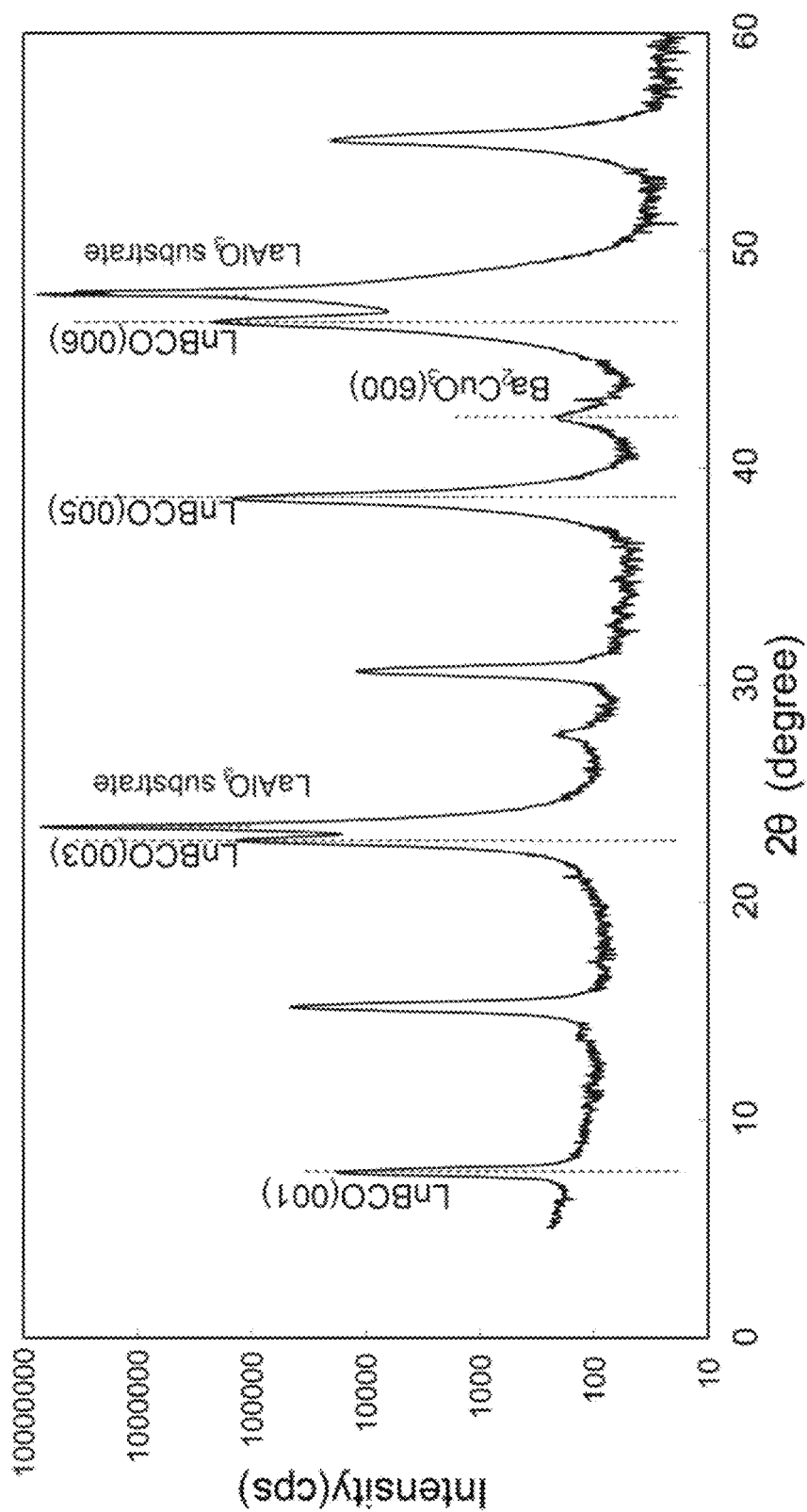
FIG. 8 is a graph showing the experimental results.

FIG. 8 is a graph showing the experimental results.

FIG. 8 is a phase identification graph of a "5% mixed SmBCO+YBCO superconductor" in which TFA replacement of the solution has been performed one time.

It can be seen from FIG. 8 that a trend in which the (003), (005), and (008) peaks which are characteristic of the YBCO film are strong is shown. The 2θ that corresponds to the (006) peak is 46.68 degrees and is substantially the same as the case of YBCO. Also, these peaks each are extremely strong. The Jc value of the sample is 7.1 $MA/cm^2$ (77 K and 0 T); and a good value is shown. A pronounced difference can be recognized between the sample and the first experiment.

Cross-section TEM observation was performed to observe the internal structure of the sample 3FS—YSm.

FIG. 9A to FIG. 9F are cross-section TEM images of the sample.

These figures are cross-section TEM images of the "SmBCO+YBCO superconductor" using a solution obtained by mixing the SmBCO solution having undergone one-time TFA replacement into the YBCO solution at a concentration of 5%.

Figure 9A:
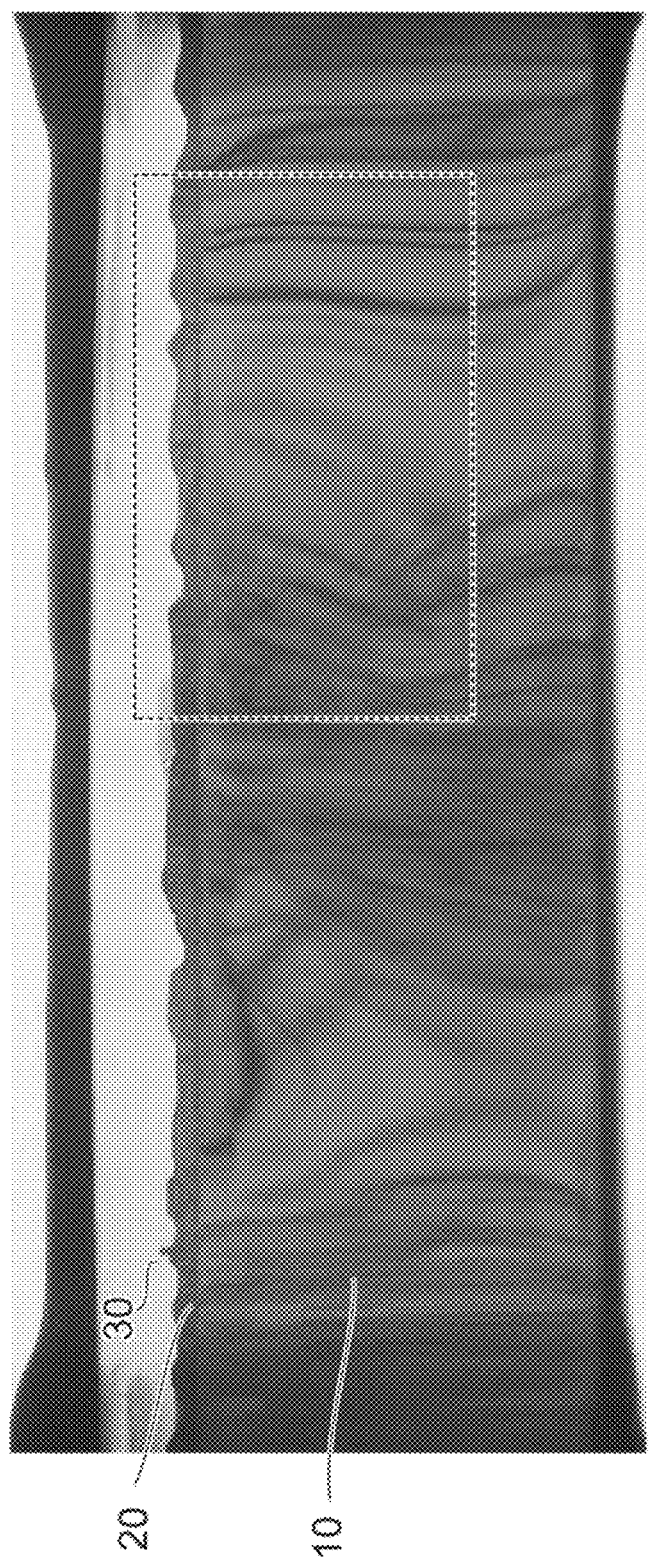

FIG. 9A is an observation image of 21000 times. In FIG. 9A, the substrate 10 (the $LaAlO_3$ substrate), the c-axis orientation region 20 (the c-axis oriented YBCO layer), and the a/b-axis orientation region 30 are observed. The a/b-axis orientation region 30 is an a/b-axis oriented YBCO layer. From FIG. 9A, it can be seen that the a/b-axis orientation particles are extremely few; and the non-oriented region 40 having a clump configuration cannot be seen at this magnification.

Figure 9B:
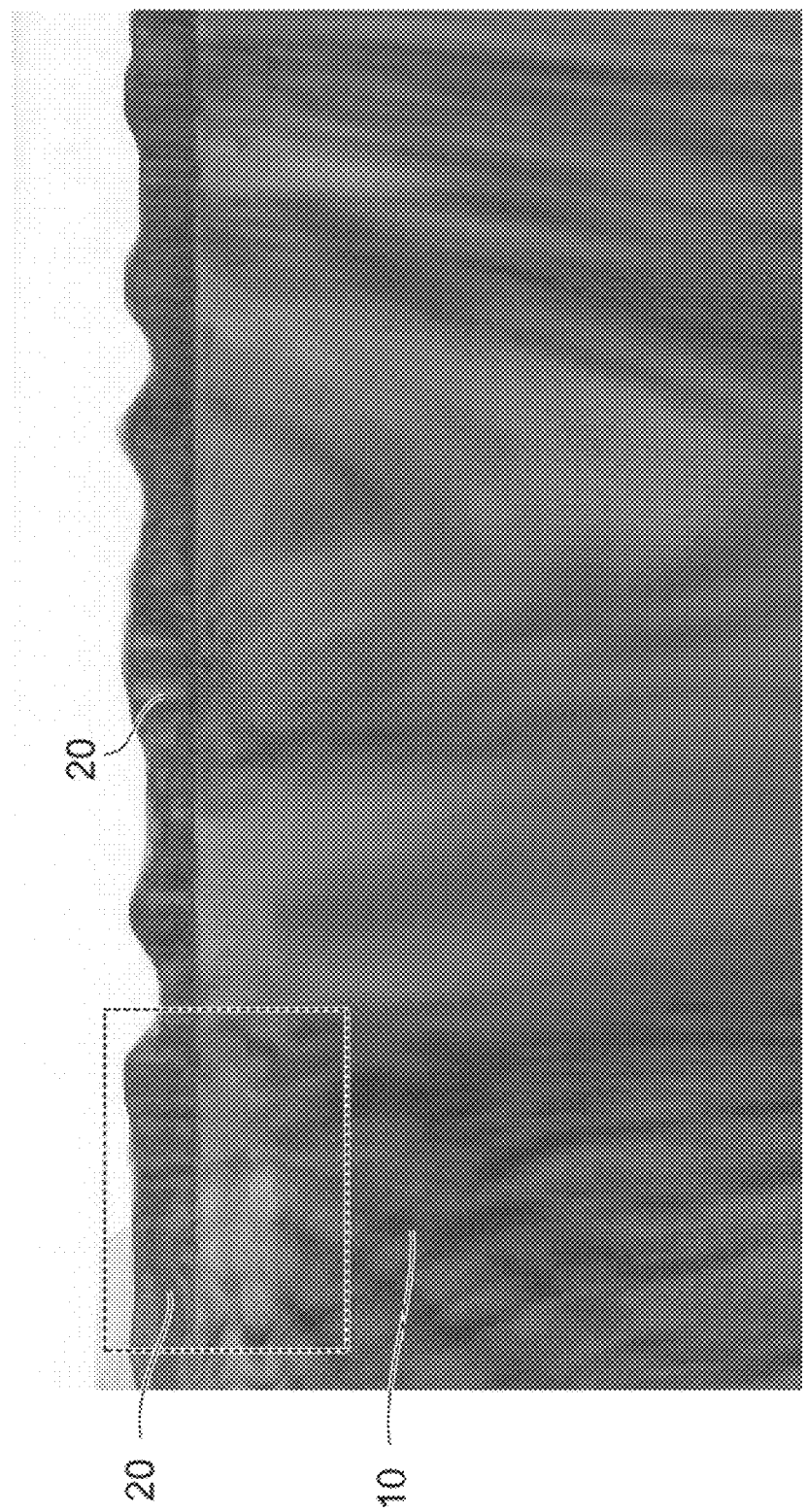

FIG. 9B is an observation image in which the broken line portion of FIG. 9A is enlarged. FIG. 9B is an observation image of 52000 times. In FIG. 9B, fluctuation of the thickness based on the liquid phase growth is observed. The fluctuation of the thickness is a feature of the superconducting layer due to TFA-MOD. Even at this magnification in FIG. 9B, the non-oriented region 40 is not observed.

FIG. 9C is a figure that is an observation image in which the broken line portion of FIG. 9B is enlarged. FIG. 9C is an observation image of 200000 times. A uniformly-oriented structure is seen in FIG. 9C. From the observation image of FIG. 9C, the non-oriented region 40 is not observed. As described above, in the case where the non-oriented region 40 exists, the non-oriented region 40 is observed using the magnification of 200000 times of FIG. 7D. Thus, the non-oriented region 40 is not observed in FIG. 9C which is the observation result of 200000 times at which the non-oriented region 40 is observable.

Figure 9D:
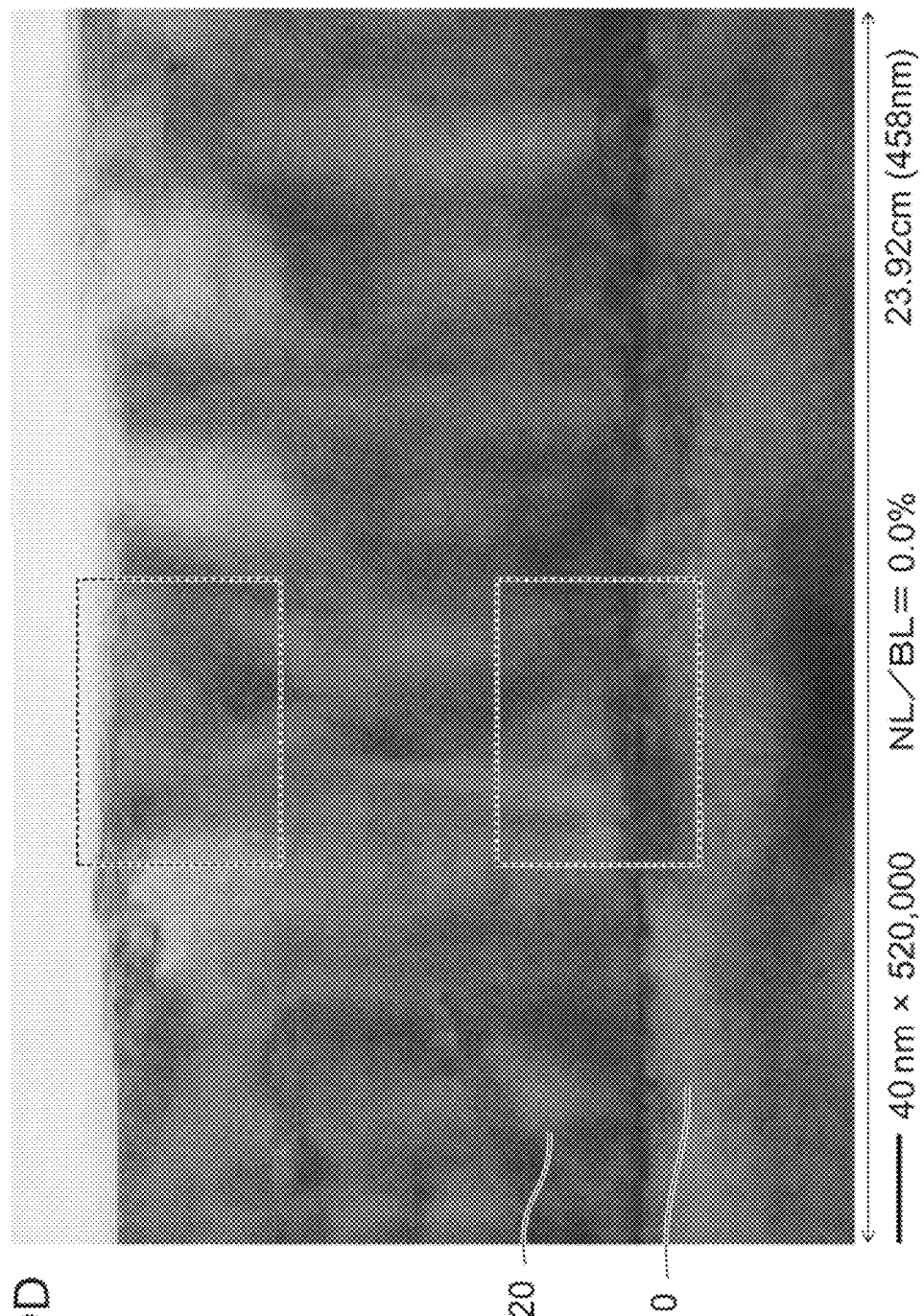

FIG. 9D is an observation image in which the broken line portion of FIG. 9C is enlarged. A uniform c-axis oriented structure is observed in FIG. 9D. The uniform c-axis oriented structure is maintained over the entire surface. In FIG. 9D, the non-oriented region ratio Rnb is 0% when calculated.

Figure 9E:
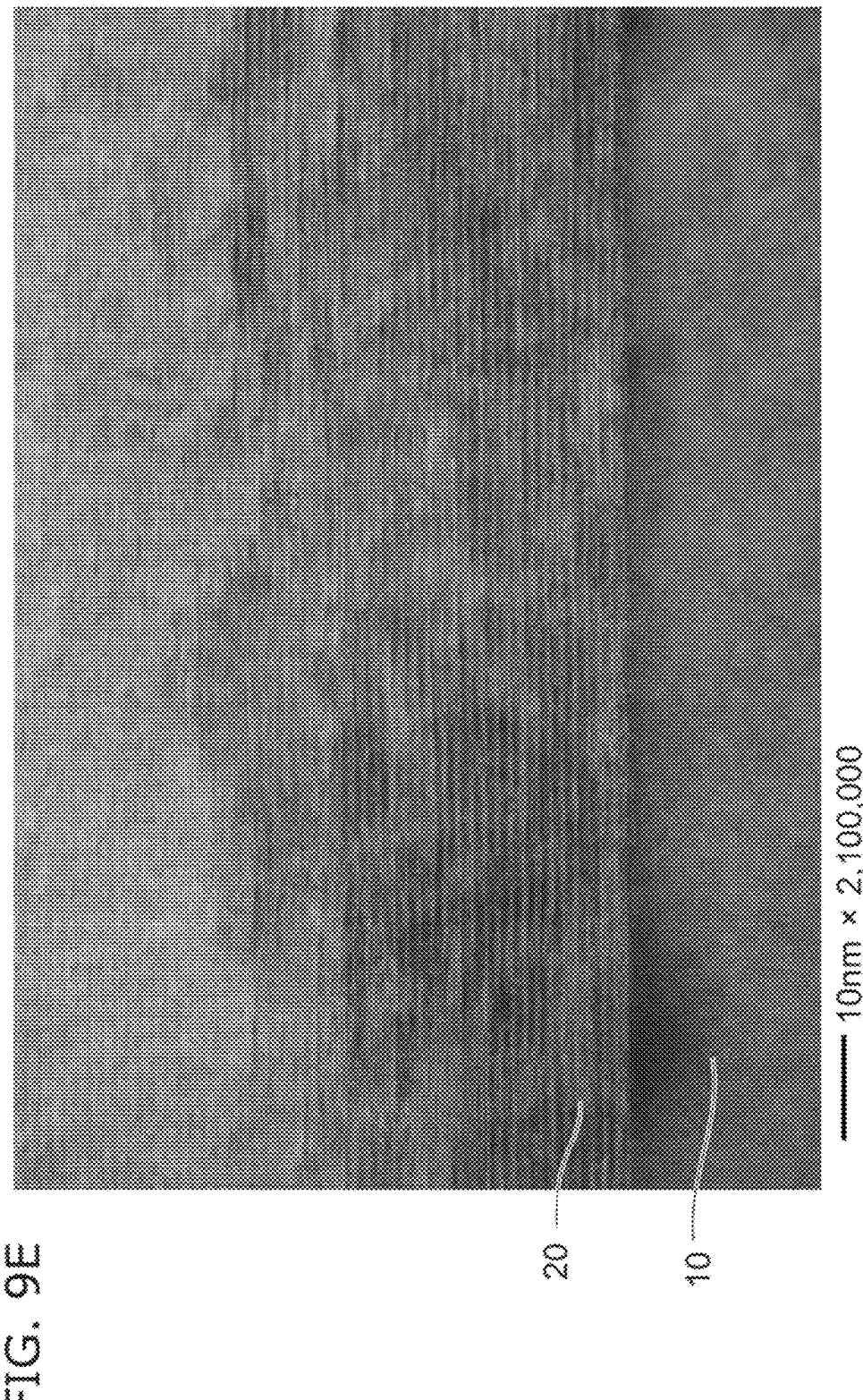

FIG. 9E is a high-magnification observation image of the substrate vicinity region shown by the broken line in FIG. 9D.

Figure 9F:
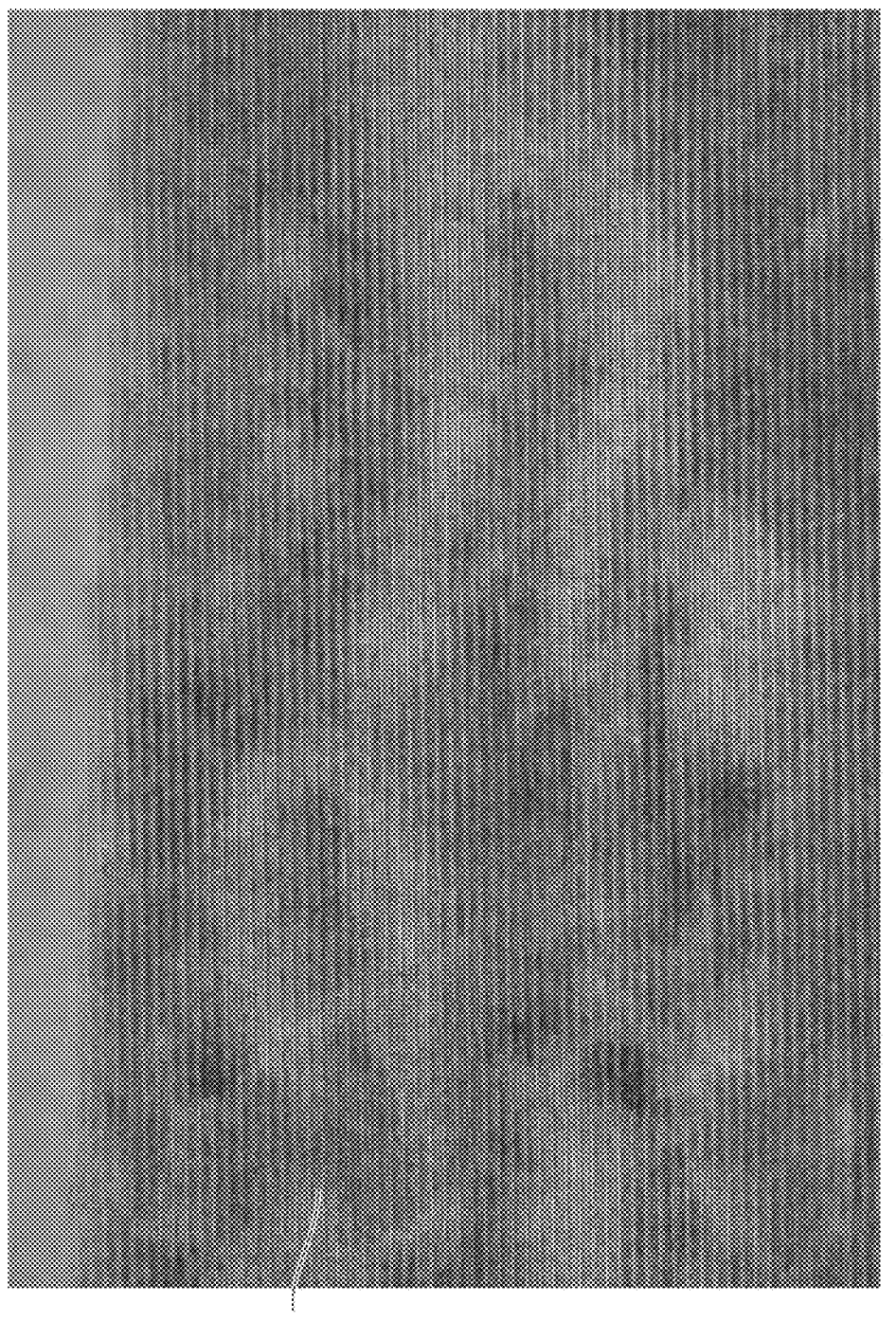

FIG. 9F is a high-magnification observation image of the surface vicinity region shown by the broken line in FIG. 9D.

In FIG. 9E, a somewhat fluctuating perovskite structure of YBCO+SmBCO can be observed directly above the $LaAlO_3$ substrate. The fluctuation is eliminated at a position about 25 nm away from the substrate; further, a perovskite structure that has no fluctuation (disturbance) exists at a position having a distance from the substrate longer than 25 nm.

A perovskite structure that has absolutely no unusual phase up to the film upper portion is observed in FIG. 9F (the observation result of the surface vicinity region). Also, the non-oriented region 40 is not observed. In the sample 3FS—YSm, it could be observed that a uniform layer is formed other than at the substrate vicinity.

These results match the estimate based on the model described above. In the model recited in the description of the second experiment, in the pre-bake, the methanol molecules affect the TFA group in the evaporation and cause the TFA group to move upward. In the third experiment, it is considered that at least one of the three PFPs of the Sm-PFP could be replaced with TFA. For example, it is considered that the molecules of the $Sm(PFP)_2(TFA)$ are affected by the movement due to the evaporation of the methanol; and the Sm segregation at the substrate vicinity is suppressed. The effect is as observed in the cross-section TEM observation images of FIG. 9A to FIG. 9F.

The state of the dispersion of the Sm in the YBCO was verified for the sample 3FS—YSm. The state of the segregation of the Sm is evaluated by performing analysis in three different regions having the central portion of the cross-section TEM observation image as the center. Specifically, EDS (Energy Dispersive X-ray Spectrometer) mapping analysis was performed for each of a 2 nm×2 nm region, a 10 nm×10 nm region, and a 50 nm×50 nm region.

FIG. 10A to FIG. 10D are schematic views showing analysis results of the sample.

Figure 10A:
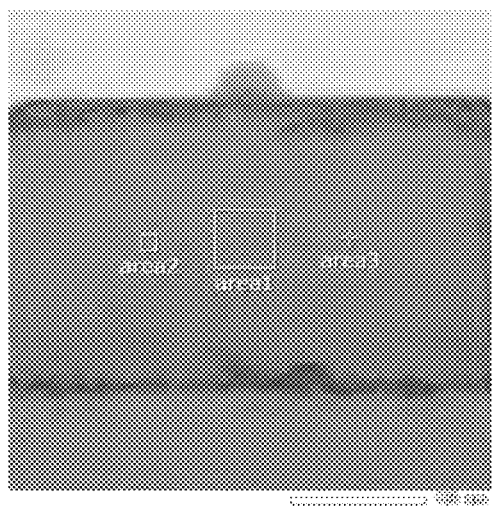
FIG. 10A to FIG. 10D are schematic views showing analysis results of the sample.

FIG. 10A is a figure showing the analysis position of the sample.

Figure 10B:
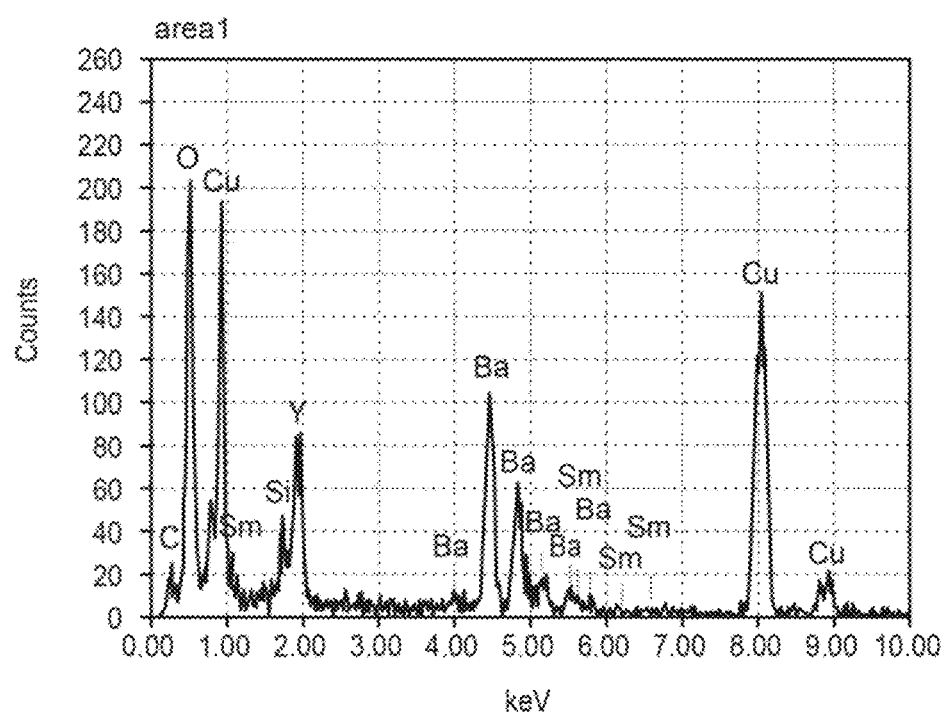
Figure 10C:
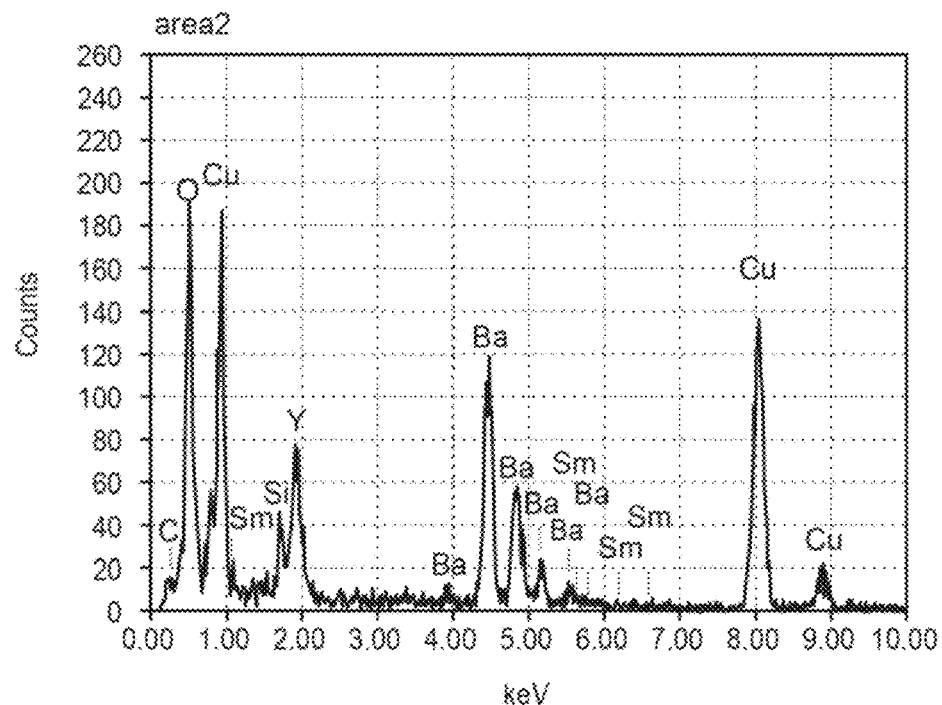
Figure 10D:
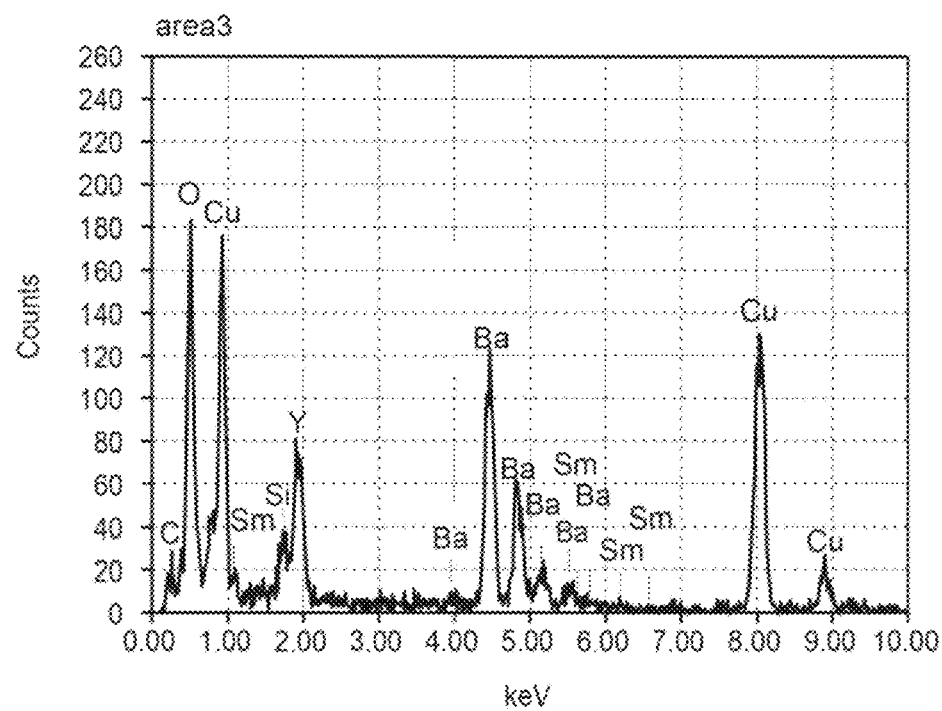

FIG. 10B to FIG. 10D are figures showing the analysis results of the sample.

FIG. 10A is a cross-section TEM image showing the regions (area 1, area 2, and area 3) where the EDS analysis was performed. The region area 1 is the 2 nm×2 nm region. The region area 2 is the 10 nm×10 nm region. The region area 3 is the 50 nm×50 nm region. FIG. 10B to FIG. 10D show the EDS analysis results of the regions of area 1, area 2, and area 3. In FIG. 10B to FIG. 10D, the horizontal axis is the energy (keV); and the vertical axis is the amount (the count).

From FIG. 10B to FIG. 10D, it was found that the distributions of Y, Ba, Cu, and Sm are substantially the same even for mutually-different regions. For example, in the case where the Sm was segregated, the width of the unit cell is 0.4 nm; and the height of the unit cell is about 1.2 nm. Therefore, even in the case of the TEM observation in which the observation result is averaged in the depth direction, when the Sm is segregated, for the analysis of the 2 nm×2 nm region, it is considered that the distribution of the Sm would be much different. However, as shown in FIG. 10B to FIG. 10D, the result was obtained that there is substantially no difference between these three regions. Even in the 50 nm×50 nm region that has the large surface area, the distribution is the same distribution as the other regions having small surface areas. This shows that a state (e.g., extreme dispersion) is obtained in which the unit cell of the SmBCO is dispersed in each unit of the YBCO unit cell.

In a superconductor containing Sm and having a high Tc, it is difficult to cause extreme dispersion of the Sm at the atomic level using conventional technology. In conventional TFA-MOD, there are actual results of being able to mix Y and an element of Eu or higher at any proportion. However, even in the reference example in which the SmBCO is realized, as described above, it is considered that many non-oriented regions 40 were included. The sample of the third experiment has a structure in which the SmBCO that is difficult to make as a single body is first obtained by mixing with YBCO. The structure of the sample of the third experiment is a structure that is first realized by replacing, with TFA, at least a portion of the PFP which has an effect in the mixing.

(Fourth Experiment)

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. The metal mole ratio Ba:Cu is 2:3. Mixing and stirring with a reaction equimolecular amount of $CF_3COOH$ is performed; the obtained mixed solution is placed in an eggplant-shaped flask; reacting and refining are performed in a depressurized rotary evaporator for 12 hours; and a semi-transparent blue substance 4MAi (fourth experiment. Material A with impurity) is obtained. Water and acetic acid which are reaction by-products of the solution synthesis are included in the semi-transparent blue substance 4MAi at about 7 wt %.

Methanol (step Cs-f of FIG. 3A) that corresponds to a weight of about 100 times the obtained semi-transparent, blue substance 4MAi is added to the semi-transparent blue substance 4MAi; and the substance 4MAi is dissolved completely. A semi-transparent blue substance 4MA is obtained by placing the solution in the rotary evaporator and again performing the reacting and the refining in the depressurized rotary evaporator for 12 hours. The semi-transparent blue substance 4MA is dissolved in methanol (step Cs-j of FIG. 3A), 1.50 mol/l by metal ion basis of a half coating solution 4hCs—BaCu (fourth experiment, half coating Solution Ba and Cu) was obtained by diluting using a volumetric flask.

Separately from the description recited above, a half solution that includes Sm is synthesized and refined. Namely, a powder of a hydrate of $Sm(OCOCH_3)_3$ is dissolved in deionized water. Mixing and stirring with a reaction equimolecular amount of $CF_3CF_2COOH$ are performed; the obtained mixed solution is placed in an eggplant-shaped flask; reacting and refining in a depressurized rotary evaporator are performed for 12 hours; and a semi-transparent yellow substance 4MBi is obtained.

Methanol (step Cs-f of FIG. 3A) that corresponds to a weight of about 100 times the obtained semi-transparent yellow substance 4MBi is added to the semi-transparent yellow substance 4MBi; and the substance 4MBi is dissolved completely. A semi-transparent yellow substance 4MB is obtained by placing the solution in the rotary evaporator and again performing the reacting and the refining in the depressurized rotary evaporator for 12 hours. The semi-transparent yellow substance 4MB is dissolved in methanol (step Cs-j of FIG. 3A). 1.20 mol/l by metal ion basis of a half coating solution 4hCs-Sm1 (fourth experiment, half coating solution for SmBCO step 1) was obtained by diluting using a volumetric flask. A half coating solution 4hCs—Sm2 (same as above, step 2) was obtained by mixing a reaction equimolecular amount of TFA and performing low-pressure refining at 200 hPa without heating after mixing methanol corresponding to 100 times 4hCs—Sm1 by volume to 4hCs—Sm1. The replacement process using TFA was further repeated two times; and a coating solution 4hCs—Sm4 (same as above, step 4) was obtained.

A coating solution 4Cs—Sm was prepared by mixing the half coating solution 4hCs—BaCu and the half coating solution 4hCs—Sm4. The metal mole ratio Sm:Ba:Cu is 1:2:3. The concentration of all of the metal ions of the coating solution that is obtained is 1.33 mol/l.

A solution 4Cs—YSm is obtained by mixing the coating solution 1Cs—Y obtained by the method of the first experiment and a coating solution 4Cs—Sm4 of this preparation. The metal mole ratio Y:Sm is 85:15. The concentration of all of the metal ions of the coating solution is 1.47 mol/l.

Film formation of a superconductor on a $LaAlO_3$ monocrystalline substrate was performed using the coating solution 4Cs—YSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 4FS—YSm (fourth experiment, Film of Superconductor, YBCO+SmBCO) which is a superconducting film was obtained.

Cross-section TEM observation and EDS mapping analysis were performed to observe the internal structure of the sample 4FS—YSm that was obtained. The sample is a superconductor obtained using a solution in which 15% of a coating solution having undergone TFA replacement three times is added to the coating solution for the YBCO. The number of replacements N_rep of the sample is 3. As described above in reference to Table 3, in the case where the number of replacements N_rep is 3, the PFP ratio A_PFP bonded to the Sm is 40%. Sm is trivalent; and three PFP groups can be bonded to the Sm. The PFP ratio A_PFP being 40% means that, on average, 1.2 molecules of PFP are bonded to the Sm. Accordingly, in the sample of the experiment as well, the PFP ratio A_PFP is 40%. In the solution of the sample, the Sm occupies ⅙ of the metal ions of the SmBCO solution. In the solution of the fourth experiment, the solution is mixed at a proportion of 15%. The proportion (the PFP ratio A_PFP) of the PFP to the total of the TFA and the PFP is 40%×(⅙)×15%, i.e., 1.0%.

In 1FS—YSm, the PFP ratio in the coating solution was 0.83% of TFA+PFP. This is because 5% of Sm-PFP that is not replaced at all was used. In other words, the PFP ratio A_PFP is 100%×(⅙)×5%, i.e., 0.83%. For example, the PFP content is higher for the solution for 4FS—YSm than for the solution for the sample included the non-oriented region 40 shown In FIG. 7D. In the sample 3FS—YSm refined using TFA, Sm having 56% of PFP bonded (⅙ of the metal ions) is mixed into the YBCO solution at 5%. In such a case, the PFP ratio is 0.45%.

Evaluation results of the sample of the fourth experiment will now be described.

FIG. 11A to FIG. 11F are cross-section TEM images of the sample.

These figures are cross-section TEM images of the "SmBCO+YBCO superconductor" obtained using a solution in which the SmBCO solution having undergone one-time TFA replacement is mixed into the YBCO solution at a concentration of 15%.

Figure 11A:
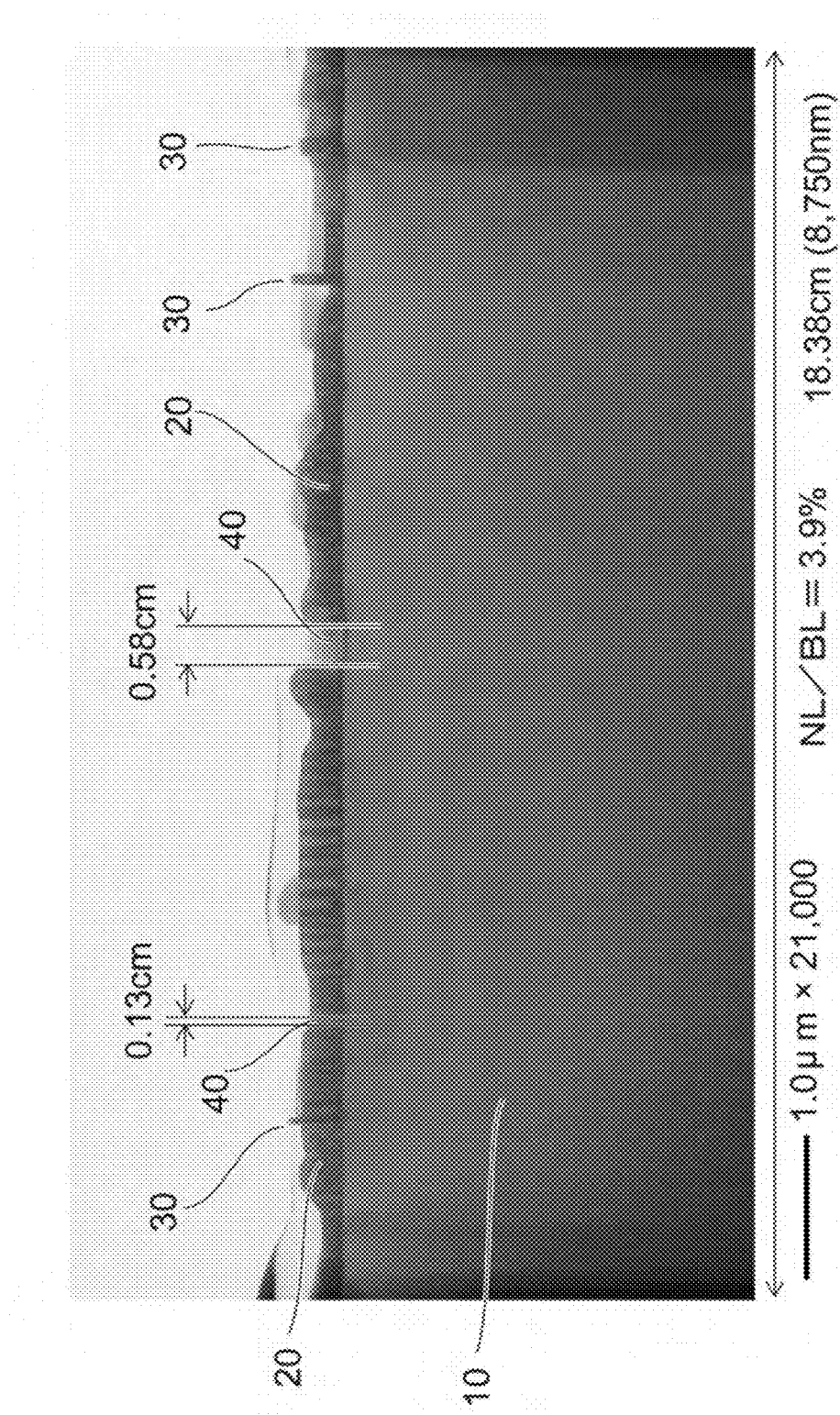
FIG. 11A to FIG. 11F are cross-section TEM images of the sample.

FIG. 11A is a cross-section TEM observation image of 21000 times of a sample 4FSc-YSm.

In FIG. 11A, two regions that are considered to be the non-oriented region 40 are observed; and three regions that are considered to be the a/b-axis orientation region are observed.

If only two locations in the observation image are the non-oriented region 40, the non-oriented region ratio Rnb (NL/BL) is 3.9%.

Figure 11B:
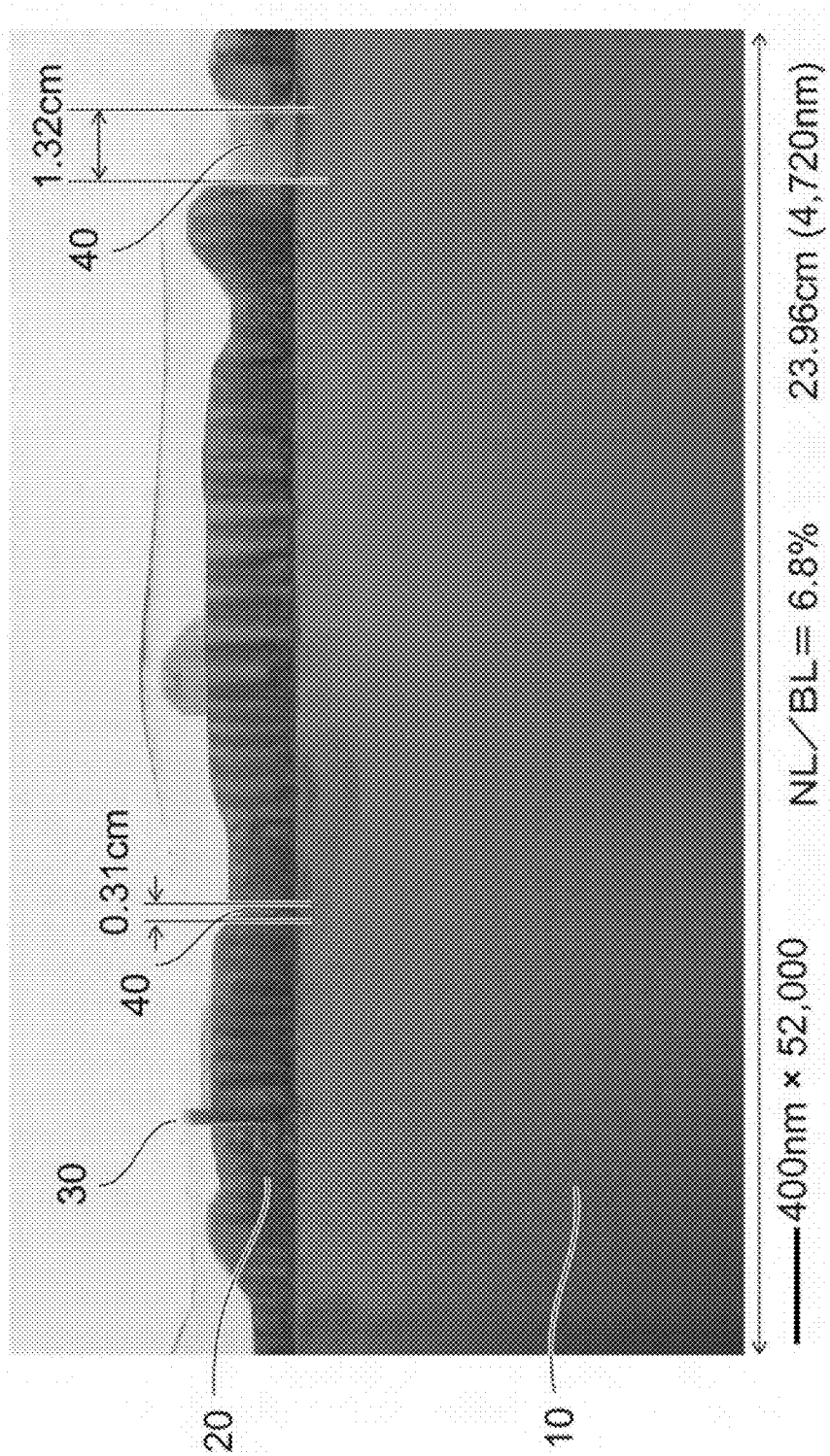
Figure 11C:
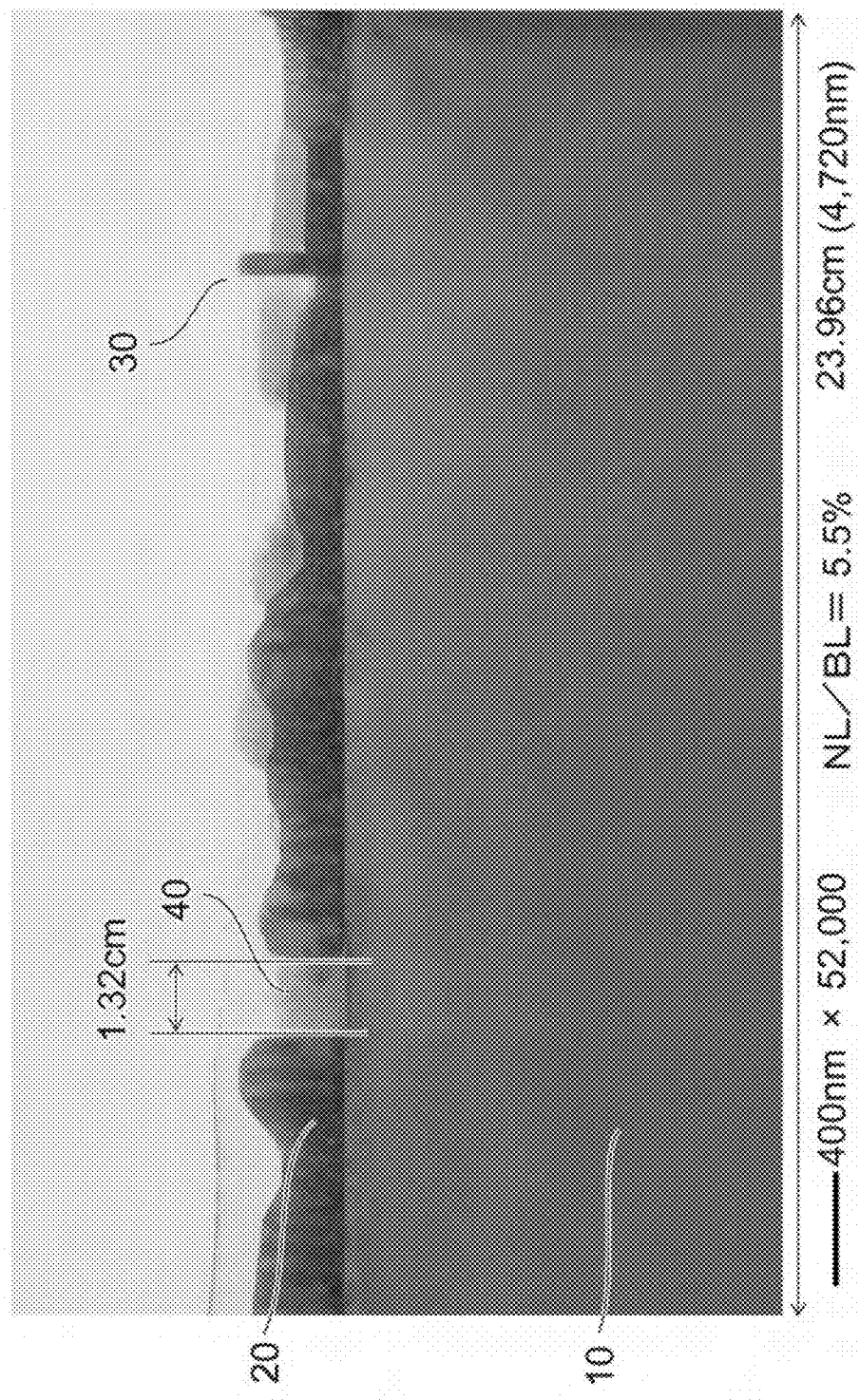

FIG. 11B and FIG. 11C are images of FIG. 11A observed at 52000 times. In FIG. 11B, the non-oriented region 40 is observed at two locations; and NL/BL is 6.8%. In FIG. 11C, one non-oriented region 40 is observed; and NL/BL is 5.5%. NL/BL is largest when the reference length BL of 2 µm is set in a portion of the figure shown in FIG. 11B. At this time, NL/BL is 7.7%. This value is much less than 15% which is considered to have been not realizeable previously.

The content of the PFP of the coating solution corresponding to the sample 4FS—YSm is the maximum among samples 1FS—YFS, 3FS—YSmf and 4FS—YSm of the first experiment, the third experiment, and the fourth experiment. High-magnification observation was used to verify whether or not the effect, occurs at the substrate interface.

Figure 11D:
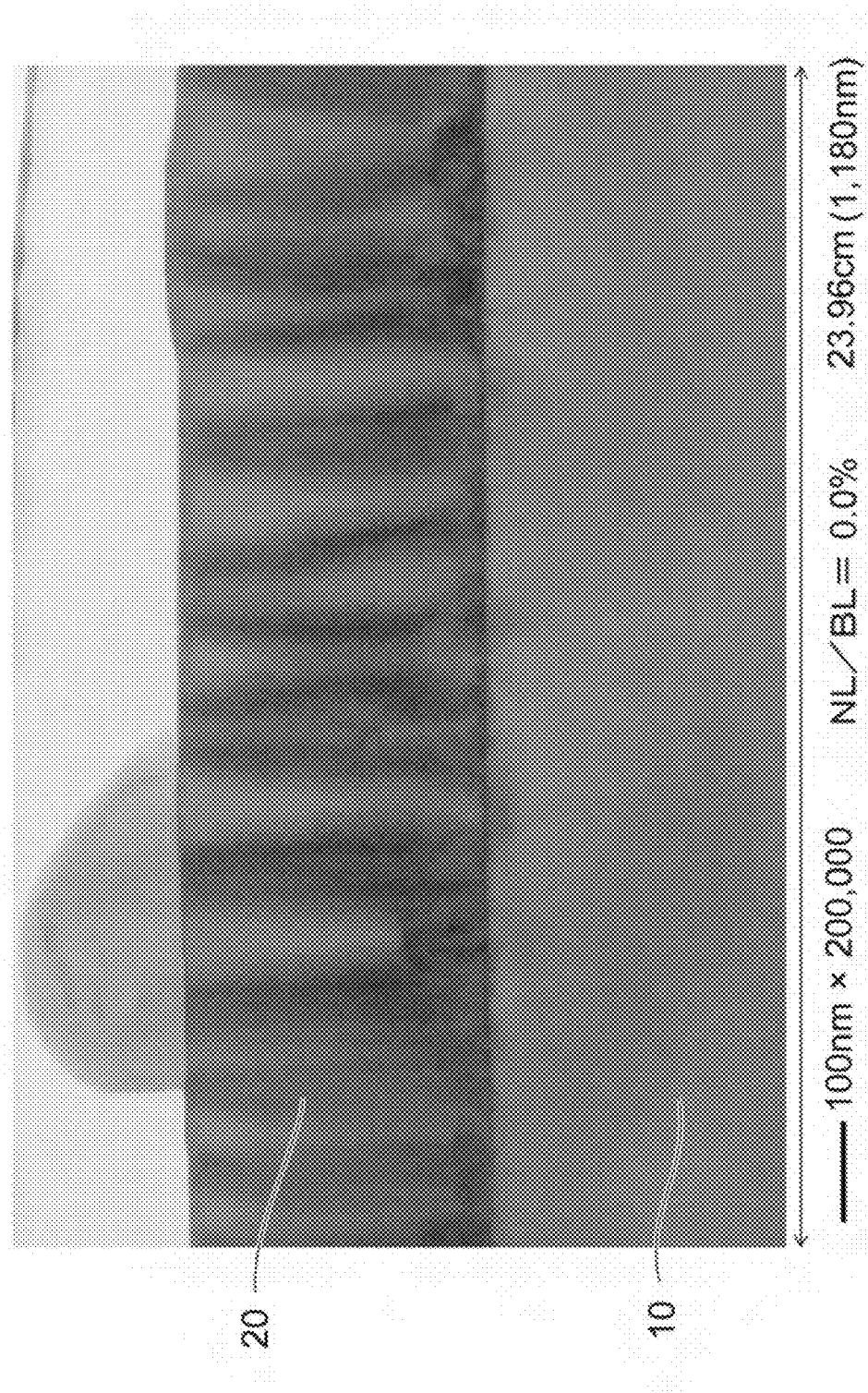
Figure 11E:
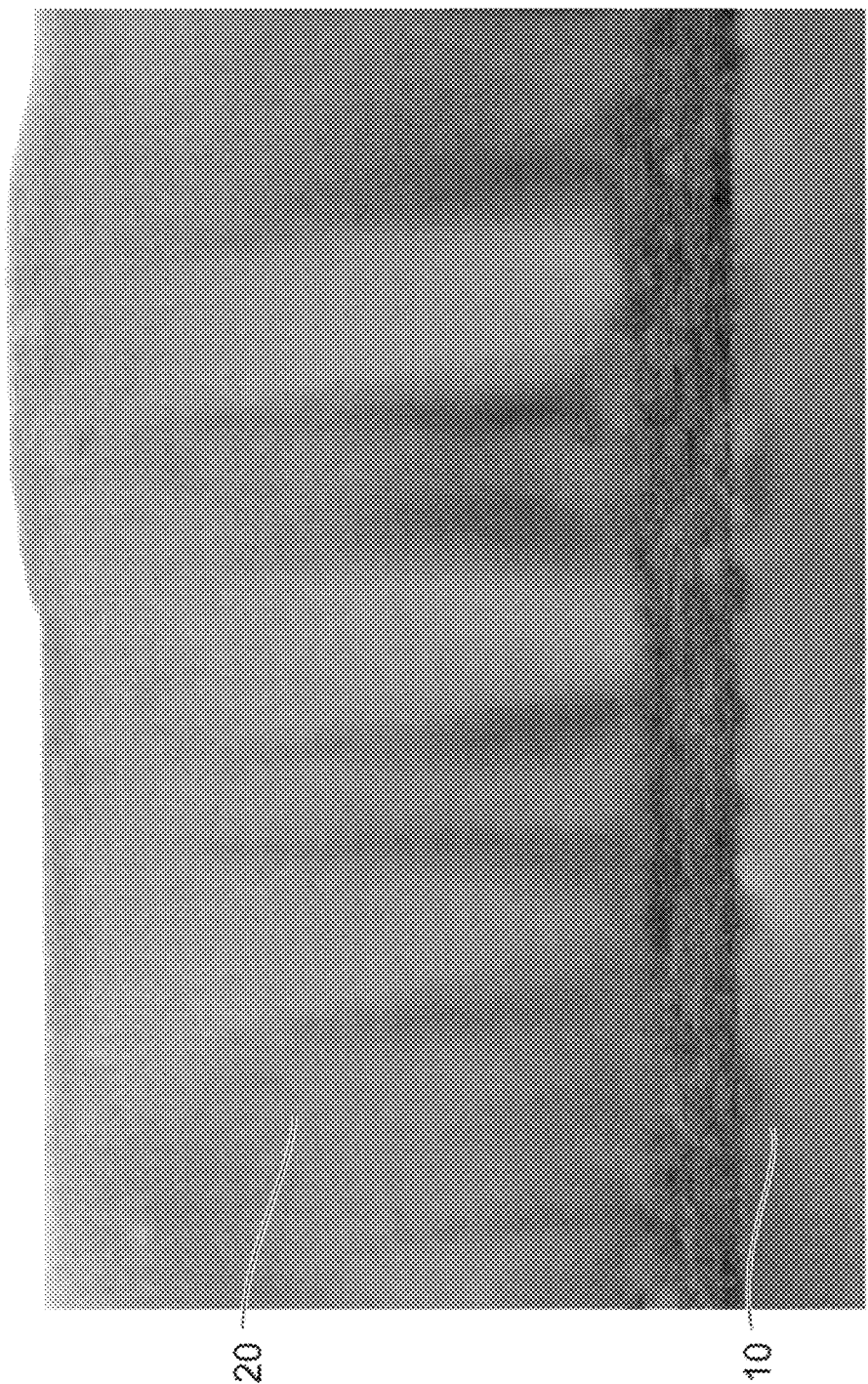

FIG. 11D is an observation image in which a portion observed homogeneously at the central portion vicinity of FIG. 11B is observed by being enlarged 200000 times. FIG. 11E is a further-enlarged observation image; and the magnification of FIG. 11E is 420000 times. From FIG. 11E, although a fluctuating structure is observed in a region from the substrate to a distance of 50 nm, a fluctuating structure is not observed in a region from this region to the film surface. Also, the non-oriented region 40 is not included. FIG. 11E is an image in which the substrate interface to the film upper portion are observable; and the non-oriented region ratio Rnb calculated from FIG. 11E is 0%.

Conversely, in the film that is formed by the method of the reference example, the non-oriented region ratio Rnb is higher than 15%. In the sample of the fourth experiment, the non-oriented region ratio Rnb could be 15% or less by partially mixing the SmBCO.

Figure 11F:
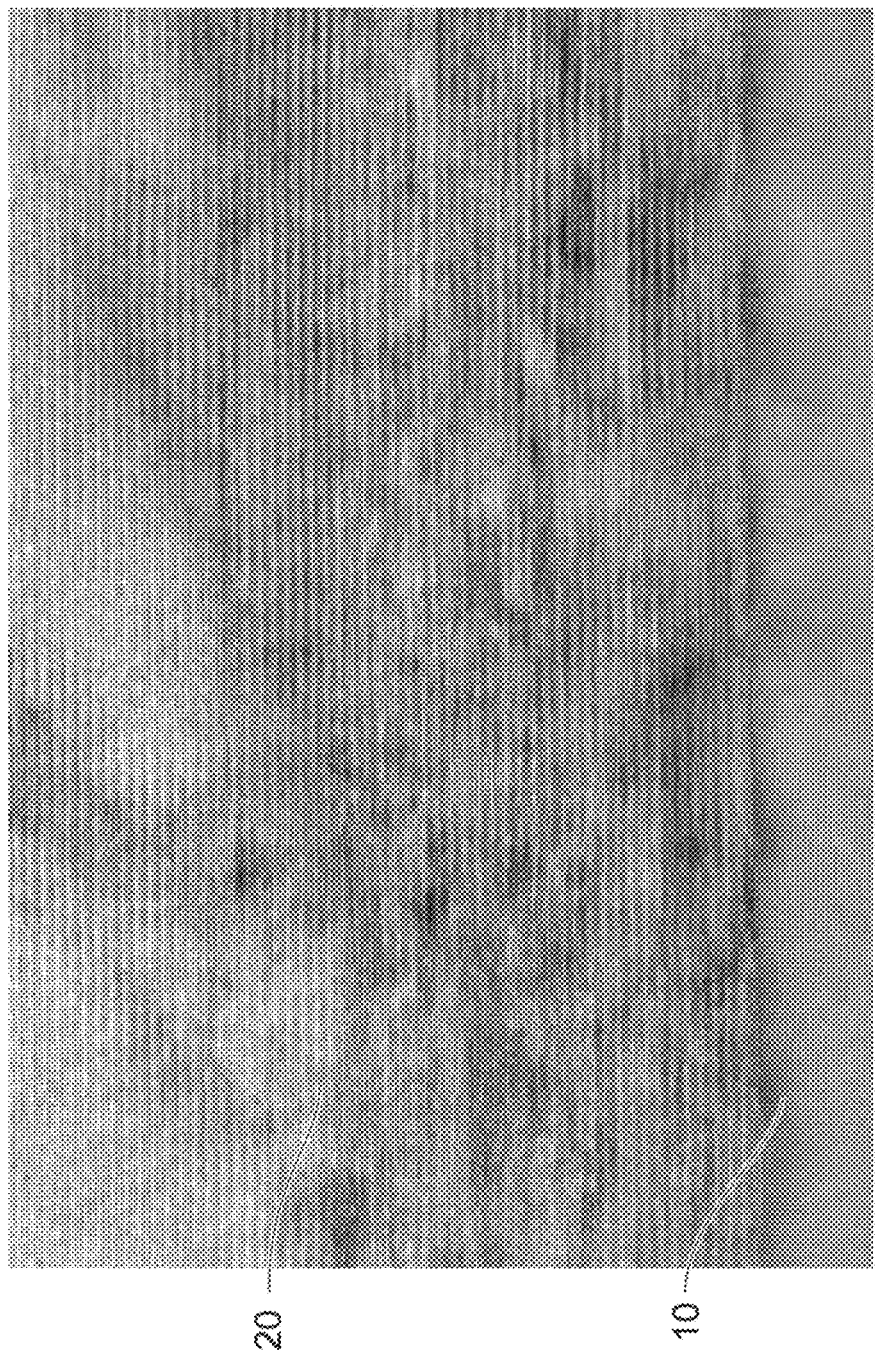

FIG. 11F is an observation image in which the sample is observed at 2100000 times. In FIG. 11F, each one of the atoms included in the perovskite structure can be observed; and the interface with the $LaAlO_3$ which is the substrate also can be recognized distinctly. In this field of view, the oriented layer is disturbed in the region to a distance of about 40 nm from the substrate; and the oriented layer is not disturbed in the upper portion. It was found from the analysis described below that the disturbance of the oriented layer is caused by the segregation of the Sm.

In the sample 4FS—YSm, the PFP ratio A_PFP is 1.0%; and it was found also from the analysis results that more PFP is included than in the sample 1FS—YSm shown in FIG. 7D and FIG. 7E. When the PFP remains, effects occur due to the residual carbon, etc. Separately, the effects of the Sm segregating cause a difference between the sample 4FS—YSm and the sample 1FS—YSm. Good characteristics are obtained by replacing 33% or more of the PFP that is bonded to the Sm with TFA. If even one TFA is bonded to the Sm, the methanol attracts the TFA when the methanol evaporates in the pre-bake; and the extreme segregation at the substrate interface is suppressed. Thereby, a superconductor that has high characteristics is obtained.

It is considered that a lower PFP ratio A_PFP is good. Film formation of the SmBCO may be performed by replacing all of the PFP with TFA.

EDS mapping analysis was performed to confirm where the Sm is included in the sample 4FS—YSm. Although the proportions of Y, Ba, and Cu to the amount of all of the metallic elements in the sample 4FS—YSm are 10% or more and therefore are not a problem, the amount of the Sm is 2.5% of the amount in the state before the sample formation; and the absolute amount of the Sm is low. Additionally, the peak of the Sm overlaps a peak of Ba having a strong intensity. Therefore, for the Sm, quantitative evaluation using the most intense line is difficult; and the second strongest peak is used in the evaluation. Therefore, the measurement region was designated beforehand.

Figure 12:
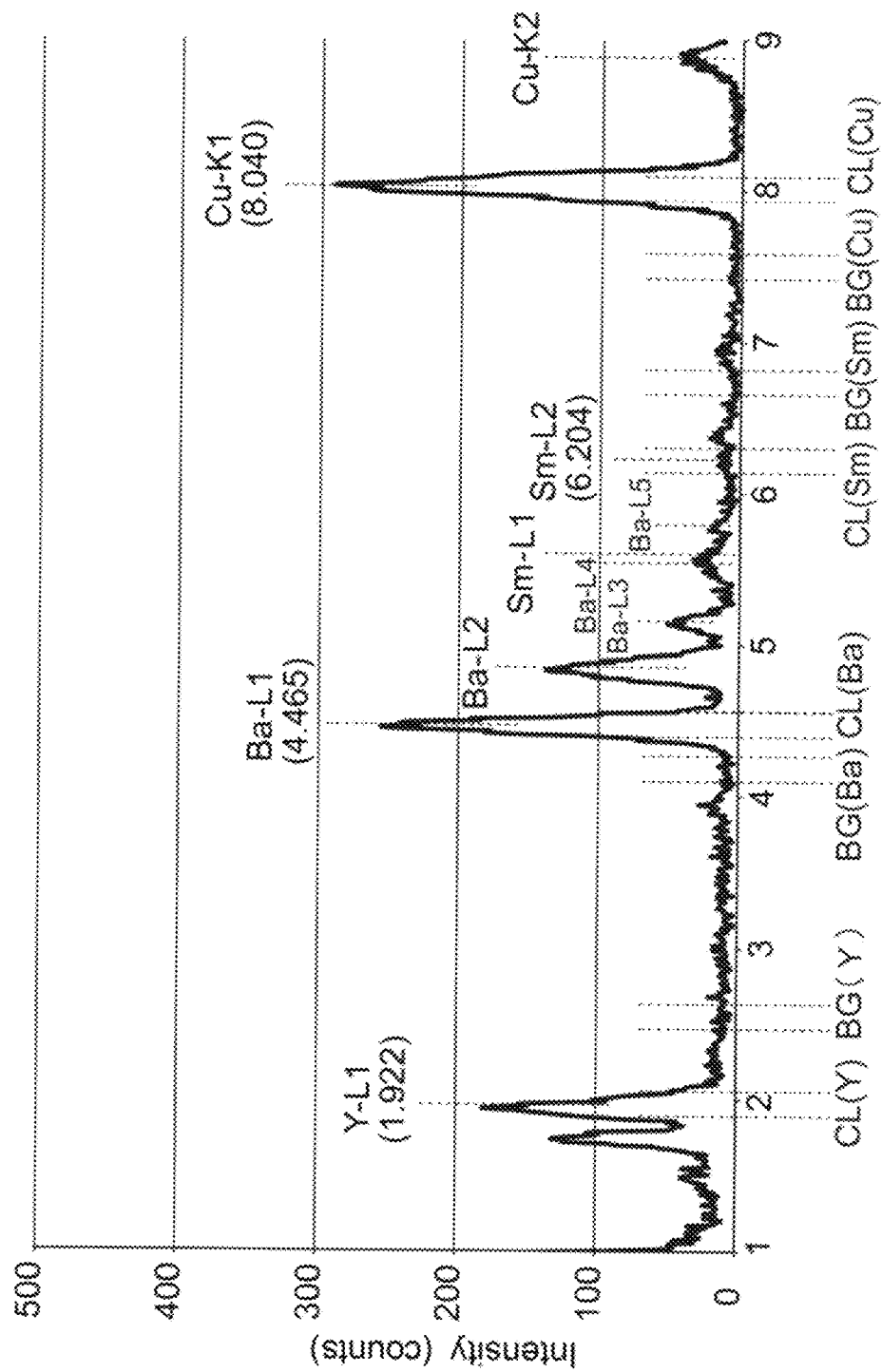
FIG. 12 is a chart showing the evaluation results of the sample.

FIG. 12 is a chart showing the evaluation results of the sample.

FIG. 12 shows the EDX measurement result and the computation range used in the data analysis. In FIG. 12, the horizontal axis is the energy (keV); and the vertical axis is the detected amount (the intensity or count). FIG. 12 shows the EDX analysis result in a 50 nm×50 nm region of the film central portion of the sample 4FS—YSm.

The background region BG(Y) of Y, the region CL(Y) used in the calculation of the amount of Y, the background region BG(Ba) of Ba, the region CL(Ba) used in the calculation of the amount of Ba, the background region BG(Sm) of Sm, the region CL(Sm) used in the calculation of the amount of Sm, the background region BG(Cu) of Cu, and the region CL(Cu) used in the calculation of the amount of Cu are shown in FIG. 12.

The most intense line Y-L1 of Y, the most intense line Ba-L1 of Ba, the most intense line Sm-L1 of Sm, and the most intense line Cu—K1 of Cu are shown in FIG. 12. Also, the lines Ba-L2, Ba-L3, Ba-L4, and Ba-L5 of Ba are shown. Further, the line Sm-L2 of Sm is shown. Further, the line Cu—K2 of Cu is shown.

The most intense line Y-L1 of Y, the most intense line Ba-L1 of Ba, and the most intense line Cu—K1 of Cu are not a problem because they do not overlap the other peaks. On the other hand, the most intense line Sm-L1 of Sm is affected by the line Ba-L4 of Ba. Therefore, the line Sm-L2 was used in the evaluation of Sm; and the intensity of the background region BG(Sm) shown in FIG. 12 was used as the background value.

First, to verify the homogeneity of the film, the amount of the Sm (the ratio of the Sm) was verified at the 2 nm×2 nm region, the 10 nm×10 nm region, and the 50 nm×50 nm region having the positions of 50% of the average thickness as the center.

Figure 13:
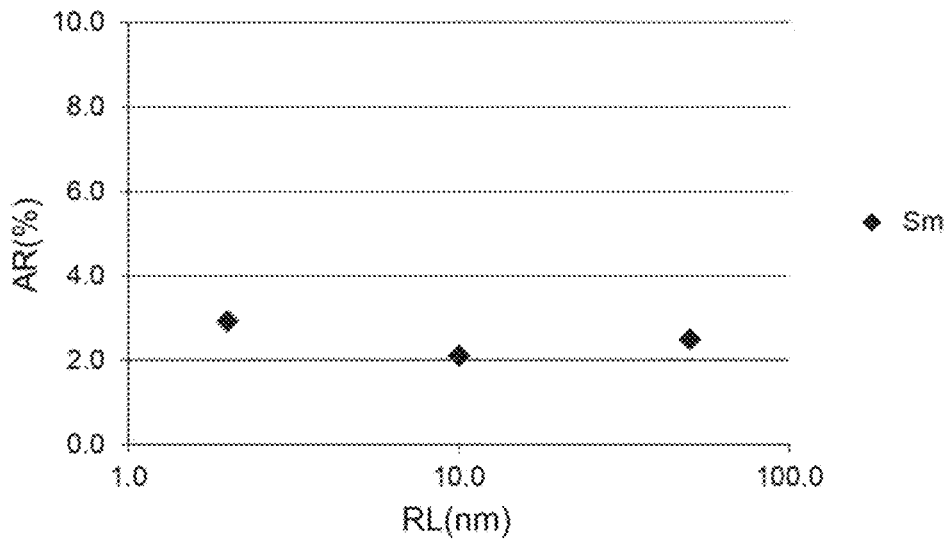
FIG. 13 is a graph showing the measurement results of the sample.

FIG. 13 is a graph showing the measurement results of the sample.

FIG. 13 is the result of the amount of the Sm (the ratio of the Sm) measured in each region of the 2 nm×2 nm region, the 10 nm×10 nm region, and the 50 nm×50 nm region having the positions of 0.50 times the average thickness from the substrate of the SmBCO as the center.

The horizontal axis of FIG. 13 is a length RL (nm) of one side of the region to be measured. The horizontal axis is displayed as a logarithm. The vertical axis is a ratio AR (%) of the detected Sm. The ratio AR of the Sm is atomic percent. The ratio AR of the Sm is the ratio of the amount of the Sm included in each of these regions to the amount of all of the metal included in each of these regions. It is considered that the error of the measurement of the ratio of the Sm is ±0.5%.

As shown in FIG. 13, the ratio AR of the Sm is about 3% when the length RL is 2 nm. The ratio AR of the Sm is about 2.1% when the length RL is 10 nm. The ratio AR of the Sm is about 2.4% when the length RL is 50 nm.

The measurement results of the ratio AR of the Sm in the three measurement regions are within the range of the error of the measurement. Accordingly, from FIG. 13, it can be seen that the Sm is distributed uniformly in the sample. There have been many reports to date of a perovskite structure having a high orientation property being obtained in a YBCO film. However, it is considered that a system in which the Sm is provided uniformly at a constant amount (concentration) is realized for the first time in this experimental result.

For this sample, it is considered that the SmBCO unit cell is disposed between two YBCO unit cells; and one SmBCO unit cell has extreme dispersion without being adjacent to another SmBCO unit cell. Because the size of the SmBCO unit cell is large, it is considered that the SmBCO unit cells grow when the SmBCO unit cells are adjacent if the unit cells are formed from a pseudo-liquid phase. Therefore, the YBCO unit cell has a high likelihood of being adjacent to the SmBCO. Thereby, it is considered that the SmBCO unit cell and the YBCO unit cell have extreme dispersion for each of the unit cell.

By performing a statistical calculation for multiple measurement regions and by determining the value of the standard deviation divided by the average value (σ/Ave), σ/Ave was 0.162. It is considered that σ/Ave is 0.325 or less if the technology according to the embodiment is used. It is considered that such uniformity could not be realized previously.

The distribution of the amount of the Sm in the sample was measured. For the measurement, the measurement was performed in regions at 9 locations in the sample.

Figure 14:
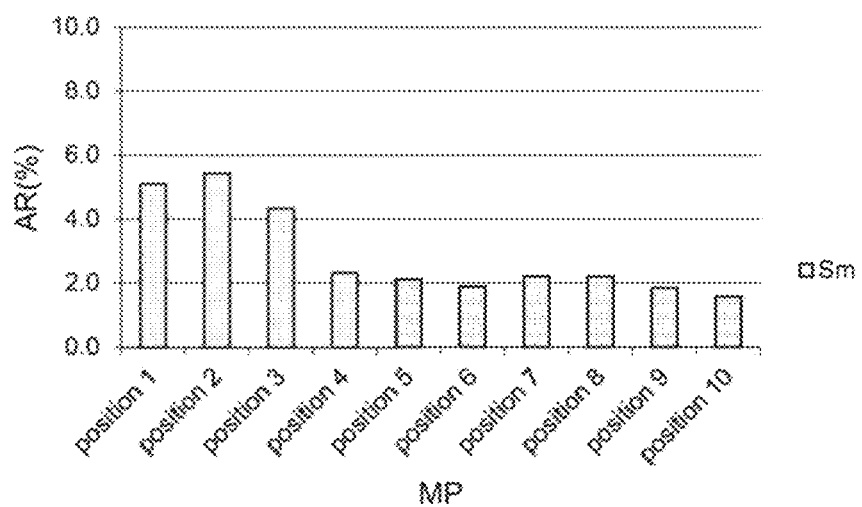
FIG. 14 is a graph showing evaluation results of the sample.

FIG. 14 is a graph showing evaluation results of the sample.

FIG. 14 is the result of the Sm amount measured at multiple regions (10 nm×10 nm) arranged from the substrate toward the surface. The horizontal axis of FIG. 14 is a position Mp of the measurement region. The vertical axis is the ratio AR (%) of the Sm. The distance between the substrate and the center of the region of position N is (20(N−1)+10) nm. For example, the distance between the substrate and the center of the region of position 3 is 50 nm.

As shown in FIG. 14, at the positions (position 1 to position 3) from the substrate to 50 nm, the Sm amount is high; and the Sm amount decreases uniformly therefrom. Although an average of 2.5% of Sm should exist, the Sm amount at the substrate vicinity is about 5%; and the detected Sm amount is nearly 2 times the average. It is considered that the Sm amount has an average of about 2.0% and is low at position 4 and onward due to the segregation of the Sm at the substrate vicinity.

Thus, the ratios AR of the Sm at the positions (position 1 to position 3) from the substrate to 50 nm are higher than the ratios AR of the Sm at the positions (position 4 to position 10) distal to the substrate. In other words, the first surface-side region 55 includes the third region 55c and the fourth region 55d (referring to FIG. 1B). The fourth region 55d is provided between the third region 55c and the base member 15. The fourth region 55d thickness is 50 nm. The ratio (the fourth region ratio) of the amount of the REB included in the fourth region 55d to the amount of the metallic element (the amount of all of the metallic elements) included in the fourth region 55d is not less than the ratio (the third region ratio) of the amount of the REB included in the third region 55c to the amount of the metallic element (the amount of all of the metallic elements) included in the third region 55c. For example, the fourth region ratio is not less than 1 times and not more than 3.5 times the third region ratio.

In the region most proximal to the surface, it is considered that a region exists where the thickness is partially insufficient and a signal is not obtained; and there is a possibility that the measured value may be less than the actual value.

The results of FIG. 14 indirectly show that effects occur when the Sm is more segregated. The Sm amount of the substrate interface is nearly 2 times that of the other portions. A maximum difference of 3.5 times has been measured in the observation results of EDS mapping to date.

The value (σ/Ave) of the standard deviation of the ratio AR of the Sm at the position 4 to position 9 shown in FIG. 14 divided by the average value is 0.090 and is small.

It is considered that σ/Ave is 0.18 or less if the technology according to the embodiment is used. In the embodiment, for example, the multiple fifth regions 55e (referring to FIG. 1B) each have a ratio (the fifth region ratio) of the amount of the REB included in each of the multiple fifth regions 55e to the amount of the metallic element included in the multiple fifth regions 55e. In such a case, the variance of the fifth region ratios of the multiple fifth regions 55e is not more than 0.18 times the average (the arithmetic average) of the fifth region ratios of the multiple fifth regions 55e. Good characteristics (a high Jc value) are obtained easily because the amount (the ratio) of the REB in the multiple fifth regions 55e is uniform. It is considered that such uniformity could not be realized previously.

From the results recited above, even for a solution in which a solution in which 60% of the PFP groups bonded to the Sm are replaced with TFA is mixed into a YBCO coating solution at a proportion of 15%, it was found that a superconductor having a good perovskite structure is obtained. The Jc value of the sample of the fourth experiment was 7.2 MA/cm$^2$ (77 K and 0 T). It was found that the effect of the proportion (the PFP ratio A_PFP) of the PFP that is bonded to the Sm on the Jc value is larger than the effect of the total amount of the PFP (the substance amount of the PFP) on the Jc value.

(Fifth Experiment)

According to the solution flowchart of FIG. 3A, a coating solution for a YBCO superconductor is synthesized and refined. Namely, powders of hydrates of $Ba(OCOCH_3)_2$ $Cu(OCOCH_3)_2$ are dissolved in deionlzed water. The metal mole ratio Ba:Cu is 2:3. Mixing and stirring of a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 5MAi (fifth experiment, Material A with impurity) is obtained. Water and acetic acid which are reaction by-products of the solution synthesis are included in the semi-transparent blue substance 5MAi at about 7 wt %.

Methanol (step Cs-f of FIG. 3A) that corresponds to a weight of about 100 times the obtained semi-transparent blue substance 5MAi is added to the semi-transparent blue substance 5MAi; and the substance 5MAi is dissolved completely. The semi-transparent blue substance 4MA is obtained by placing the solution in the rotary evaporator and again performing the reacting and the refining in the depressurized rotary evaporator for 12 hours. The semi-transparent blue substance 4MA is dissolved in methanol (step Cs-j of FIG. 3A). 1.50 mol/l by metal ion basis of a half coating solution 5hCs—BaCu (fifth experiment, half coating Solution Ba and Cu) was obtained by diluting using a volumetric flask.

Separately from the description recited above, a half solution that includes Sm is synthesized and refined. Namely, a powder of a hydrate of $Sm(OCOCH_3)_3$ is dissolved in deionized water. Mixing and stirring with a reaction equimolecular amount of $CF_3CF_2COOH$ are performed; the obtained mixed solution is placed in an eggplant-shaped flask; reacting and refining are performed in a depressurized rotary evaporator for 12 hours; and a semi-transparent yellow substance 5MBi is obtained.

Methanol (step Cs-f of FIG. 3A) that corresponds to a weight of about 100 times the obtained semi-transparent yellow substance 5MBi is added to the semi-transparent yellow substance 5MBi; and the substance 5MBi is dissolved completely. A semi-transparent yellow substance 5MB is obtained by placing the solution in the rotary evaporator and again, performing the reacting and the refining in the depressurized rotary evaporator for 12 hours. The semi-transparent yellow substance 5MB is dissolved in methanol (step Cs-j of FIG. 3A). 1.20 mol/l by metal ion basis of a half coating solution 5hCs—Sm1 (fifth experiment, half coating solution for SmBCO step 1) was obtained by diluting using a volumetric flask. A half coating solution 5hCs—Sm2 (same as above, step 2) was obtained by mixing a reaction equimolecular amount of TFA and performing low-pressure refining at 200 hPa without heating after mixing methanol corresponding to 100 times 5hCs—Sm1 by volume to 5hCs—Sm1.

A coating solution 5Cs—Sm was prepared by mixing the half coating solution 5hCs—BaCu and the half coating solution 5hCs—Sm2. The metal mole ratio Sm:Ba:Cu is 1:2:3. The concentration of all of the metal ions of the coating solution that is obtained is 1.33 mol/l.

The following coating solution is obtained by mixing the coating solution 1Cs—Y obtained by the method of the first experiment and a coating solution 5Cs—Sm4 of this preparation.

The metal mole ratio Y:Sm of a coating solution 5Cs—YSm5 (fifth experiment, Coating solution YBCO with SmBCO 5% mixed) is 95:5.

In a coating solution 5Cs—YSm10, the metal mole ratio Y:Sm is 90:10.

In a coating solution 5Cs—YSm15, the metal mole ratio Y:Sm is 85:15.

In a coating solution 5Cs—YSm20, the metal mole ratio Y:Sm is 80:20.

In a coating solution 5Cs—YSm25, the metal mole ratio Y:Sm is 75:25.

In a coating solution 5Cs—YSm30, the metal mole ratio Y:Sm is 70:30.

In a coating solution 5Cs—YSm35, the metal mole ratio Y:Sm is 65:35.

In a coating solution 5Cs—YSm40, the metal mole ratio Y:Sm is 60:40.

In a coating solution 5Cs—YSm45, the metal mole ratio Y:Sm is 55:45.

In a coating solution 5Cs—YSm50, the metal mole ratio Y:Sm is 50:50.

The concentration of all of the metal ions in each of the coating solutions that are obtained are 1.41 to 1.49 mol/l.

Film formation of a superconductor on a $LaAlO_3$ monocrystalline substrate was performed by respectively using the coating solutions 5Cs—YSm5, 5Cs—YSm10, 5Cs—YSm15, 5Cs—YSm20, 5Cs—YSm25, 5Cs—YSm30, 5Cs—YSm35, 5Cs—YSm40, 5Cs—YSm45, and 5Cs—YSm50. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 5FS—YSm5 (fifth experiment, Film of Superconductor, YBCO with 5% SmBCO), 5FS—YSm10, 5FS—YSm15, 5FS—YSm20, 5FS—YSm25, 5FS—YSm30, 5FS—YSm35, 5FS—YSm40, 5FS—YSm45, and 5FS—YSm50 which are superconducting films each were obtained.

For the samples recited above, phase identification by the XRD measurement $2\theta/\omega$ method and the Jc measurement by an inductive method were performed. The samples in which the peak intensity occurring at the YBCO (006) vicinity exceeded 150000 cps were 5FS—YSm5, 5FS—YSm10, 5FS—YSm15, 5FS—YSm20, 5FS—YSm25, 5FS—YSm30, 5FS—YSm35, and 5FS—YSm40. The peak intensity occurring at the YBCO (006) vicinity was about 120000 cps and 80000 cps for 5FS—YSm45 and 5FS—YSm50. The Jc values were 7.5, 7.2, 7.3, 7.1, 7.6, 7.3, 6.9, 6.7, 5.4, and 4.1 with units of $MA/cm^2$ (77 K and 0 T) in the order of 5FS—YSm5, 5FS—YSm10, 5FS—YSm15, 5FS—YSm20, 5FS—YSm25, 5FS—YSm30, 5FS—YSm35, 5FS—YSm40, 5FS—YSm45, and 5FS—YSm50. For the samples 5FS—YSm5 and 5FS—YSm15, it is observed that the non-oriented regions 40 are few; and the Jc value is nearly 7 $MA/cm^2$ (77 K and 0 T). Conversely, it is considered that the non-oriented region 40 is included in the reference example; and the Jc value is about 5 $MA/cm^2$ (77 K and 0 T). From the results recited above, it is considered that the state in which the non-oriented regions 40 are few is maintained for a proportion of the Sm that is 40 mol % or less.

(Sixth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionlzed water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 6MAi (sixth experiment, Material A with impurity) is obtained. Water and acetic acid which are reaction by-products of the solution synthesis are included in the semi-transparent blue substance 6MAi at about 7 wt %.

Methanol (step Cs-f of FIG. 3A) that corresponds to a weight of about 100 times the obtained semi-transparent blue substance 6MAi is added to the semi-transparent blue substance 6MAi; and the substance 6MAi is dissolved completely. A semi-transparent blue substance 6MA is obtained by placing the solution in the rotary evaporator and again performing the reacting and the refining in the depressurized rotary evaporator for 12 hours. The semi-transparent blue substance 6MA is dissolved in methanol (step Cs-j of FIG. 3A). 1.50 mol/l by metal ion basis of a halt coating solution 6hCs—BaCu (sixth experiment, half coating Solution Ba and Cu) was obtained by diluting using a volumetric flask.

Separately from the description recited above, a half solution that includes Sm is synthesized and refined. Namely, a powder of a hydrate of Sm(OCOCH$_3$)$_3$ is dissolved in deionized water. Mixing and stirring with a reaction equimolecular amount of CF$_3$CF$_2$COOH are performed; the obtained mixed solution is placed in an eggplant-shaped flask; reacting and refining are performed in a depressurized rotary evaporator for 12 hours; and a semi-transparent yellow substance 6MBi is obtained.

Methanol (step Cs-f of FIG. 3A) that corresponds to a weight of about 100 times the obtained semi-transparent yellow substance 6MBi is added in the semi-transparent yellow substance 6MBi; and the substance 6MBi is dissolved completely, A semi-transparent yellow substance 6MB is obtained by placing the solution in the rotary evaporator and again performing the reacting and the refining in the depressurized rotary evaporator for 12 hours. The semi-transparent yellow substance 6MB is dissolved in methanol (step Cs-j of FIG. 3A). 1.20 mol/l by metal ion basis of a half coating solution 6hCs—Sm1 (sixth experiment, half coating Solution for SmBCO step 1) was obtained by diluting using a volumetric flask. A half coating solution 6hCs—Sm2 (same as above, step 2) was obtained by mixing a reaction equimolecular amount of TFA and performing low-pressure refining at 200 hPa without heating after mixing methanol corresponding to 100 times 6hCs—Sm1 by volume into 6hCs—Sm1. Replacement processing was further repeated two times using a similar method; and half coating solutions 6hCs—Sm3 (same as above, step 3) and 6hCs—Sm4 (same as above, step 4) each were obtained.

A coating solution 6Cs—Sm was prepared by mixing the half coating solution 6hCs—BaCu and the half coating solution 6hCs—Sm4. The metal mole ratio Sm:Ba:Cu is 1:2:3. The concentration of all of the metal ions of the coating solution that is obtained is 1.33 mol/l.

A coating solution 6Cs—YSm (sixth experiment, Coating solution YBCO with SmBCO) was obtained by mixing the coating solution 1Cs—Y obtained by the method of the first experiment and a coating solution 6Cs—Sm4 of this preparation. The metal ion concentration Y:Sm is 95:5. The concentration of all of the metal ions of the coating solution is 1.47 mol/l. In the coating solution, it is considered that 60% of the Sm-PFP is replaced with TFA because the replacement is performed three times. Therefore, on average, it is considered that two of the three PFP groups are TFA.

Film formation of a superconductor on a LaAlO$_3$ monocrystalline substrate was performed using the coating solution 6Cs—YSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 6FS—YSm5-1 (sixth experiment, Film of Superconductor, YBCO with 5% SmBCO, sample 1) which is a superconducting film was obtained.

Cross-section TEM observation of the obtained film was performed at a magnification of 21000 times to 2100000 times. The non-oriented region ratio Rnb (NL/BL) for the reference length BL of 2 µm had a maximum of 4.5%. It is considered that the non-oriented region ratio Rnb is small compared to that of FIG. 11A because the effect of the replacement being performed three times arose. A Jc measurement using an inductive method was performed. A Jc value of 7.4 MA/cm$^2$ (77 K and 0 T) was obtained. It is considered that the thickness of the superconductor is about 150 nm.

Film formation of a superconductor on a LaAlO$_3$ monocrystalline substrate was performed using the coating solution 6Cs—YSm. The film formation was performed using spin coating at a maximum rotation speed of 2000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at: 525° C. or less; and a sample 6FS—YSm5-2 which is a superconducting film was obtained. A Jc measurement using an inductive method was performed. A Jc value of 6.8 MA/cm$^2$ (77 K and 0 T) was obtained. It is considered that the thickness of the superconductor is about 220 nm. Even when the thickness increases, not much characteristic, degradation is observed. This tendency also can be explained by the few a/b-axis orientation particles of the TEM observation results. This tendency is due to the PFP being replaced with TFA. According to the embodiment, the separation of the interior of the superconductor can be suppressed.

(Seventh Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionized water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 7MAi (seventh experiment, Material A with impurity) is obtained. Water and acetic acid which are reaction by-products of the solution synthesis are included in the semi-transparent blue substance 7MAi at about 7 wt %.

Methanol (step Cs-f of FIG. 3A) that corresponds to a weight of about 100 times the obtained semi-transparent blue substance 7MAi is added to the semi-transparent blue substance 7MAi; and the substance 7MAi is dissolved completely. A semi-transparent blue substance 7MA is obtained by placing the solution in the rotary evaporator and again performing the reacting and the refining in the depressurized rotary evaporator for 12 hours. The semi-transparent blue substance 7MA is dissolved in methanol (step Cs-j of FIG. 3A). 1.50 mol/l by metal ion basis of a half coating solution 7hCs—BaCu (seventh experiment, half coating Solution Ba and Cu) was obtained by diluting using a volumetric flask.

Separately from the description recited above, a half solution that includes Sm is synthesized and refined. Namely, a powder of a hydrate of $Sm(OCOCH_3)_3$ is dissolved in deionized water. Mixing and stirring with a reaction equimolecular amount of $CF_3CF_2COOH$ are performed; the obtained mixed solution is placed in an eggplant-shaped flask; reacting and refining are performed in a depressurized rotary evaporator for 12 hours; and a semi-transparent yellow substance 7MBi is obtained.

Methanol (step Cs-f of FIG. 3A) that corresponds to a weight of about 100 times the obtained semi-transparent yellow substance 7MBi is added to the semi-transparent, yellow substance 7MBi; and the substance 7MBi is dissolved completely. A semi-transparent yellow substance 7MB is obtained by placing the solution in the rotary evaporator and again performing the reacting and the refining in the depressurized rotary evaporator for 12 hours. The semi-transparent yellow substance 7MB is dissolved in methanol (step Cs-j of FIG. 3A). 1.20 mol/l by metal ion basis of a half coating solution 7hCs—Sm1 (seventh experiment, half coating solution for SmBCO step 01) was obtained by diluting using a volumetric flask. A half coating solution 7hCs—Sm02 (same as above, step 02) was obtained by mixing a reaction equimolecular amount of TFA and performing low-pressure refining at 200 hPa without heating after mixing methanol corresponding to 100 times 7hCs—Sm01 by volume into 7hCs—Sm01. Replacement processing was further repeated 19 times using a similar method; and half coating solutions 7hCs—Sm03 to 7hCs—Sm21 were obtained. The number of replacements is the number of times 1 is subtracted from the "characters after Sm" in the notation recited above relating to the half coating solutions.

The coating solutions 7Cs—Sm04, 7Cs—Sm06, 7Cs—Sm08, 7Cs—Sm11, 7Cs—Sm14, 7Cs—Sm17, and 7Cs—Sm21 were prepared by respectively mixing half coating solutions 7hCs—Sm04, 6hCs—Sm06, 7hCs—Sm08, 7hCs—Sm11, 7hCs—Sm14, 7hCs—Sm17, and 7hCs—Sm21 with the half coating solution 7hCs—BaCu. The concentration of all of the metal ions of the coating solution that is obtained is 1.33 mol/l. The Sm:Ba:Cu ratios of the solutions each are 1:2:3.

Coating solutions 7Cs—YSm04 (seventh experiment, Coating solution YBCO with SmBCO, derived from step 04). 7Cs—YSm06, 7Cs—YSm08, 7Cs—YSm11, 7Cs—YSm14, 7Cs—YSm17, and 7Cs—YSm21 were obtained by respectively mixing the coating solutions 7Cs—Sm04, 7Cs—Sm06, 7Cs—Sm08, 7Cs—Sm11, 7Cs—Sm14, 7Cs—Sm17, and 7Cs—Sm21 of this preparation with the coating solution 1Cs—Y obtained by the method of the first experiment. The metal mole ratio Y:Sm is 95:5 for each of these solutions. The concentrations of all of the metal ions of these coating solutions each are 1.47 mol/l.

Film formation of superconductors on $LaAlO_3$ monocrystalline substrates was performed by respectively using the coating solutions 7Cs—YSm04, 7Cs—YSm06, 7Cs—YSm08, 7Cs—YSm11, 7Cs—YSm14, 7Cs—YSm17, and 7Cs—YSm21. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 7FS—YSm04 (seventh experiment, Film of Superconductor, YBCO with SmBCO, derived from step 04), 7FS—YSm06, 7FS—YSm08, 7FS—YSm11, 7FS—YSm14, 7FS—YSm17, and 7FS—YSm21 which are superconducting films were obtained. A Jc measurement using an inductive method was performed. The Jc values ($MA/cm^2$ (77 K and 0 T)) respectively were 7.3, 7.5, 7.4, 6.5, 5.2, 5.1, and 4.8.

(Eighth Experiment)

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. The metal mole ratio Ba:Cu is 2:3. Mixing and stirring with a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 8MAi (eighth experiment. Material A with impurity) is obtained. Water and acetic acid which are reaction by-products of the solution synthesis are included in the semi-transparent blue substance 8MAi at about 7 wt %.

Methanol (step Cs-f of FIG. 3A) that corresponds to a weight of about 100 times the obtained semi-transparent blue substance 8MAi is added to the semi-transparent blue substance 8MAi; and the substance 8MAi is dissolved completely. A semi-transparent blue substance 8MA is obtained by placing the solution in the rotary evaporator and again performing the reacting and the refining in the depressurized rotary evaporator for 12 hours. The semi-transparent blue substance 8MA is dissolved in methanol (step Cs-j of FIG. 3A), 1.50 mol/l by metal ion basis of a half coating solution 8hCs—BaCu (eighth experiment, half coating Solution Ba and Cu) was obtained by diluting using a volumetric flask.

Separately from the description recited above, a half solution that includes Sm is synthesized and refined. Namely, a powder of a hydrate of $Sm(OCOCH_3)_3$ is dissolved in deionized water. Mixing and stirring with a reaction equimolecular amount of $CF_3CF_2COON$ are performed; the obtained mixed solution is placed in an eggplant-shaped flask; reacting and refining are performed in a depressurized rotary evaporator for 12 hours; and a semi-transparent yellow substance 8MBi is obtained.

Methanol (step Cs-f of FIG. 3A) that corresponds to a weight of about 100 times the obtained semi-transparent yellow substance 8MBi is added to the semi-transparent yellow substance 8MBi; and the substance 8MBi is dissolved completely, A semi-transparent yellow substance 8MB is obtained by placing the solution in the rotary evaporator and again performing the reacting and the refining in the depressurized rotary evaporator for 12 hours. The semi-transparent yellow substance 6MB is dissolved in methanol (step Cs-j of FIG. 3A), 1.20 mol/l by metal ion basis of a half coating solution 8hCs—Sm1 (eighth experiment, half coating solution for SmBCO step 1) was obtained by diluting using a volumetric flask. A half coating solution 8hCs—Sm2 (same as above, step 2) was obtained by mixing a reaction equimolecular amount of TFA and performing low-pressure refining at 200 hPa without heating after mixing methanol corresponding to 100 times 8hCs—Sm1 by volume into 8hCs—Sm1. Replacement processing was further repeated two times using a similar method; and half coating solutions 8hCs—Sm3 and 8hCs—Sm4 each were obtained.

A coating solution 8Cs—Sm was prepared by mixing the half coating solution 8hCs—BaCu and the half coating solution 8hCs—Sm4. The metal mole ratio Sm:Ba:Cu is 1:2:3. The concentration of all of the metal ions of the coating solution that is obtained is 1.33 mol/l.

According to the solution flowchart of FIG. 3A, a coating solution for a YBCO superconductor is synthesized and refined. Namely, powders of hydrates of $Gd(OCOCH_3)_3$, $Ba(OCOCH_3)_2$, and $Cu(OCOCH_3)_2$ are used as metallic acetates and dissolved in deionized water. The metal mole ratio Gd:Ba:Cu is 1:2:3.

Mixing and stirring with a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 8MCi is obtained. Water and acetic acid which are reaction by-products of the solution synthesis are included in the semi-transparent blue substance 8MCi at about 7 wt %.

Methanol (step Cs-f of FIG. 3A) that corresponds to a weight of about 100 times the obtained semi-transparent blue substance 8MCi is added to the semi-transparent blue substance 8MCi; and the substance 8MCi is dissolved completely. A semi-transparent blue substance 8MC is obtained by placing the solution in the rotary evaporator and again performing the reacting and the refining in the depressurized rotary evaporator for 12 hours. The semi-transparent blue substance 8MC is dissolved in methanol (step Cs-j of FIG. 3A). 1.50 mol/l by metal ion basis of a coating solution 8Cs—Eu (eighth experiment, Coating Solution for Eu-based superconductor) was obtained by diluting using a volumetric flask. 1.50 mol/l of coating solutions 8Cs—Gd, 8Cs—Tb, 8Cs—Dy, 8Cs—Ho, 8Cs—Er, 8Cs—Tm, 8Cs—Yb, and 8Cs—Lu were obtained by respectively using Gd, Tb, Dy, Ho, Er, Tm, Yb, and Lu instead of Eu in a similar method.

Coating solutions 8Cs—EuSm (eighth experiment, Coating solution EuBCO with SmBCO), BCs—GdSm, 8Cs—TbSm, 8Cs—DySm, 8Cs—HoSm, 8Cs—ErSm, 8Cs—TmSm, 8Cs—YbSm, and 8Cs—LuSm were obtained by respectively mixing the coating solution 8Cs—Sm into the coating solutions 8Cs—Gd, 8Cs—Tb, 8Cs—Dy, 8Cs—Ho, 8Cs—Er, 8Cs—Tm, 8Cs—Yb, and 8Cs—Lu. In the solutions, the metal mole ratio (the rare-earth element (e.g., Eu, Gd, etc.):Sm) is 85:15. The concentrations of all of the metal ions of these coating solutions are 1.47 mol/l. In these samples, other rare-earth elements are disposed at the Y sites.

Film formation of a superconductor on a $LaAlO_3$ monocrystalline substrate was performed by using the coating solutions 8Cs—LuSm, 8Cs—GdSm, 8Cs—TbSm, 8Cs—DySm, 8Cs—HoSm, 8Cs—ErSm, 8Cs—TmSm, 8Cs—YbSm, and 8Cs—LuSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 8FS—EuSm (eighth experiment, Film of Superconductor, EuBCO with SmBCO), 8FS—GdSm, 8FS—TbSm, 8FS—DySm, 8FS—HoSm, 8FS—ErSm, 8FS—TmSm, 8FS—YbSm, and 8FS—LuSm which are superconducting films each were obtained.

A Jc measurement using an inductive method was performed. The Jc values ($MA/cm^2$ (77 K and 0 T)) respectively were 6.6, 6.5, 7.5, 7.4, 7.2, 7.4, 7.0, 6.8, and 6.5.

Cross-section TEM observation of the samples 8FS—GdSm, 8FS—DySm, and 8FS—LuSm which are superconducting films was performed; and NL/BL for the reference length BL of 2 μm was determined from the TEM images. NL/BL respectively was 5.3%, 0.0%, and 4.4%. The non-oriented region 40 could not be observed in the observation field of view of the sample 8FS—DySm. It is considered that the effect of the segregation in the pre-bake decreasing occurred because the PFP groups were replaced with the TFA groups.

EDS mapping measurement was implemented for the samples 8FS—GdSm, 8FS—DySm, and 8FS—LuSm which are superconducting films in three regions having the center line of the cross-section TEM image as the center. For each of the samples, the Sm amount was 2.2%±0.4. From the TEM observation results, a good c-axis orientation structure at the atomic level was observed. It was found that a structure in which the Sm is dispersed uniformly can be realised if the technology according to the embodiment is used in a superconductor in which the Y sites are replaced with one of Eu to Lu.

(Ninth Experiment)

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. The metal mole ratio Ba:Cu is 2:3. Mixing and stirring with a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 9MAi (ninth experiment, Material A with impurity) is obtained. Water and acetic acid which are reaction by-products of the solution synthesis are included in the semi-transparent blue substance 9MAi at about 7 wt %.

Methanol (step Cs-f of FIG. 3A) that corresponds to a weight of about 100 times the obtained semi-transparent blue substance 9MAi is added to the semi-transparent blue substance 9MAi; and the substance 9MAi is dissolved completely. A semi-transparent blue substance 9MA is obtained by placing the solution in the rotary evaporator and again performing the reacting and the refining in the depressurized rotary evaporator for 12 hours. The semi-transparent blue substance 9MA is dissolved in methanol (step Cs-j of FIG. 3A), 1.50 mol/l by metal ion basis of a half coating solution 9hCs—BaCu (ninth experiment, half coating Solution Ba and Cu) was obtained by diluting using a volumetric flask.

Separately from the description recited above, half solutions that include Nd and La are synthesized and refined, Namely, powders of $Nd(OCOCH_3)_3$ and $La(OCOCH_3)_3$ hydrates are dissolved in deionized water. Mixing and stirring with a reaction equimolecular amount of $CF_3CF_2COOH$ are performed; the obtained mixed solution is placed in an eggplant-shaped flask; reacting and refining are performed in a depressurized rotary evaporator for 12 hours; and semi-transparent violet and semi-transparent white substances 9MBi and 9MCi each are obtained.

Methanol (step Cs-f of FIG. 3A) that corresponds respectively to a weight of about 100 times the obtained semi-transparent violet and semi-transparent white substances 9MBi and 9MCi is added respectively to the semi-transparent violet and semi-transparent white substances 9MBi and 9MCi; and the substances 9MBi and 9MCi each are dissolved completely. Semi-transparent violet and semi-transparent white substances 9MB and 9MC are obtained by placing the solution in the rotary evaporator and again performing the reacting and the refining in the depressurized rotary evaporator for 12 hours. The semi-transparent violet and semi-transparent white substances 9MB and 9MC each are dissolved in methanol (step Cs-j of FIG. 3A), 0.80 mol/l and 0.98 mol/l by metal ion basis of half coating solutions 9hCs—Nd1 (ninth experiment, half coating solution for NdBCO step 1) and 9hCs—La1 respectively were obtained by diluting using a volumetric flask. Half coating solutions 9hCs—Nd2 (same as above, step 2) and 9hCs—La2 were obtained by mixing a reaction equimolecular amount of TFA and performing low-pressure refining at 200 hPa without heating after mixing methanol corresponding respectively to 100 times 9hCs—Nd1 and 9hCs—La1 by volume into 9hCs—Nd1 and 9hCs—La1.

A coating solution 9Cs—Nd2 was prepared by mixing the half coating solution 3hCs—BaCu and the half coating solution 9hCs—Nd2. The metal mole ratio Nd:Ba:Cu of the coating solution 9Cs—Nd2 is 1:2:3. A coating solution 9Cs—La2 was prepared by mixing the half coating solution 3hCs—BaCu and the half coating solution 9hCs—La2. The metal mole ratio La:Ba:Cu of the coating solution 9Cs—La2 is 1:2:3. The concentrations of all of the metal ions of the coating solutions that were obtained respectively are 1.31 mol/l and 1.38 mol/l.

Coating solutions 9Cs—YNd and 9Cs—YLa were obtained by respectively mixing the coating solutions 9Cs—Nd2 and 9Cs—La2of this preparation with the coating solution 1Cs—Y obtained by the method of the first experiment. The metal mole ratio Y:Nd is 95:5 for each of these solutions. The concentration of all of the metal ions is 1.49 mol/l for each of these coating solutions.

Film formation of superconductors on $LaAlO_3$ monocrystalline substrates was performed by respectively using the coating solutions 9Cs—YNd and 9Cs—YLa. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 9FS—YNd (first experiment, Film of Superconductor, YBCO+NdBCO) and 9FS—YLa which are superconducting films were obtained.

The samples 9FS—YNd and 9FS—YLa were measured using the 2θ/ω method of XRD measurement. In the sample 9FS—YNd, a good peak of 150000 cps was obtained at the YBCO (006) vicinity. In the sample 9FS—YLa, a peak of about 60000 cps was obtained, A Jc measurement using an inductive method was performed. The Jc values of 9FS—YNd and 9FS—YLa respectively were 6.7 MA/cm$^2$ (77 K and 0 T) and 1.4 MA/cm$^2$ (77 K and 0 T). In the sample 9FS—YLa, there was a problem with the completeness of the LaBCO solution; and there is a possibility that the characteristics did not improve.

Although it is considered that the LaBCO-based superconductor has the highest Tc, a superconductor that has sufficient characteristics is not obtained in the reference example as well. It is considered that this is the reason why there is a possibility that the characteristics did not improve even though the superconductor mixed with the YBCO superconductor was made. Because it is considered that characteristic improvement using La-based materials is difficult with current technology, only Nd-based was investigated.

(Tenth Experiment)

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. The metal mole ratio Ba:Cu is 2:3. Mixing and stirring with a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 10MAi (tenth experiment, Material A with Impurity) is obtained. Water and acetic acid which are reaction by-products of the solution synthesis are included in the semi-transparent blue substance 10MAi at about 7 wt %.

Methanol (step Cs-f of FIG. 3A) that corresponds to a weight of about 100 times the obtained semi-transparent blue substance 10MAi is added to the semi-transparent blue substance 10MAi; and the substance 10MAi is dissolved completely. A semi-transparent blue substance 10MA is obtained by placing the solution in the rotary evaporator and again performing the reacting and the refining in the depressurized rotary evaporator for 12 hours. The semi-transparent blue substance 10MA is dissolved in methanol (step Cs-j of FIG. 3A). 1.50 mol/l by metal ion basis of a half coating solution 10hCs—BaCu (tenth experiment, half coating Solution Ba and Cu) was obtained by diluting using a volumetric flask.

Separately from the description recited above, a half solution that includes Nd is synthesized and refined. Namely, a powder of a $Nd(OCOCH_3)_3$ hydrate is dissolved in deionized water. Mixing and stirring with a reaction equimolecular amount, of $CF_3CF_2COOH$ are performed. The obtained mixed solution is placed in an eggplant-shaped flask; reacting and refining are performed in a depressurized rotary evaporator for 12 hours; and a semi-transparent violet substance 10MBi is obtained.

Methanol (step Cs-f of FIG. 3A) that corresponds to a weight of about 100 times the obtained semi-transparent violet substance 10MBi is added to the semi-transparent violet substance 10MBi; and the substance 10MBi is dissolved completely. A semi-transparent violet substance 10MB is obtained by placing the solution in the rotary evaporator and again performing the reacting and the refining in the depressurized rotary evaporator for 12 hours. The semi-transparent violet substance 10MB is dissolved in methanol (step Cs-j of FIG. 3A). 0.80 mol/l by metal ion basis of a half coating solution 10hCs—Nd1 (tenth experiment, half coating Solution for NdBCO step 1) was obtained by diluting using a volumetric flask. A half coating solution 10hCs—Nd2 (same as above, step 2) was obtained by mixing a reaction equimolecular amount of TFA and performing low-pressure refining at 200 hPa without heating after mixing methanol corresponding to 100 times 10hCs—Nd1 by volume into 10hCs—Nd1.

A coating solution 10Cs—Nd2 was obtained by mixing the half coating solution 10hCs—BaCu and the half coating solution 10hCs—Nd2. The metal mole ratio Nd:Ba:Cu is 1:2:3. The concentration of all of the metal ions of the coating solution that is obtained is 1.31 mol/l.

A coating solution 10Cs—YNd was obtained by mixing the coating solution 1Cs—Y obtained by the method of the first experiment and the coating solution 10Cs—Nd2 of this preparation. The metal mole ratio Y:Nd is 95:5. The concentration of all of the metal ions of the coating solution is 1.49 mol/l.

Film formation of a superconductor on a $LaAlO_3$ monocrystalline substrate was performed by using the coating solution 10Cs—YNd. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 10FS—YNd (tenth experiment, Film of Superconductor, YBCO+NdBCO) which is a superconducting film was obtained.

Cross-section TEM observation and EDS mapping analysis of the sample 10FS—YNd were performed; and evaluations of the non-oriented region ratio Rnb and dispersion condition of the Nd were performed. In the cross-section TEM observation, observation was performed at magnifications of 21000 times to 2100000 times; and good observation images having few a/b-axis orientation particles were observed. By determining NL/BL for the reference length BL of 2 μm, NL/BL had a maximum of 4.3%. It is considered that these results are results that are slightly degraded compared to the case of mixing with the YBCO+SmBCO because the Nd-based coating solution does not have as good of quality as Sm-based.

In the NdBCO superconductor film formation of the reference example, even for the sample having the highest Tc, Tc was 93.6 K. On the other hand, it is said that the theoretical Tc is 96.0 K. This indirectly shows that the solution of the reference example is not the best. On the other hand, in the SmBCO film formation, the theoretical Tc is 94.0 K; and the maximum value of Tc is 93.9 K. In the solution synthesis of the reference example, compared to the solution for the SmBCO, the solution for the NdBCO is more incomplete. It is considered that due to the mixing with the YBCO solution, the incompleteness of the solution causes not only the segregation of the Nd component but also the formation of the residual carbon, the non-oriented region caused by the residual carbon, etc.; and the effects are enlarged.

However, the non-oriented region ratio Rnb of the sample of the experiment recited above is a sufficiently low value. The NdBCO superconductor is included as a portion; and a perovskite structure that has superconducting characteristics having high characteristics was observed for the first time in this sample.

(Eleventh Experiment)

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. The metal mole ratio Ba:Cu is 2:3. Mixing and stirring with a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 11MAi (eleventh experiment, Material A with impurity) is obtained. Water and acetic acid which are reaction by-products of the solution synthesis are included in the semi-transparent blue substance 11MAi at about 7 wt %.

Methanol (step Cs-f of FIG. 3A) that corresponds to a weight of about 100 times the obtained semi-transparent blue substance 11MAi is added to the semi-transparent blue substance 11MAi; and the substance 11MAi is dissolved completely. A semi-transparent blue substance 11MA is obtained by placing the solution in the rotary evaporator and again performing the reacting and the refining in the depressurized rotary evaporator for 12 hours. The semi-transparent blue substance 11MA is dissolved in methanol (step Cs-j of FIG. 3A), 1.50 mol/l by metal ion basis of a half coating solution 11hCs—BaCu (eleventh experiment, half coating Solution Ba and Cu) was obtained by diluting using a volumetric flask.

Separately from the description recited above, a half solution that includes Nd is synthesized and refined. Namely, a powder of a $Nd(OCOCH_3)_3$ hydrate is dissolved in deionized water. Mixing and stirring with a reaction equimolecular amount of $CF_3CF_2COOH$ are performed. The obtained mixed solution is placed in an eggplant-shaped flask; reacting and refining are performed in a depressurized rotary evaporator for 12 hours; and a semi-transparent violet substance 11MBi is obtained.

Methanol (step Cs-f of FIG. 3A) that corresponds to a weight of about 100 times the obtained semi-transparent violet substance 11MBi is added to the semi-transparent violet substance 11MBi; and the substance 11MBi is dissolved completely. A semi-transparent violet substance 11MB is obtained by placing the solution in the rotary evaporator and again performing the reacting and the refining in the depressurized rotary evaporator for 12 hours. The semi-transparent violet substance 11MB is dissolved in methanol (step Cs-j of FIG. 3A). 0.80 mol/l by metal ion basis of a half coating solution 11hCs—Nd1 (eleventh experiment, half coating solution for NdBCO step 1) was obtained by diluting using a volumetric flask. A half coating solution 11hCs—Nd2(same as above, step 2) was obtained by mixing a reaction equimolecular amount of TFA and performing low-pressure refining at 200 hPa without heating after mixing methanol corresponding to 100 times 11hCs—Nd1 by volume into 11hCs—Nd1. The TFA ratio of the solution was 35%.

A coating solution 11Cs—Nd2 was obtained by mixing the half coating solution 11hCs—BaCu and the half coating solution 11hCs—Nd2. The metal mole ratio Nd:Ba:Cu is 1:2:3. The concentration of all of the metal ions of the coating solution that is obtained is 1.31 mol/l.

Coating solutions 11Cs—YNdOS (eleventh experiment, Coating solution YBCO+NdBCO 05%), 11Cs—YNd10, 11Cs—YNd15, 11Cs—YNd20, 11Cs—YNd25, 11Cs—YNd30, 11Cs—YNd35, 11Cs—YNd40, 11Cs—YNd45, and 11Cs—YNd50 were obtained by respectively mixing the coating solution 11Cs-Nd2 of this preparation and the coating solution 1Cs—Y obtained by the method of the eleventh experiment. The metal mole ratios Y:Nd are 95:05, 90:10, 85:15, 80:20, 75:25, 70:30, 65:35, 60:40, 55:45, and 50:50 respectively for the coating solutions 11Cs—YNd05, 11Cs—YNd10, 11Cs—YNd15, 11Cs-YNd20, 11Cs—YNd25, 11Cs—YNd30, 11Cs—YNd35, 11Cs—YNd40, 11Cs—YNd45, and 11Cs—YNd50. The concentrations of all of the metal ions of these coating solutions are 1.46 mol/l.

Film formation of superconductors on $LaAlO_3$ monocrystalline substrates was performed by respectively using the coating solutions 11Cs—YNd05, 11Cs—YNd10, 11Cs—YNd15, 11Cs—YNd20, 11Cs-YNd25, 11Cs—YNd30, 11Cs—YNd35, 11Cs—YNd40, 11Cs—YNd45, and 11Cs—YNd50. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 11FS—YNd05 (eleventh experiment, Film of Superconductor, YBCO+NdBCO 05% mixed), 11FS—YNd10, 11FS—YNd15, 11FS—YNd20, 11FS—YNd25, 11FS—YNd30, 11FS—YNd35, 11FS—YNd40, 11FS—YNd45, and 11FS—YNd50 which are superconducting films were obtained.

A Jc measurement using an inductive method was performed. The Jc values (MA/cm$^2$ (77 K and 0 T)) respectively were 7.5, 7.3, 7.4, 7.2, 7.3, 7.0, 6.6, 8.0, 5.6, and 4.9. The samples for which an intensify exceeding 150000 cps at the YBCO (006) peak position in the XRD measurement was recorded were the samples 11FS—YNd05, 11FS—YNd10, 11FS—YNd15, 11FS—YNd20, 11FS—YNd25, and 11FS—YNd30 which are superconducting films. From the height of the Jc value, the intensity of the XRD measurement intensity, etc., it is considered that the samples in which the non-oriented regions 40 are few are the solutions in the case where the NdBCO solution is mixed to be 30% or less. It is considered that the characteristics degrade at a mixing ratio that is less than that of the Sm because a difference occurred because the purity of the NdBCO solution is worse than the purity of the SmBCO solution. In the case where the technology is used to form a film of a NdBCO mixed superconductor, it is considered that a good perovskite structure is obtained if the Nd amount is 30% or less.

(Twelfth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionlzed water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 12MAi (twelfth experiment, Material A with impurity) is obtained. Water and acetic acid which are reaction by-products of the solution synthesis are included in the semi-transparent blue substance 12MAi at about 7 wt %.

Methanol (step Cs-f of FIG. 3A) that corresponds to a weight of about 100 times the obtained semi-transparent blue substance 12MAi is added to the semi-transparent blue substance 12MAi; and the substance 12MAi is dissolved completely. A semi-transparent blue substance 12MA is obtained by placing the solution in the rotary evaporator and again performing the reacting and the refining in the depressurized rotary evaporator for 12 hours. The semi-transparent blue substance 12MA is dissolved in methanol (step Cs-j of FIG. 3A), 1.50 mol/l by metal ion basis of a half coating solution 12hCs—BaCu (twelfth experiment, half coating Solution Ba and Cu) was obtained by diluting using a volumetric flask.

Separately from the description recited above, a half solution that includes Nd is synthesized and refined. Namely, a powder of a Nd(OCOCH$_3$)$_3$ hydrate is dissolved in deionized water. Mixing and stirring with a reaction equimolecular amount of CF$_3$CF$_2$COOH are performed. The obtained mixed solution is placed in an eggplant-shaped flask; reacting and refining are performed in a depressurized rotary evaporator for 12 hours; and a semi-transparent violet substance 12MBi is obtained.

Methanol (step Cs-f of FIG. 3A) that corresponds to a weight of about 100 times the obtained semi-transparent violet substance 12MBi is added to the semi-transparent violet substance 12MBi; and the substance 12MBi is dissolved completely. A semi-transparent violet substance 12MB is obtained by placing the solution in the rotary evaporator and again performing the reacting and the refining in the depressurized rotary evaporator for 12 hours. The semi-transparent violet substance 12MB is dissolved in methanol (step Cs-j of FIG. 3A), 0.80 mol/l by metal ion basis of a half coating solution 12hCs—Nd1 (twelfth experiment, half coating solution for NdBCO step 1) was obtained by diluting using a volumetric flask. A half coating solution 12hCs—Nd2 (same as above, step 2) was obtained by mixing a reaction equimolecular amount of TFA and performing low-pressure refining at 200 hPa without heating after mixing methanol corresponding to 100 times 12hCs—Nd1 by volume into 12hCs—Nd1.

A coating solution 12Cs—Nd2 was obtained by mixing the half coating solution 12hCs—BaCu and the half coating solution 32hCs—Nd2. The metal mole ratio Nd:Ba:Cu is 1:2:3. The concentration of all of the metal ions of the coating solution that is obtained is 1.31 mol/l.

According to the solution flowchart of FIG. 3A, a coating solution for a YBCO superconductor is synthesized and refined. In other words, powders of hydrates of Gd(OCOCH$_3$)$_3$, Ba(OCOCH$_3$)$_2$, and Cu(OCOCH$_3$)$_2$ are used as metallic acetates and dissolved in deionized water. The metal mole ratio Gd:Ba:Cu is 1:2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 12MCi is obtained. Water and acetic acid which are reaction by-products of the solution synthesis are included in the semi-transparent blue substance 12MCi at about 7 wt %.

Methanol (Cs-f of FIG. 3A) that corresponds to a weight of about 100 times the obtained semi-transparent blue substance 12MCi is added to the semi-transparent blue substance 12MCi; and the substance 12MCi is dissolved completely. A semi-transparent blue substance 12MC is obtained by placing the solution in the rotary evaporator and again performing the reacting and the refining in the depressurized rotary evaporator for 12 hours. The semi-transparent blue substance 12MC is dissolved in methanol (step Cs-j of FIG. 3A), 1.50 mol/l by metal ion basis of a coating solution 12Cs—Eu (eighth experiment, Coating Solution for Eu-based superconductor) was obtained by diluting using a volumetric flask, 1.50 mol/l of coating solutions 12Cs—Tb 12Cs—Dy, 12Cs—Ho, 12Cs—Er, 12Cs—Tm, 12Cs—Yb, and 12Cs—Lu were obtained by respectively using Gd, Tb, Dy, Ho, Er, Tm, Yb, and Lu instead of Eu in a similar method.

Coating solutions 12Cs—EuSm (twelfth experiment, Coating solution EuBCO with SmBCO), 12Cs—GdSm, 12Cs—TbSm, 12Cs—DySm, 12Cs—HoSm, 12Cs—ErSm, 12Cs—TmSm, 12Cs—YbSm, and 12Cs—LuSm were obtained by respectively mixing a coating solution 12Cs—Sm into the coating solutions 12Cs—Eu, 12Cs—Gd, 12Cs—Tb, 12Cs—Dy, 12Cs—Ho, 12Cs—Er, 12Cs—Tm, 12Cs—Yb, and 12Cs—Lu. The metal mole ratio (the rare earth (e.g., Eu, Gd, etc.):Sm) is 95:5 for these coating solutions. The concentration of all of the metal ions of the coating solution is 1.47 mol/l.

Film formation of superconductors on LaAlO$_3$ monocrystalline substrates was performed by respectively using the coating solutions 12Cs—EuSm, 12Cs—GdSm, 12Cs—TbSm, 12Cs—DySm, 12Cs—HoSm, 12Cs—ErSm, 12Cs—TmSm, 12Cs—YbSm, and 12Cs—LuSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800 using the profile shown in FIG. 5; annealing was performed in pure oxygen at 525° C.

or less; and samples 12FS—EuSm (twelfth experiment, Film of Superconductor, EuBCO with SmBCO), 12FS—GdSm, 12FS—TbSm, 12FS—DySm, 12FS—HoSm, 12FS—ErSm, 12FS—TmSm, 12FS—YbSm, and 12FS—LuSm which are superconducting films each were obtained.

A Jc measurement using an inductive method was performed. The JC values (MA/cm$^2$ (77 K and 0 T)) of the samples recited above respectively were 6.3, 6.0, 7.1, 6.9, 7.2, 6.8, 6.6, 6.1, and 6.5.

(Thirteenth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionized water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 13MAi (thirteenth experiment, Material A with impurity) is obtained. Water and acetic acid which are reaction by-products of the solution synthesis are included in the semi-transparent blue substance 13MAi at about 7 wt %.

Methanol (step Cs-f of FIG. 3A) that corresponds to a weight of about 100 times the obtained semi-transparent blue substance 13MAi is added to the semi-transparent blue substance 13MAi; and the substance 13MAi is dissolved completely. A semi-transparent blue substance 13MA is obtained by placing the solution in the rotary evaporator and again performing the reacting and the refining in the depressurized rotary evaporator for 12 hours. The semi-transparent blue substance 13MA is dissolved in methanol (step Cs-j of FIG. 3A). 1.50 mol/l by metal ion basis of a half coating solution 13hCs—BaCu (thirteenth experiment, half coating Solution Ba and Cu) was obtained by diluting using a volumetric flask.

Separately from the description recited above, a half solution that includes Nd is synthesized and refined. Namely, a powder of a Nd(OCOCH$_3$)$_3$ hydrate is dissolved in deionized water. Mixing and stirring with a reaction equimolecular amount of CF$_3$CF$_2$COOH are performed. The obtained mixed solution is placed in an eggplant-shaped flask; reacting and refining are performed in a depressurized rotary evaporator for 12 hours; and a semi-transparent violet substance 13MBi is obtained.

Methanol (step Cs-f of FIG. 3A) that corresponds to a weight of about 100 times the obtained semi-transparent violet substance 13MBi is added to the semi-transparent violet substance 13MBi; and the substance 13MBi is dissolved completely. A semi-transparent violet substance 13MB is obtained by placing the solution in the rotary evaporator and again performing the reacting and the refining in the depressurized rotary evaporator for 12 hours. The semi-transparent violet substance 13MB is dissolved in methanol (step Cs-j of FIG. 3A), 0.80 mol/l by metal ion basis of a half coating solution 13hCs—Nd1 (thirteenth experiment, half coating solution for NdBCO step 1) was obtained by diluting using a volumetric flask. A half coating solution 13hCs-Nd2 (same as above, step 2) was obtained by mixing a reaction equimolecular amount of TFA and performing low-pressure refining at 200 hPa without heating after mixing methanol corresponding to 100 times 13hCs—Nd1 by volume into 13hCs—Nd1.

Further, separately from the description recited above, a half solution that includes Sm is synthesized and refined. Namely, a powder of a Sm(OCOCH$_3$)$_3$ hydrate is dissolved in deionized water. Mixing and stirring with a reaction equimolecular amount of CF$_3$CF$_2$COOH are performed. The obtained mixed solution is placed in an eggplant-shaped flask; reacting and refining are performed in a depressurized rotary evaporator for 12 hours; and a semi-transparent yellow substance 13MCi is obtained.

Methanol (step Cs-f of FIG. 3A) that corresponds to a weight of about 100 times the obtained semi-transparent yellow substance 13MCi is added to the semi-transparent yellow substance 13MCi; and the substance 13MCi is dissolved completely. A semi-transparent yellow substance 13MC is obtained by placing the solution in the rotary evaporator and again performing the reacting and the refining in the depressurized rotary evaporator for 12 hours. The semi-transparent yellow substance 13MC is dissolved in methanol (step Cs-j of FIG. 3A), 0.80 mol/l by metal ion basis of a half coating solution 13hCs—Sm1 (thirteenth experiment, half coating solution for SmBCO step 1) was obtained by diluting using a volumetric flask. A half coating solution 13hCs—Sm2 (same as above, step 2) was obtained by mixing a reaction equimolecular amount of TFA and performing low-pressure refining at 200 hPa without heating after mixing methanol corresponding to 100 times 13hCs—Sm1 by volume into 13hCs—Sm1.

A coating solution 13Cs—Nd2 was obtained by mixing the half coating solution 13hCs—BaCu and the half coating solution 13hCs—Nd2. The metal mole ratio Nd:Ba:Cu is 1:2:3. The concentration of all of the metal ions of the coating solution that is obtained is 1.31 mol/l.

A coating solution 13Cs—Sm2 was obtained by mixing the half coating solution 13hCs—BaCu and the half coating solution 13hCs—Sm2. The metal mole ratio Sm:Ba:Cu is 1:2:3. The concentration of all of the metal ions of the coating solution that is obtained is 1.44 mol/l.

A coating solution 13Cs—YNdSm was obtained by mixing the coating solution 1Cs—Y obtained by the method of the first experiment and the coating solutions 13Cs—Nd2 and 13Cs—Sm2 of this preparation. The metal mole ratio Y:Nd:Sm entering superconductor Y sites is 90:5:5 for the obtained coating solution 13Cs—YNdSm. The concentration of all of the metal ions of the coating solution is 1.48 mol/l.

Film formation of a superconductor on a LaAlO$_3$ monocrystalline substrate was performed using the coating solution 13Cs—YNdSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 13FS—YNdSm (thirteenth experiment. Film of Superconductor, YBCO+NdBCO+SmBCO) which is a superconducting film was obtained.

Cross-section TEM observation and EDS mapping analysis of the sample 13FS—YNdSm were performed; and the evaluation of the dispersion condition of the non-oriented region 40 was performed. Cross-section TEM observation at magnifications of 21000 times to 2100000 times was performed. Good observation images having few a/b-axis orientation particles were observed. The non-oriented region ratio Rnb had a maximum of 3.1%.

A Jc measurement using an inductive method of the sample was performed. The Jc value was 7.2 MA/cm$^2$ (77 K and 0 T).

(Fourteenth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionized water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 14MAi (fourteenth experiment. Material A with impurity) is obtained. Water and acetic acid which are reaction by-products of the solution synthesis are included in the semi-transparent blue substance 14MAi at about 7 wt %.

Methanol (step Cs-f of FIG. 3A) that corresponds to a weight of about 100 times the obtained semi-transparent blue substance 14MAi is added to the semi-transparent blue substance 14MAi; and the substance 14MAi is dissolved completely. A semi-transparent blue substance 14MA is obtained by placing the solution in the rotary evaporator and again performing the reacting and the refining in the depressurized rotary evaporator for 12 hours. The semi-transparent blue substance 14MA is dissolved in methanol (step Cs-j of FIG. 3A). 1.50 mol/l by metal ion basis of a half coating solution 14hCs—BaCu (fourteenth experiment, half coating Solution Ba and Cu) was obtained by diluting using a volumetric flask.

Separately from the description recited above, a half solution that includes Nd is synthesized and refined. Namely, a powder of a Nd(OCOCH$_3$)$_3$ hydrate is dissolved in deionlzed water. Mixing and stirring with a reaction equimolecular amount of CF$_3$CF$_2$COOH are performed. The obtained mixed solution is placed in an eggplant-shaped flask; reacting and refining are performed in a depressurized rotary evaporator for 12 hours; and a semi-transparent violet substance 14MBi is obtained.

Methanol (step Cs-f of FIG. 3A) that corresponds to a weight of about 100 times the obtained semi-transparent violet substance 14MBi is added to the semi-transparent violet substance 14MBi; and the substance 14MBi is dissolved completely. A semi-transparent violet substance 14MB is obtained by placing the solution in the rotary evaporator and again performing the reacting and the refining in the depressurized rotary evaporator for 12 hours. The semi-transparent violet substance 14MB is dissolved in methanol (step Cs-j of FIG. 3A), 0.80 mol/l by metal ion basis of a half coating solution 14hCs—Nd1 (fourteenth experiment, half coating solution for NdBCO step 1) was obtained by diluting using a volumetric flask. A half coating solution 14hCs—Nd2 (same as above, step 2) was obtained by mixing a reaction equimolecular amount of TFA and performing low-pressure refining at 200 hPa without heating after mixing methanol corresponding to 100 times 14hCs—Nd1 by volume into 14hCs—Nd1.

Further, separately from the description recited above, a half solution that includes Sm is synthesized and refined. Namely, a powder of a Sm(OCOCH$_3$)$_3$ hydrate is dissolved in deionlzed water. Mixing and stirring with a reaction equimolecular amount of CF$_3$CF$_2$COOH are performed. The obtained mixed solution is placed in an eggplant-shaped flask; reacting and refining are performed in a depressurized rotary evaporator for 12 hours; and a semi-transparent yellow substance 14MCi is obtained.

Methanol (step Cs-f of FIG. 3A) that corresponds to a weight of about 100 times the obtained semi-transparent yellow substance 14MCi is added to the semi-transparent yellow substance 14MCi; and the substance 14MCi is dissolved completely. A semi-transparent yellow substance 14MC is obtained by placing the solution in the rotary evaporator and again performing the reacting and the refining in the depressurized rotary evaporator for 12 hours. The semi-transparent yellow substance 14 MC is dissolved in methanol (step Cs-j of FIG. 3A), 0.80 mol/l by metal ion basis of a half coating solution 14hCs—Sm1 (fourteenth experiment, half coating solution for SmBCO step 1) was obtained by diluting using a volumetric flask. A half coating solution 14hCs—Sm2 (same as above, step 2) was obtained by mixing a reaction equimolecular amount of TFA and performing low-pressure refining at 200 hPa without heating after mixing methanol corresponding to 100 times 14hCs-Sm1 by volume into 14hCs—Sm1.

A coating solution 14Cs—Nd2 was obtained by mixing the half coating solution 14hCs—BaCu and the half coating solution 14hCs—Nd2. The metal mole ratio Nd:Ba:Cu is 1:2:3. The concentration of all of the metal ions of the coating solution that is obtained is 1.31 mol/l.

A coating solution 14Cs—Sm2 was obtained by mixing the half coating solution 14hCs—BaCu and the half coating solution 14hCs—Sm2. The metal mole ratio Sm:Ba:Cu is 1:2:3. The concentration of all of the metal ions of the coating solution that is obtained is 1.44 mol/l.

According to the solution flowchart of FIG. 3A, a coating solution for a YBCO superconductor is synthesized and refined. Namely, powders of hydrates of Eu(OCOCH$_3$)$_3$, Ba(OCOCH$_3$)$_2$, and Cu(OCOCH$_3$)$_2$ as metallic acetates are dissolved in deionized water. The metal mole ratio Eu:Ba:Cu is 1:2:3 for each of the hydrates. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and the semi-transparent blue substance 8MCi is obtained. Water and acetic acid which are reaction by-products of the solution synthesis are included in a semi-transparent blue substance 14MDi at about 7 wt %.

Methanol (step Cs-f of FIG. 3A) that corresponds to a weight of about 100 times the obtained semi-transparent blue substance 14MDi is added to the semi-transparent blue substance 14MDi; and the substance 14MDi is dissolved completely. A semi-transparent blue substance 14MD is obtained by placing the solution in the rotary evaporator and again performing the reacting and the refining in the depressurized rotary evaporator for 12 hours. The semi-transparent blue substance 8MC is dissolved in methanol (step Cs-j of FIG. 3A), 1.50 mol/l by metal ion basis of a coating solution 14Cs—Eu (eighth experiment, Coating Solution for Eu-based superconductor) was obtained by diluting using a volumetric flask. Coating solutions 14Cs—Gd, 14Cs—Tb, 14Cs—Dy, 14Cs—Ho, 14Cs—Er, 14Cs—Tm, 14Cs—Yb, and 14Cs—Lu were obtained by respectively using Gd, Tb, Dy, Ho, Br, Tm, Yb, and Lu instead of Eu in a similar method. The concentrations of all of the metal ions of these solutions are 1.50 mol/l.

Coating solutions 14Cs—EuNdSm (fourteenth experiment, Coating solution EuBCO with NdBCO and SmBCO), 14Cs—GdNdSm, 14Cs—TbNdSm, 14Cs—DyNdSm, 14Cs—HoNdSm, 14Cs—ErNdSm, 14Cs—TmNdSm, 14Cs—YbNdSm, and 14Cs—LuNdSm were obtained by respectively mixing coating solutions 14Cs—Nd and 14Cs—Sm with the coating solutions 14CS—Eu, 14Cs—Gd, 14Cs—Tb, 14Cs—Dy, 14Cs—Ho, 14Cs—Er, 14Cs—Tm, 14Cs—Yb, and 14Cs—Lu. The metal mole ratio (the rare earth (e.g., Eu, Gd, etc.):Nd;Sm) is 90:5:5 for these coating solutions. The concentrations of all of the metal ions of these coating solutions are 1.47 mol/l.

Film formation of superconductors on LaAlO$_3$ monocrystalline substrates was performed by respectively using the coating solutions 14Cs—EuNdSm, 14Cs-GdNdSm, 14Cs—TbNdSm, 14Cs—DyNdSm, 14Cs—HoNdSm, 14Cs—ErNdSm, 14Cs—TmNdSm, 14Cs—YbNdSm, and 14Cs—LuNdSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 14FS—EuNdSm (fourteenth experiment, Film of Superconductor, EuBCO with NdBCO, SmBCO), 14FS—GdNdSm, 14FS—TbNdSm, 14FS—DyNdSm, 14FS—HoNdSm, 14FS—ErNdSm, 14FS—TmNdSm, 14FS—YbNdSm, and 14FS—LuSm which are superconducting films each were obtained.

A Jc measurement using an inductive method was performed. The Jc values (MA/cm$^2$ (77 K and 0 T)) of these samples respectively were 6.5, 6.4, 7.2, 7.3, 7.3, 7.1. 7.2, 6.8, and 8.6.

(Fifteenth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionized water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance i5MAi (fifteenth experiment, Material A with impurity) is obtained. Water and acetic acid which are reaction by-products of the solution synthesis are included in the semi-transparent blue substance 15MAi at about 7 wt %.

Methanol (step Cs-f of FIG. 3A) that corresponds to a weight of about 100 times the obtained semi-transparent blue substance 15MAi is added to the semi-transparent blue substance 15MAi; and the substance 15MAi is dissolved completely. A semi-transparent blue substance 15MA is obtained by placing the solution in the rotary evaporator and again performing the reacting and the refining in the depressurized rotary evaporator for 12 hours. The semi-transparent blue substance 15MA is dissolved in methanol (step Cs-j of FIG. BA).

1.50 mol/l by metal ion basis of a half coating solution 15hCs—BaCu (fifteenth experiment, half coating Solution Ba and Cu) was obtained by diluting using a volumetric flask.

Separately from the description recited above, a half solution that includes Sm is synthesized and refined. Namely, a powder of a hydrate of Sm(OCOCH$_3$)$_3$ is dissolved in deionized water. Mixing and stirring with a reaction equimolecular amount of CF$_3$CF$_2$COOH are performed; the obtained mixed solution is placed in an eggplant-shaped flask; reacting and refining are performed in a depressurized rotary evaporator for 12 hours; and a semi-transparent yellow substance 15MBi is obtained.

Methanol (step Cs-f of FIG. 3A) that corresponds to a weight of about 100 times the obtained semi-transparent yellow substance 15MBi is added to the semi-transparent yellow substance 15MBi; and the substance 15MBi is dissolved completely. A semi-transparent yellow substance 15MB is obtained by placing the solution in the rotary evaporator and again performing the reacting and the refining in the depressurized rotary evaporator for 12 hours. The semi-transparent yellow substance 15MB is dissolved in methanol (step Cs-j of FIG. 3A). 1.20 mol/l by metal ion basis of a half coating solution 15hCs—Sm1 (fifteenth experiment, half coating solution for SmBCO step 1) was obtained by diluting using a volumetric flask. A half coating solution 15hCs—Sm2 (same as above, step 2) was obtained by mixing a reaction equimolecular amount of TFA and performing low-pressure refining at 200 hPa without heating after mixing methanol corresponding to 100 times 15hCs—Sm1 by volume into 15hCs—Sm1.

A coating solution 15Cs—Sm was prepared by mixing the half coating solution 15hCs—BaCu and the half coating solution 15hCs—Sm2. The metal mole ratio Sm:Ba:Cu is 1:2:3. The concentration of all of the metal ions of the coating solution that is obtained is 1.33 mol/l.

A solution 15Cs—YSm is obtained by mixing the coating solution 1Cs—Y obtained by the method of the first experiment and a coating solution 15Cs—Sm2 of this preparation. The metal mole ratio Y:Sm is 95:5. The concentration of all of the metal ions of the coating solution is 1.48 mol/l.

The base member 15 is prepared- The base member 15 includes a YSZ monocrystalline substrate (corresponding to the substrate 10), and an oriented CeO$_2$ layer (included in the foundation layer 11). The oriented CeO$_2$ layer is formed on the YSZ monocrystalline substrate. The thickness of the oriented CeO$_2$ layer is 100 nm. The base member 15 is recited as "CeO$_2$/YSZ."

Film formation of a superconductor on the CeO$_2$/YSZ was performed using the coating solution 15Cs—YSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 15FS—YSm (fifteenth experiment, Film of Superconductor, YBCO+SmBCO) which is a superconducting film was obtained.

The Jc value of the sample was 7.3 MA/cm$^2$ (77 K and 0 T) and had a good numerical value. If the base member has lattice matching, e.g., even for LaAlO$_3$, similar characteristics are obtained.

(Sixteenth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionized water. The metal mole ratio Ba:Cu is 2;3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 16MAi (sixteenth experiment, Material A with impurity) is obtained. Wafer and acetic acid which are reaction by-products of the solution synthesis are included in the semi-transparent blue substance 16MAi at about 7 wt %.

Methanol (step Cs-f of FIG. 3A) that corresponds to a weight of about 100 times the obtained semi-transparent blue substance 16MAi is added to the semi-transparent blue substance 16MAi; and the substance 16MAi is dissolved completely. A semi-transparent blue substance 16MA is obtained by placing the solution in the rotary evaporator and again performing the reacting and the refining in the depressurized rotary evaporator for 12 hours. The semi-transparent blue substance 16MA is dissolved in methanol (step Cs-j of FIG. 3A). 1.50 mol/l by metal ion basis of a half coating solution 16hCs—BaCu (sixteenth experiment, half coating Solution Ba and Cu) was obtained by diluting using a volumetric flask.

Separately from the description recited above, a half solution that includes Nd is synthesized and refined. Namely, a powder of a hydrate of Nd(OCOCH$_3$)$_2$ is dissolved in deionized water. Mixing and stirring with a reaction equimolecular amount of CF$_3$CF$_2$COOH are performed; the obtained mixed solution is placed in an eggplant-shaped flask; reacting and refining are performed in a depressurized rotary evaporator for 12 hours; and a semi-transparent yellow substance 16MBi is obtained.

Methanol (step Cs-f of FIG. 3A) that corresponds to a weight of about 100 times the obtained semi-transparent yellow substance 16MBi is added to the semi-transparent yellow substance 16MBi; and the substance 16MBi is dissolved completely. A semi-transparent yellow substance 16MB is obtained by placing the solution in the rotary evaporator and again performing the reacting and the refining in the depressurized rotary evaporator for 12 hours. The semi-transparent yellow substance 16MB is dissolved in methanol (step Cs-j of FIG. 3A), 0.80 mol/l by metal ion basis of a half coating solution 16hCs—Nd1 (sixteenth experiment, half coating solution for NdBCO step 1) was obtained by diluting using a volumetric flask. A half coating solution 16hCs—Nd2 (same as above, step 2) was obtained by mixing a reaction equimolecular amount of TFA and performing low-pressure refining at 200 hPa without heating after mixing methanol corresponding to 100 times 16hCs—Nd1 by volume into 16hCs—Nd1.

A coating solution 16Cs—Nd was prepared by mixing the half coating solution 16hCs—BaCu and the half coating solution 16hCs—Nd2 so that Nd:Ba:Cu=1:2:3. The concentration of all of the metal ions of the coating solution that is obtained is 1.31 mol/l.

A solution 16Cs—YNd is obtained by mixing the coating solution 1Cs—Y obtained by the method of the first experiment and a coating solution 16Cs—Nd2 of this preparation. The metal mole ratio Y:Nd is 95:5. The concentration of all of the metal ions of the coating solution is 1.48 mol/l.

Film formation of a superconductor on CeO$_2$/YSZ was performed using the coating solution 16Cs—YNd. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 16FS—YNd (sixteenth experiment. Film of Superconductor, YBCO+NdBCO) which is a superconducting film was obtained.

The Jc value of the sample was 6.8 MA/cm$^2$ (77 K and 0 T) and had a good numerical value. Similarly to the SmBCO, it was found that better characteristics are obtained by the technology if used on a base member having lattice matching.

(Seventeenth Experiment)

According to the solution flowchart of FIG. 3A, a coating solution for a YBCO superconductor is synthesized and refined. Namely, powders of hydrates of Ba(OCOCH$_3$)$_2$ and Cu(OCOCH$_3$)$_2$ are dissolved in deionized water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 17MAi (seventeenth experiment, Material A with impurity) is obtained. Water and acetic acid which are reaction by-products of the solution synthesis are included in the semi-transparent blue substance 17MAi at about 7 wt %.

Methanol (step Cs-f of FIG. 3A) that corresponds to a weight of about 100 times the obtained semi-transparent, blue substance 17MAi is added to the semi-transparent blue substance 17MAi; and the substance 17MAi is dissolved completely. A semi-transparent blue substance 17MA is obtained by placing the solution in the rotary evaporator and again performing the reacting and the refining in the depressurized rotary evaporator for 12 hours. The semi-transparent blue substance 17MA is dissolved in methanol (step Cs-j of FIG. 3A). 1.50 mol/l by metal ion basis of a half coating solution 17hCs—BaCu (seventeenth experiment, half coating Solution Sa and Cu) was obtained by diluting using a volumetric flask.

Separately from the description recited above, a half solution that includes Sm is synthesized and refined. Namely, a powder of a hydrate of Sm(OCOCH$_3$)$_3$ is dissolved in deionized water. Mixing and stirring with a reaction equimolecular amount of CF$_3$CF$_2$COOH are performed; the obtained mixed solution is placed in an eggplant-shaped flask; reacting and refining are performed in a depressurized rotary evaporator for 12 hours; and a semi-transparent yellow substance 17MBi is obtained.

Methanol (step Cs-f of FIG. 3A) that corresponds to a weight of about 100 times the obtained semi-transparent yellow substance 17MBi is added to the semi-transparent yellow substance 17MBi; and the substance 17MBi is dissolved completely. A semi-transparent yellow substance 17MB is obtained by placing the solution in the rotary evaporator and again performing the reacting and the refining in the depressurized rotary evaporator for 12 hours. The semi-transparent yellow substance 17MB is dissolved in methanol (step Cs-j of FIG. 3A). 1.20 mol/l by metal ion basis of a half coating solution 17hCs—Sm1 (seventeenth experimental example, half coating solution for SmBCO step 1) was obtained by diluting using a volumetric flask. A half coating solution 17hCs—Sm2 (same as above, step 2) was obtained by mixing a reaction equimolecular amount of TFA and performing low-pressure refining at 200 hPa without, heating after mixing methanol corresponding to 100 times 17hCs—Sm1 by volume into 17hCs—Sm1.

A coating solution 17Cs—Sm was prepared by mixing the half coating solution 17hCs—BaCu and the half coating solution 17hCs—Sm2 so that Sm:Ba:Cu=1:2:3. The concentration of all of the metal ions of the coating solution that is obtained is 1.33 mol/l.

A solution 17Cs—YSm is obtained by mixing the coating solution 1Cs—Y obtained by the method of the first experiment and a coating solution 17Cs—Sm2 of this preparation. The metal mole ratio Y:Sm is 95:5. The concentration of all of the metal ions of the coating solution is 1.48 mol/l.

Film formation of a superconductor on a rolling-oriented Ni substrate (herein below, recited as the CeO$_2$/YSZ/Y$_2$O$_3$/Ni) in which an oriented intermediate layer (a CeO$_2$ layer having a thickness of 100 nm/a YSZ layer having a thickness of 250 nm/a Y$_2$O$_3$ layer having a thickness of 100 nm) is formed was performed using the coating solution 17Cs—YSm. The film formation was performed using spin coating at a maximum rotation speed of 4000 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and a sample 17FS—YSm (seventeenth experiment, Film of Superconductor, YBCO+SmBCO) which is a superconducting film was obtained.

The Jc value of the sample was 1.2 MA/cm$^2$ (77 K and 0 T). The characteristics are smaller than those of a monocrystalline substrate because Δϕ that indicates the in-plane orientation property of the Ni oriented layer is 7.0 degrees; and the of the $CeO_2$ layer of the uppermost portion is slightly improved and is 6.8 degrees. It is considered that the Jc value reflects the amount that characteristics degrade due to such effects; and the results substantially reflect the results on the monocrystalline substrate. The thickness of the superconductor according to an ICP measurement was 150 nm and was the same as the thickness calculated from the solution viscosity.

(Eighteenth Experiment)

According to the solution flowchart of FIG. 3A, a coating solution for a YBCO superconductor is synthesized and refined. Namely, powders of hydrates of $Ba(OCOCH_3)_2$ and $Cu(OCOCH_3)_2$ are dissolved in deionized water. The metal mole ratio Ba:Cu is 2:3. Mixing and stirring with a reaction equimolecular amount of $CF_3COOH$ are performed; the obtained mixed solution is placed in an eggplant-shaped flask; reacting and refining are performed in a depressurized rotary evaporator for 12 hours; and a semi-transparent blue substance 18MAi (eighteenth experiment, Material A with impurity) is obtained. Water and acetic acid which are reaction by-products of the solution synthesis are included in the semi-transparent blue substance 18MAi at about 7 wt %.

Methanol (step Cs-f of FIG. 3A) that corresponds to a weight of about 100 times the obtained semi-transparent blue substance 18MAi is added to the semi-transparent blue substance 18MAi; and the substance 18MAi is dissolved completely. A semi-transparent blue substance 18MA is obtained by placing the solution in the rotary evaporator and again performing the reacting and the refining in the depressurized rotary evaporator for 12 hours. The semi-transparent blue substance 18MA is dissolved in methanol (step Cs-j of FIG. 3A). 1.50 mol/l by metal ion basis of a half coating solution 18hCs—BaCu (eighteenth experiment, half coating Solution Ba and Cu) was obtained by diluting using a volumetric flask.

Separately from the description recited above, a half solution that includes Sm is synthesized and refined. Namely, a powder of a hydrate of $Sm(OCOCH_3)_3$ is dissolved in deionlzed water. Mixing and stirring with a reaction equimolecular amount of $CF_3CF_2COOH$ are performed; the obtained mixed solution is placed in an eggplant-shaped flask; reacting and refining are performed in a depressurized rotary evaporator for 12 hours; and a semi-transparent yellow substance 18MBi is obtained.

Methanol (step Cs-f of FIG. 3A) that corresponds to a weight of about 100 times the obtained semi-transparent yellow substance 18MBi is added to the semi-transparent yellow substance 18MBi; and the substance 18MBi is dissolved completely. A semi-transparent yellow substance 18MB is obtained by placing the solution in the rotary evaporator and again performing the reacting and the refining in the depressurized rotary evaporator for 12 hours. The semi-transparent yellow substance 18MB is dissolved in methanol (step Cs-j of FIG. 3A). 1.20 mol/l by metal ion basis of a half coating solution 18hCs—Sm1 (eighteenth experiment, half coating solution for SmBCO step 1) was obtained by diluting using a volumetric flask. A half coating solution 18hCs—Sm2 (same as above, step 2) was obtained by mixing a reaction equimolecular amount of TFA and performing low-pressure refining at 200 hPa without heating after mixing methanol corresponding to 100 times 18hCs—Sm1 by volume into 18hCs—Sm1.

A coating solution 18Cs—Sm1 was prepared by mixing the half coating solution 18hCs—BaCu and the half coating solution 18hCs—Sm1 so that Sm:Ba:Cu=1:2:3. Similarly, a coating solution 18Cs—Sm2 was prepared by mixing the half coating solution 18hCs—BaCu and the half coating solution 18hCs—Sm2 so that Sm:Ba:Cu=1:2:3. The concentration of all of the metal ions of the coating solution that is obtained for each is 1.33 mol/l.

Solutions 18Cs—YSm1 (eighteenth experiment, Coating solution for YBCO+SmBCO, No. 1) and 18Cs—YSm2 are obtained by mixing the coating solution 1Cs—Y obtained by the method of the first experiment and the coating solution 18Cs—Sm1 of this preparation. The metal mole ratios Y:Sm of these solutions respectively are 95:5 and 35:15. The concentrations of all of the metal ions of the coating solutions respectively are 1.49 and 1.47 mol/l. A solution 13Cs—YSm3 is obtained by mixing the coating solution 1Cs—Y and the coating solutions 18Cs—Sm1 and 18Cs—Sm2 of this preparation. For the solution, 1Cs—Y:18Cs—Sm1: 18Cs—Sm2 is 90:5:5. The concentration of all of the metal ions of the coating solution 18Cs—YSm3 is 1.48 mol/l. Solutions 18Cs—YSm4, 18Cs—YSm5, 18Cs—YSm6, and 18Cs—YSm7 are obtained by mixing the coating solution 1Cs—Y and the coating solution 18Cs—Sm2 of this preparation. The metal mole ratios Y:Sm of the solutions 18Cs—YSm4, 18Cs—YSm5, 18Cs—YSm6, and 18Cs—YSm7 respectively are 95:5, 85:15, 70:30, and 65:35. The concentrations of all of the metal ions of these coating solutions respectively are 1.49, 1.47, 1.44, and 1.43 mol/l.

Film formation of superconductors on $LaAlO_3$ monocrystalline substrates was performed by respectively using the coating solutions 18Cs—YSm1, 18Cs—YSm2, 18Cs—YSm3, 18Cs—YSm4, 18Cs—YSm5, 18Cs—YSm6, and 18Cs—YSm7. The film formation was performed using spin coating respectively at maximum rotation speeds of 2000 rpm, 1900 rpm, 1900 rpm, 2000 rpm, 1900 rpm, 1800 rpm, and 1750 rpm; a pre-bake was performed in a pure oxygen atmosphere at 400 using the profile shown in FIG. 4; a main bake was performed in 1000 ppm of oxygen-mixed argon gas at 800° C. using the profile shown in FIG. 5; annealing was performed in pure oxygen at 525° C. or less; and samples 18FS—YSm1 (eighteenth experiment, Film of Superconductor, YBCO+SmBCO, No. 1), 18FS—YSm2, 18FS—YSm3, 18FS—YSm4, 18FS—YSm5, 18FS—YSm6, and 18FS—YSm7 which are superconducting films were obtained. It is considered that the thicknesses of these samples each are 220 nm.

For each of the samples, the Jc value which is a superconducting characteristic was measured in liquid nitrogen (77 K and 0 T) using an inductive method. The Jc values of the sample are shown in Table 4. Further, the non-oriented region ratio Rnb (NL/BL) was determined by using the method described in reference to the third experiment. The non-oriented region ratio Rnb (NL/BL) was calculated by setting the reference length BL of 2 μm in a cross-section TEM observation image of 210000 times. The results also are shown in Table 4.

TABLE 4

|  | NL/BL (%) | Jc (77K, 0T) (MA/cm$^2$) |
| --- | --- | --- |
| 18Sc-YSm1 | 38.1 | 1.5 |
| 18Sc-YSm2 | 46.0 | 1.3 |
| 18Sc-YSm3 | 28.7 | 2.4 |
| 18Sc-YSm4 | 5.0 | 7.3 |
| 18Sc-YSm5 | 8.1 | 6.9 |
| 18Sc-YSm6 | 12.3 | 6.3 |
| 18Sc-YSm7 | 14.7 | 5.7 |
| 19Sc-YNd1 | 39.2 | 0.9 |
| 19Sc-YNd2 | 43.3 | 0.5 |

TABLE 4-continued

| | NL/BL (%) | Jc (77K, 0T) (MA/cm$^2$) |
|---|---|---|
| 19Sc-YNd3 | 7.2 | 5.8 |
| 19Sc-YNd4 | 11.8 | 5.3 |

For the sample 18FS—YSm7, the non-oriented region ratio Rnb is about 15% (14.7%). Also, for the sample 18FS—YSm7, the Jc value is 5.7 MA/cm$^2$ (77 K and 0 T) and is high.

The Jc value is high for samples 18Sc—YSm4, 18Sc—YSm5, etc. It is considered that the Jc value is low for the samples 18FS—YSm1 and 18FS—YSm2 because the thicknesses of these samples are 220 nm; and the Jc value decreases due to the upper portion being greatly affected by the non-oriented region 40 existing in the interior. It is considered that the characteristics of the sample 18Cs—YSm3 are low because the Sm-PFP, which is a cause of segregating, exists in the solution and is not replaced easily with the TFA around the Sm-PFP.

A low Jc value is obtained easily even for a thickness of 220 nm if the non-oriented region 40 is suppressed. When the non-oriented region 40 exists, it is considered that the effects of the non-oriented region 40 are large for a thickness of 220 nm.

Figure 15:
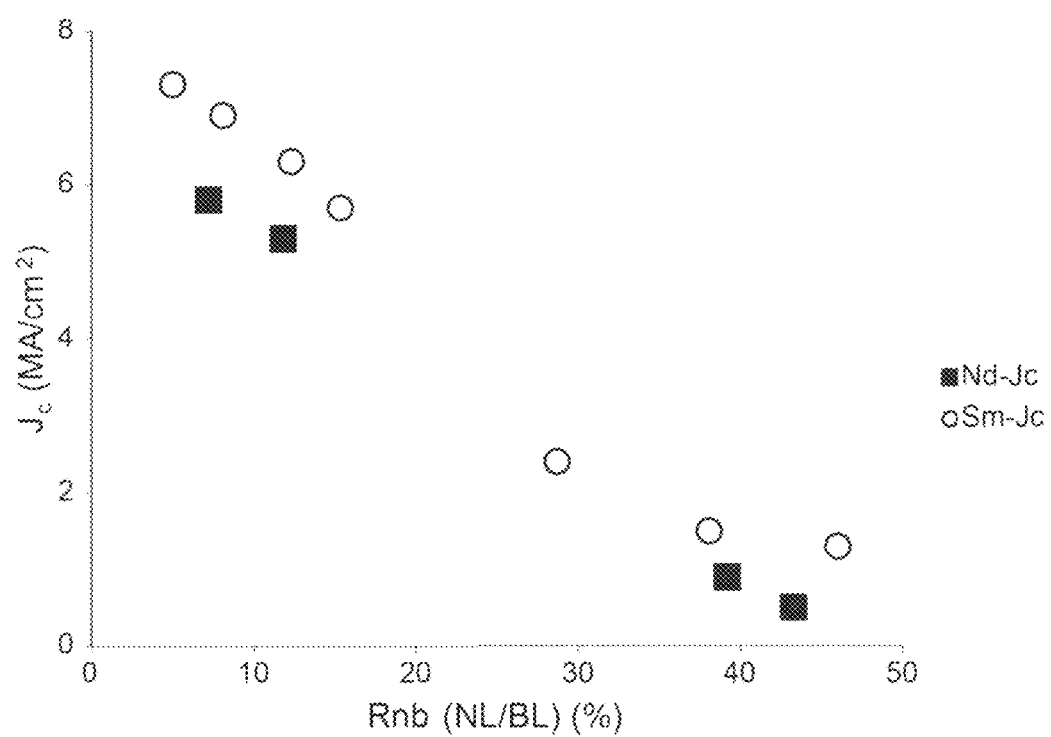
FIG. 15 is a graph showing characteristics of the superconductor.

FIG. 15 is a graph showing characteristics of the superconductor.

FIG. 15 shows the relationship between the non-oriented region ratio Rnb (%) and the Jc value. FIG. 15 shows the relationship of NL/BL and the characteristics for the sample shown in Table 4 recited above. The horizontal axis of FIG. 15 is the non-oriented region ratio Rnb (i.e., NL/BL). The vertical axis is the Jc value (MA/cm$^2$, 77 K, 0 T).

As shown in FIG. 15, a high Jc value is obtained when the non-oriented region ratio Rnb is 15% or less (e.g., less than 15%), A higher Jc value is obtained when the non-oriented region ratio Rnb is 12.3% or less. A higher Jc value is obtained when the non-oriented region ratio Rnb is 11.8% or less. A higher Jc value is obtained when the non-oriented region ratio Rnb is 81.% or less. An even higher Jc value is obtained when the non-oriented region ratio Rnb is 7.2% or less. For the technology of the reference example, etc., the non-oriented region ratio Rnb is 38% or more.

A high Jc value is obtained stably in the region where the non-oriented region ratio Rnb (NL/BL) is 15% or less. The thicknesses of these samples are about 220 nm. There is a strong relationship between the high Jc value being obtained and the non-oriented region 40 of the interior being suppressed for such a thickness.

(Nineteenth Experiment)

According to the solution flowchart of FIG. 3A, a coating solution for a YBCO superconductor is synthesized and refined. Namely, powders of hydrates of Ba(OCOH$_3$)$_2$ and Cu(OCOCH$_3$)$_2$ are dissolved in deionized water. The metal mole ratio Ba:Cu is 2:3. Mixing and stirring with a reaction equimolecular amount of CF$_3$COOH are performed; the obtained mixed solution is placed in an eggplant-shaped flask; reacting and refining are performed in a depressurized rotary evaporator for 12 hours; and a semi-transparent blue substance 19MAi (nineteenth experiment. Material A with impurity) is obtained. Water and acetic acid which are reaction by-products of the solution synthesis are included in the semi-transparent blue substance 19MAi at about 7 wt %.

Methanol (step Cs-f of FIG. 3A) that corresponds to a weight of about 100 times the obtained semi-transparent blue substance 19MAi is added to the semi-transparent blue substance 19MAi; and the substance 19MAi is dissolved completely. A semi-transparent blue substance 19 MA is obtained by placing the solution in the rotary evaporator and again performing the reacting and the refining in the depressurized rotary evaporator for 12 hours. The semi-transparent blue substance 19MA is dissolved in methanol (step Cs-j of FIG. 3A). 1.50 mol/l by metal ion basis of a half coating solution 19hCs—BaCu (nineteenth experiment, half coating Solution Ba and Cu) was obtained by diluting using a volumetric flask.

Separately from the description recited above, a half solution that includes Nd is synthesized and refined. Namely, a powder of a hydrate of Nd(OCOCH$_3$)$_3$ is dissolved in deionized water. Mixing and stirring with a reaction equimolecular amount of CF$_3$CF$_2$COOH are performed; the obtained mixed solution is placed in an egg plant-shaped flask; reacting and refining are performed in a depressurized rotary evaporator for 12 hours; and a semi-transparent violet substance 19MBi is obtained.

Methanol (step Cs-f of FIG. 3A) that corresponds to a weight of about 100 times the obtained semi-transparent violet substance 19MBi is added to the semi-transparent violet substance 19MBi; and the substance 19MBi is dissolved completely. A semi-transparent yellow substance 19MB is obtained by placing the solution in the rotary evaporator and again performing the reacting and the refining in the depressurized rotary evaporator for 12 hours. The semi-transparent yellow substance 19MB is dissolved in methanol (step Cs-j of FIG. 3A). 0.80 mol/l by metal ion basis of a half coating solution 19hCs—Nd1 (nineteenth experiment, half coating solution for NdBCO step 1) was obtained by diluting using a volumetric flask. A half coating solution 19hCs—Nd2 (same as above, step 2) was obtained by mixing a reaction equimolecular amount of TFA and performing low-pressure refining at 200 hPa without heating after mixing methanol corresponding to 100 times 19hCs—Nd1 by volume into 19hCs—Nd1.

A coating solution 19Cs—Nd1 was prepared by mixing the half coating solution 19hCs—BaCu and the half coating solution 19hCs—Nd1. Nd:Ba:Cu is 1:2:3. A coating solution 19Cs—Nd2 was prepared by mixing the half coating solution 19hCs—BaCu and the half coating solution 19hCs—Nd2. Nd:Ba:Cu is 1:2:3. The concentrations of all of the metal ions of these coating solutions each are 1.31 mol/l.

Solutions 19Cs—YNd1 (nineteenth experiment, Coating solution for YBCO+NdBCO, No. 1) and 19Cs—YMd2 are obtained by mixing the coating solution 1Cs—Y obtained by the method of the first experiment and the coating solution 19Cs—Nd1 of this preparation. The metal mole ratios Y:Nd of the solutions 19Cs—YNd1 and 19Cs—YNd2 respectively are 95:5 and 85:15. The concentrations of all of the metal ions of these coating solutions respectively are 1.49 and 1.47 mol/l. Solutions 19Cs—YNd3 and 19Cs—YNd4 are obtained by mixing the coating solution 1Cs—Y and the coating solution 19Cs—Nd2 of this preparation. The metal ion concentrations Y:Nd of the solutions 19Cs—YNd3 and 19Cs—YNd4 respectively are 95:5 and 85:15. The concentrations of all of the metal ions of these coating solutions respectively are 1.49 and 1.47 mol/l.

Film formation of superconductors on LaAlO$_3$ monocrystalline substrates was performed by respectively using the coating solutions 19Cs—YNd1, 19Cs—YNd2, 19Cs—YNd3, and 19Cs—YMd4. The film formation was performed using spin coating respectively at maximum rotation speeds of 2000 rpm, 1900 rpm, 2000 rpm, and 1900 rpm; a pre-bake was performed in a pure oxygen atmosphere at 400° C. using the profile shown in FIG. 4; a main bake was performed in 1000 ppm of oxygen-mixed argon gas at 800° C. using the profile shown in FIG. 5; annealing was performed in pure oxygen at 525° C. or less; and samples 19FS—YNd1 (nineteenth experiment, Film of Superconductor, YBCO+NdBCO, No. 1), 19FS—YNd2, 19FS—YNd3, and 19FS—YNd4 which are superconducting films were obtained. It is considered that the thicknesses of these samples each are 220 nm.

For each of the samples, the Jc value which is a superconducting characteristic was measured in liquid nitrogen (77 K and 0 T) by using an inductive method. The Jc values of the samples are shown in Table 4 recited above. The non-oriented region ratio Rnb (NL/BL) was determined using the method described in reference to the third experiment. The non-oriented region ratio Rnb (NL/BL) was calculated by setting the reference length BL of 2 µm in a cross-section TEM observation image of 210000 times. The results also are shown in Table 4 recited above. In other words, Table 4 shows the Jc value and NL/BL (Rnb) of the superconductors obtained from solutions including Y+Sm and Y+Nd.

It is considered that the Jc values of samples 19FS—YNd1r and 19FS—YNd2 are low because the thickness of the superconducting layer of these samples is 220 nm; the non-oriented region 40 exists; and effects due to the non-oriented region 40 occur. Comparing samples 18Sc-YSm6 and 19FS—YNd4 that have substantially the same NL/BL values, the Jc value of the sample 19Sc—YNd4 which is YBCO+NdBCO is lower than the Jc value of the sample 18Sc—YSm6. It is considered that the Jc value of the superconductor in the case where NdBCO is mixed into YBCO is lower than the Jc value of the superconductor in the case where SmBCO is mixed into YBCO because the quality of the NdBCO solution is low. The atomic radius of Nd is large; and Nd easily causes chemical reactions. Therefore, esterification which is a decomposition reaction occurs easily. It is considered that the purity of the Nd-based solution thereby becomes lower than the purity of the Sm-based solution.

These results are added to FIG. 15.

By suppressing the non-oriented region 40, a high Jc value is obtained easily even for a thickness of 220 nm. Similarly to that described in reference to Sm, the Jc value is drastically improved so that the non-oriented region ratio Rnb is 15% or less.

It is apparent: from the results of the eighteenth experiment and the nineteenth experiment as well that effects are greatly realized in the embodiment for particularly thick superconductors in the case where at least one of SmBCO or NdBCO is included. The effects of the PFP which is a cause of the non-oriented region 40 can be suppressed by replacing with TFA. Thereby, the segregation of at least one of the Sm component or the Nd component can be suppressed. According to the embodiment, a non-oriented region proportion of 15% or less is obtained for the superconducting layers that are thicker than 220 nm. According to the embodiment, good characteristics are obtained for the superconductors that include at least one of Sm or Nd. The embodiment will lead to applications in power transmission cables.

According to the embodiment, for example, a superconductor having high characteristics can be provided in which at least one of Sm or Nd is included, the non-oriented region 40 is suppressed, and long-term stability is expected to be obtained.

PFP is used in the case where a high Tc superconducting film included in a superconducting power transmission cable is made using TFA-MOD. However, the PFP is isolated due to the electronegativity difference and causes the segregation of Sm and/or Nd at the substrate interface. Even if the segregation occurs, the segregation is eliminated by the pseudo-liquid phase in the case where the superconducting layer is about 110 nm and is thin. However, in the case where the thickness of the superconducting layer is thick such as 150 nm or 220 nm, the effects of the PFP become large; and it is difficult to stably obtain the desired characteristics. This is because the non-oriented region 40 exists. The cause of the non-oriented region 40 is the PFP. In the embodiment, at least one of the three PFPs bonded to the Sm or the Nd is replaced with TFA. Thereby, the segregation is suppressed. Also, the non-oriented region 40 of the interior of the superconducting layer is suppressed. A good perovskite structure is obtained.

When the non-oriented region 40 exists in the interior, film separation occurs easily; and it is easy for the effects of the film separation over long-term use, etc., to occur. By evaluating NL/BL by using the reference length BL having the length of 2 µm, the non-oriented region 40 can be evaluated correctly.

Although it was considered until now that only hydrogen contributed to the formation of the non-oriented region 40. It was found that the non-oriented region 40 is formed even for Sm and/or Nd bonded to three PFP. When PFP is bonded at all of the positions of the Sm, the electronegativity decreases compared to the case where TFA is bonded. When the electronegativity decreases, when the methanol evaporates from the gel film, the molecules that are bonded to the PFP are not easily affected by the upward stress. Thereby, segregation of the Sm occurs on the substrate interface side. Regions that do not have perovskite structures form due to the occurrence of the difference of the distributions of the Sm. Thereby, the non-oriented region 40 is formed. Thereby, the Jc value becomes low; and it becomes difficult to obtain stable characteristics.

Conversely, in the embodiment, PFP that is not replaced easily is dispersed in a large amount of a methanol solvent; and stoichiometric TFA is mixed. Thereby, the replacement with the TFA is promoted. Thereby, a value of 33% or more is obtained for the replacement ratio with TFA. If the operation is repeated, larger effects are expected. It is considered that a replacement ratio exceeding 67% can be realized.

In the gel film, the homogeneity of the interior of the superconductor is improved by reducing substances that are affected by the Coulomb force from the methanol. Thereby, the segregation of the Sm at the substrate vicinity can be suppressed. This phenomenon is substantially the same even if Nd is used instead of the Sm. By this technology, the formation of the non-oriented region 40 is suppressed for a superconducting layer having a thickness of about 220 nm. The substrate interface to the film upper portion have perovskite structures. By this technology, a thick SmBCO layer and a thick NdBCO layer can be obtained.

SmBCO and NdBCO are used effectively in a power transmission cable. The technology realizes a material including SmBCO and NdBCO that has good characteristics (Jc values).

Superconductivity is the phenomenon discovered using mercury by Kamerring Onnes of the Netherlands who developed a refrigerating machine. Subsequently, the superconducting transition temperature (Tc) of the upper limit according to the BCS theory was thought to be 39 K. However, this Tc is the Tc of a type-I superconductor. In an oxide superconductor which is a type-II superconductor discovered by Bednorz et al. in 1986, it is possible for superconducting and non-superconducting states to coexist. The type-II superconductor has a Tc that is higher than that of the BCS theory. Today, high temperature oxide superconductors that are usable at the temperature of liquid nitrogen are sold in lengths of about 500 m. There are expectations for the application of superconductors to various large-scale devices mainly in the form of wires in superconducting power transmission cables, fusion reactors, magnetically levitated trains, particle accelerators, magnetic diagnostic devices (MRI), etc.

High temperature oxide superconductors include first generation bismuth-based superconducting wire, and second generation yttrium-based superconducting wire. For the first generation, 60 vol % or more of silver is used. For the second generation, the base member is inexpensive and the physical strength is superior. For the second generation, the total length of wire sold has exceeded 3,000 km. A 50 MVA direct current power transmission cable system made using a large amount of wire has been in actual operation for more than two and a half years. For example, a direct current power transmission cable system having a capacity of 500 MVA has been operating. The capacity corresponds to a value that is nearly 50% of the electrical power of a standard nuclear reactor. Power transmission is being performed by a cable system having a diameter of about 15 cm.

A major application of the Y-based superconducting wire of which more than 3,000 km has been sold is power transmission cable systems. Verification tests of power transmission cables have advanced more than for other applications. It is considered that there is a relationship with magnetic field characteristics being unnecessary. A wire that has a length of more than 20 km is made using, for example, TFA-MOD (Metal Organic Deposition using TriFluoroacetates). Pulsed Laser Deposition and Metal Organic Chemical Vapor Deposition are used as other major manufacturing methods of the second generation. The composition control of these methods is problematic; and stable mass production of 500 m long wire is not being performed. Therefore, the wire of power transmission cable applications mainly is based on TFA-MOD.

The future of Pulsed Laser Deposition and/or Metal Organic Chemical Vapor Deposition is not negated. An inexpensive method would be mass-producible if three mutually-different types of elements can have atomic weights differing by a factor of 2 or more, can be projected in a vacuum, and can be controlled to have a composition shift, like that of TFA-MOD of 1% or less. It is said that this problem is difficult to solve. In coil applications, wires by Pulsed Laser Deposition and Metal Organic Chemical Vapor Deposition are leading. However, there are still no actual results of a wire of a length of about 500 m being mass produced and installed. It is considered that this is affected by the problem of the composition control.

The main reasons that wires came to be made stably by TFA-MOD are considered to be the following two. These are the reduction of the hydrogen-containing compound amount existing in the solution, and a thicker film by one-time coating.

In TFA-MOD, other than the methanol of the solvent, various side reactions are caused and the characteristics degrade if a substance containing hydrogen is included in the solution. In TFA-MOD, trifluoroacetic acid (TFA) is used; and fluorine atoms are included in a trifluoroacetate. If there is hydrogen in the solution, the hydrogen in the gel film after the film formation and the fluorine of a TFA group make hydrogen bonds; and the internal stress increases. Therefore, if the temperature is not less than a constant in the pre-bake, reactions occur; and hydrogen fluoride is formed. If the fluorine that is bonded to carbon is removed, the carbon does not evaporate easily at low temperatures; and the likelihood of residual carbon increases. In a $YBa_2Cu_3O_{7-x}$ (YBCO) superconductor, the carbon diffuses in the form of $CO_x$ in the Cu—O surface that bears the superconducting current and greatly reduces the superconducting characteristics.

In TFA-MOD, carbon substantially does not remain in the obtained superconductor even though a large amount of carbon is included in the trifluoroacetate itself. The reason is in the mechanism that expels the carbon in the pre-bake. It is considered that if the trifluoroacetate is decomposed by slowly increasing the temperature in the pre-bake, the other chemical bonds are broken while the bonds between the metals and the oxygen are maintained as-is. The boiling points of the compounds of the carbon fluorides ($C_2F_2$, $C_2F_6$, $CF_2O$, etc.) formed by the decomposition are about 60-70° C. and are low. These carbon fluorides easily scatter as a gas. Thereby, the carbon is expelled.

To cause the function of the carbon-expelling mechanism, the organic chain of the trifluoroacetic acid is gradually decomposed without causing severe combustion. If severe combustion occurs, the fluorine which reacts easily reacts with the metal; and a carbon component remains.

The carbon-expelling mechanism is obstructed even when hydrogen atoms exist in the pre-bake. The hydrogen atoms form hydrogen bonds that strongly attract the oxygen and the fluorine. Thereby, when forming carbon fluorides, the scattering of the carbon is impeded; and the carbon remains. The hydrogen reacts with the fluorine bonded to the carbon to produce hydrogen fluoride. Even in such a case, the carbon of the skeleton remains.

When carbon or a carbon compound remains, effects occur even when forming the perovskite structure in the main bake. In the main bake of TFA-MOD, the temperature is about 800° C.; and the partial pressure of oxygen is about 1,000 ppm. The carbon does not combust at these conditions. The carbon is not volatilized by vapor. The carbon component that remains obstructs the epitaxial growth in the pseudo-liquid phase formed in the main bake. The perovskite structure of the YBCO grows quickly in the a/b plane, i.e., the horizontal direction, based on the formation of a nucleus. When the residual carbon exists partway through the growth, the growth stops. When the nucleus is formed on the residual carbon, the orientation is disturbed; and a non-oriented region (a non-oriented layer) is formed. Uniformity of the composition which is a feature of TFA-MOD is affected by the residual carbon. The non-oriented region is formed. The cause of the residual carbon is the hydrogen.

In TFA-MOD, methanol is used as the solvent. Although methanol includes hydrogen, carbon does not remain in the superconducting film that is ultimately obtained; and the non-oriented region is not formed. This is because nearly all of the methanol evaporates in the film formation: further, nearly all of about 30 vol % of methanol that remains in the gel film in the pre-bake evaporates. Methanol has actual results of being used as a solvent in the manufacturing of large amounts of wire. In TFA-MOD, methanol is a substance that includes hydrogen and can be used as an exception.

In TFA-MOD, the superconducting characteristics degrade if alcohols having larger molecular weights are used as the solvent. To cause evaporation when using ethanol, 1-propanol, or 2-propanol as the solvent, the temperature that is used is higher than that of the case where methanol is used. Because the fluorine and the hydrogen of the alcohol react easily before the evaporation, the residual carbon amount increases; and the non-oriented region is formed.

Even in methanol, 0.5 mol % or less of ethanol, propanol, etc., are included. It is considered that trace alcohol does not affect even mass production. It is considered that if the amount is low, the effects of alcohol having a molecular weight not less than the molecular weight of ethanol are low.

Accordingly, in TFA-MOD, it is desirable to suppress the use of substances including hydrogen other than the methanol of the solvent. There are still no actual results of a long wire being made and installed in a coil or a power transmission cable for an octylic acid-based substance, etc., including a large amount of hydrogen. It is considered that this is due to the reasons described above. The hydrogen amount of TFA-MOD using an octylic acid-based substance and the hydrogen ratio due to the hydrogen used in a thicker film by one-time coating will now be described.

In TFA-MOD using octylic acid, the TFA salt that bonds with the Cu is replaced with octylic acid. In TFA-MOD, a hydrogen ratio RHF to the sum of the fluorine and the hydrogen (number of hydrogen atoms/(number of hydrogen atoms+number of fluorine atoms)) is maintained to be low. The hydrogen ratio RHF is set to be 2% or less, and desirably 1% or less. Methanol is excluded from the calculation of the hydrogen ratio RHF. As described above, this is because the methanol evaporates in the pre-bake and does not have an effect. In the case where all of the TFA that bonds to the Cu is replaced with octylic acid, the hydrogen ratio RHF is 81.1%. In such a case, the non-oriented region is formed in the interior due to the large amount of hydrogen. It is considered that the likelihood of obtaining a wire having a length of 500 m thereby is extremely low.

Even in the case where the amount of the octylic acid is reduced and the octylic acid is 10% of all of the groups bonded to the Cu, the hydrogen ratio RHF is 19.5%. Because the hydrogen ratio is high even in such a case, the effects are large. There are no actual mounting results of a wire of a length of about 500 m. It is considered that this is affected by the hydrogen. In TFA-MOD, the hydrogen ratio RHF is 0%.

In TFA-MOD, hydrogen is used when making a practical wire having a thickness of 0.8 μm or more. This is because the crack preventing agent used for the thicker film by one-time coating includes hydrogen. A chemical substance that is usable as the crack preventing agent is perfluorocarboxylic acid. Fluorine bonds to all of the carbon skeleton portions of this substance; and hydrogen does not exist. Therefore, the perfluorocarboxylic acid is not attracted to the TFA salt by hydrogen bonding. Also, the internal stress does not increase. In the pre-bake, it is desirable for the crack preventing agent to have the function of bonding with surrounding substances without decomposing to relax the drying stress in the pre-bake.

In TFA-MOD, the substances other than the crack preventing agent are full of mainly fluorine. Therefore, it is effective for stress relief to arrange hydrogen atoms in the crack preventing agent. A structure having hydrogen at the two end portions of the structure is effective as the crack preventing agent. In hydrogenated perfluorocarboxylic acid, one hydrogen atom exists at one end portion of the carbon chain; and only one hydrogen atom of a carboxyl group exists at the end portion on the side opposite to the carbon chain. The pair of hydrogen atoms makes bonds with the surrounding fluorine and relaxes the drying stress in the pre-bake. After the pre-bake, the hydrogenated perfluorocarboxylic acid decomposes, becomes carbon fluoride, and becomes a gas. Thereby, the thicker film by one-time coating is realized by using hydrogenated perfluorocarboxylic acid.

8H-PFCA is one crack preventing agent used for the thicker film by one-time coating. The added amount of this material is 10 mol %. The hydrogen ratio RHF in this case is calculated. In one unit cell, there is no hydrogen in the necessary TFA salts of Y, Ba, and Cu (1:2:3). The salts of yttrium trifluoroacetate, barium trifluoroacetate, and copper trifluoroacetate are provided in one unit cell. When fluorine bonds to all of these salts, the number of fluorine is 39. An amount of 10 mol % of 8H-PFCA is added. At this time, the average number of fluorine atoms is 1.4; and the average number of hydrogen atoms is 0.2. In such a case, the hydrogen ratio RHF is 0.49%. The hydrogen ratio RHF in such a case is sufficiently small. Accordingly, 8H-PFCA is suited to the manufacture of a long wire. A special substance that is different from the crack preventing agent used in conventional Metal Organic Deposition is used as the crack preventing agent used in TFA-MOD to avoid the effects of hydrogen.

As recited above, for the thicker film by one-time coating, the amount of hydrogen is reduced; and the formation of the non-oriented region is suppressed. Interfaces are formed when TFA-MOD is used in YBCO superconducting wire manufacturing and a film thickness increase is made by repeated coating. However, it is desirable for the YBCO superconducting wire to have a dual-axis orientation structure. Accordingly, the tolerance of the effects at the interface becomes stringent.

The solution that is used in TFA-MOD is a strong acid having a pH of about −0.6. Because the surface of the layer when the pre-bake is performed for the first time is a metal oxide, the metal oxide reacts with the strong acid and causes an unusual phase. It may be attempted to reduce the acidity by replacing the TFA of the Cu-TFA with octylic acid. However, even if all of the TFA bonded to the Cu is modified to octylic acid, the acid of the entirety is reduced to only 50%. At this time, the strong acid has a pH of −0.3. Therefore, a reaction occurs with the surface oxide layer after the pre-bake; and effects occur. Further, effects occur due to the large amount of hydrogen of the octylic acid; and a non-oriented region also is formed.

The likelihood of the interface by repeated coating being uniform at the atomic level is exceedingly low. As an example, the yield for manufacturing a 500 m line will be calculated for the case, where a yield of 95% is obtained by two-time coating of 10 m.

In a two-time coating method for a length of 10 m, the yield rate of a superconducting wire being obtained in which the characteristics do not degrade is notated as $\gamma=R(10, 2)$. When the yield is 95%, $\gamma=R(10, 2)=0.95$. According to the notation, $R(\alpha, \beta)=\gamma^{(\alpha/10\times(\beta-1))}$. Although the surface of one-time coating degrades due to the thermal history in three-time coating, it is assumed in the calculation that the surface of one-time coating does not degrade in the example. In the case where $\gamma=0.95$, the yield of the wire manufacturing of 500 m is $R(500, 2)=0.077$. The yield when manufacturing a wire of 500 m by three-time coating is $R(500, 3)=0.0059$. In the case of eight-time coating, the yield of the 500 m line is $R(500, 8)=1.60\times10^{-8}$ and is markedly low.

Practically, it is desirable for the yield to be 80% or more. In other words, $R(500, 8)>0.80$. In such a case, $\gamma$ is 0.9994. Effects occur due to the surface oxide layer reacting with the strong acid. Therefore, in two-time coating for a length of 10 m, it is markedly difficult to obtain a yield of 99.94%. It is considered that such problems are why repeated coating has not been practically employed in the past. Accordingly, the thicker film technology by one-time coating is practically used in TFA-MOD.

In TFA-MOD as described above, technology for suppressing hydrogen-based substances and technology for the thicker film by one-time coating are desirable. Further, for power transmission cable applications, technology for obtaining a high Tc superconductor is desirable.

In the power transmission cable system, for example, a cooling post is placed every 5 km; and liquid nitrogen for cooling is supplied. For example, the critical temperature Tc of a Y-based superconductor having a good critical current density (Jc value) is 90.7 K. On the other hand, the temperature of liquid nitrogen is 77.4 K. The difference between the critical temperature Tc and the temperature of liquid nitrogen is 13.3 K and is small. For YBCO, a critical temperature Tc of 92 K to 93 K is obtained for low Jc values as in a bulk body. However, in YBCO that has good superconducting characteristics (a high Jc value), the critical temperature Tc is 90.7 K. In the YBCO superconductor, the superconducting characteristics (the Jc value) abruptly decrease due to the increase of the temperature. Therefore, a temperature increase is substantially not tolerated in applications for power transmission cable systems.

To maintain the temperature in the entire cable system region to be stably 77.4 K or less, investigations are being performed to supply liquid nitrogen that is cooled even more. However, liquid nitrogen solidifies when cooled excessively. For example, to supply liquid nitrogen at about 69 K from the cooling post and maintain 77.4 K or less when returning, the spacing between the cooling posts becomes short; and the cost increases. Thus, for applications in power transmission cable systems, a long superconductor is desirable that has stable characteristics (a high Jc value) and a higher critical temperature Tc by using TFA-MOD.

Other than Bi-based superconductors, Hg-based, Tl-based, etc., exist as superconductors having high critical temperatures Tc. The Tl-based temperature Tc is reported to be about 130 K. However, at a temperature of 77.4 K, the Jc of the Tl-based superconductor is a Jc value of not more than $\frac{1}{100}$ of the value of a YBCO superconductor. Therefore, the Tl-based superconductor substantially cannot be used in a power transmission cable. Therefore, superconductors that have high critical temperatures Tc of the same type as a YBCO-based superconductor having a large Jc value are candidates. Specifically, a $LaBa_2Cu_3O_{7-x}$ (LaBCO) superconductor, a $NdBa_2Cu_3O_{7-x}$ (NdBCO) superconductor, a $SmBa_2Cu_3O_{7-x}$ (SmBCO) superconductor, etc., are examples.

It is difficult to manufacture a LaBCO superconductor. Although it is said that the critical temperature Tc of a LaBCO superconductor is 103 K, the precise value is uncertain. The critical temperature Tc of a NdBCO superconductor is said to be 96.0 K. The critical temperature Tc of a SmBCO superconductor is said to be 94.0 K. These critical temperatures Tc correspond respectively to improvements of 40% and 25% over the temperature difference (the margin) between the temperature of liquid nitrogen and the critical temperature Tc of the current YBCO superconductor.

In the synthesis of the solutions used when manufacturing the NdBCO superconductor and the SmBCO superconductor using TFA-MOD, the methanol and the trifluoroacetate decompose due to esterification. This reaction (the esterification) occurs easily in the NdBCO superconductor and the SmBCO superconductor because the ionic radii of Nd and Sm are large and because Nd and Sm are chemically active.

If the refining conditions of the solution are relaxed to suppress the esterification, the impurity amounts increase due to incomplete refining; and the superconducting characteristics degrade. If the refining conditions are relaxed, the non-oriented region 40 that, is considered to be caused by carbides is formed; and the superconducting characteristics (the Jc value) markedly decrease. Therefore, it is desirable to suppress the esterification in a method that is not a method for relaxing the refining conditions. For example, there is a reference example in which the esterification is suppressed by using heptafluorobutyl acid or pentafluoropropionic acid (PFP) having a high decomposition temperature and having the same chemical structure as TFA. Similarly to metal salts of TFA, hydrogen is not included in metal salts of PFP and metal salts of heptafluorobutyl acid. Accordingly, the hydrogen ratio RHF is 0.0 in the case where a crack preventing agent is not used.

According to the reference example, the esterification is suppressed; and Sm-based and Nd-based superconductors having high characteristics are obtained. For example, if PFP is used, a critical temperature Tc of 93.9 K (a value near the theoretical value) is obtained for a Sm-based superconductor. For example, a critical temperature Tc of 93.6 K is obtained for a Nd-based superconductor. The number of carbon atoms of PFP is one larger than the number of carbon atoms of TFA. PFP does not include hydrogen. It had been considered that good characteristics are obtained in the reference example even when PFP and TFA coexist.

For a power transmission cable, rather than a thin film (less than 200 nm), a thick film is necessary (200 nm or more, and desirably 1 μm ore more). Using this technology, to attempt to realize a thick film of SmBCO, the characteristics undesirably decrease greatly. For a sample having a small size, a high Jc value may be obtained for a thickness of 220 nm or 300 nm. However, the reproducibility is low; and it is difficult to stably manufacture a long wire.

By performing cross-section TEM observation to verify the cause, a state was observed in which Sm is segregated at the substrate interface. For example, for the thickness (the thinness) of 110 nm, a high Jc value of 7 $MA/cm^2$ (77 K and 0T) is obtained. However, it was estimated from the TEM observation results that the high Jc value is obtained when the superconductor is thin because the effects of the segregation are relaxed because the superconductor is thin. Further, a non-oriented region was observed in the interior in the TEM observation image. When using a thicker film by one-time coating, a void forms in the superconductor due to the effects of the crack preventing agent. However, the non-oriented region when Sm-PFP-based was not a void and was something else.

It is the non-oriented region that becomes a problem when manufacturing a long wire. Substances are filled into the non-oriented layer region. There are many cases where such substances do not have stoichiometric compositions. The non-oriented region causes the formation of mutually-different multiple phases due to the stoichiometry shift. On the other hand, nothing is included in the interior of the void formed by the thicker film technology by one-time coating. Therefore, the stoichiometry is maintained at the portions surrounding the void formed using the thicker film technology by one-time coating.

There is a problem with degradation over time of the superconductor in the manufacture of a long wire. It is considered that this problem is due to moisture absorption due to the non-oriented region. The specific surface area of the non-oriented region is large. When water vapor adsorbs to the surface of the non-oriented region and the water vapor is supplied to the perovskite structure at the periphery of the non-oriented region for a long period of time, the perovskite structure is decomposed; and an oxide is formed. The average density after at least a portion of the perovskite structure is decomposed is lower than 6.3 g/cm$^3$ of the density of the perovskite structure (the superconductor). The average density (the density of $Y_2O_3$ or the density of CuO) of the structure after the decomposing is about 3. Also, the volume increases. The increased volume causes internal breakdown and has a severe effect.

Further, there is also a problem in which the mechanical strength decreases due to the formation of the non-oriented region. The strength of the portion not having the perovskite structure decreases. It is desirable to suppress the non-oriented region.

Although the formation of the non-oriented region is conventionally observed even in TFA-MOD, hydrogen atoms other than the methanol existing in the solution were the cause. However, in the Sm-based superconductor herein, the PFP forms a salt with the Sm; and hydrogen does not exist. It is considered that a conventionally-unknown phenomenon is occurring.

Even when the non-oriented region exists, a critical temperature Tc of some level and a Jc value of some level are obtained. It is considered that this is because the superconducting current detours through the non-oriented region. Accordingly, conventionally, the non-oriented region is not considered to be a problem. However, according to investigations by the inventor of the application, the non-oriented region affects the yield of the manufacturing of the long wire, the long-term stability when using as a product, etc. The embodiments of the application are focused upon the non-oriented region.

It is considered that the non-oriented region is caused by the PFP. The molecular structure of PFP is similar to the molecular structure of TFA. However, the polarity of PFP greatly differs from that of TFA. In TFA, a fluorine atom having a negative charge exists at the end portion of the TFA. Therefore, the TFA is strongly attracted to surrounding substances by the Coulomb force. On the other hand, for PFP, the fluorine atom that has the greatest negative charge is the fluorine bonded to the carbon adjacent to the carboxyl group. The degree of the negative charge is low for fluorine different from the fluorine bonded to the carbon adjacent to the carboxyl group. Therefore, the polarity of the PFP is lower than that of the TFA. Therefore, in the case where the TFA and the PFP coexist, it is predicted that the TFA and the PFP will separate.

There is a possibility that the molecules included in the solution used in TFA-MOD may separate due to the difference of the densities and the difference of the atomic weights. There is a possibility that the separation of the molecules included in the solution used in TFA-MOD may be suppressed by the Coulomb force. Considerations of these possibilities are recited as follows. First, a result to be referenced is the TOF-SIMS analysis results of the gel film of the TFA salt. The TFA salt was mixed uniformly. The molecular weights of $(CF_3COO)_3Y$, $(CF_3COO)_2Ba$, and $(CF_3COO)_2Cu$ respectively are 427.95, 363.37, and 289.58. Then, the volume of the molecules is estimated to roughly calculate the density.

The volume of the trifluoroacetate substantially is determined by the number of trifluoroacetic acid groups. This molecule has one metallic element at the center. The positive ion is the central metallic element. A trifluoroacetic acid group that includes seven elements is bonded to the central metallic element. The volumes of $(CF_3COO)_2Ba$ and $(CF_3COO)_2Cu$ are volumes corresponding to 15 atoms. The ionic radius of the central element is proportional to the atomic weight. The ionic radii of $Cu^{2+}$, $Y^{3+}$, and $Ba^{2+}$ respectively are 0.73, 1.02, and 1.35 (×0.1 nanometers). The atomic weights of $Cu^{2+}$, $Y^{3+}$, and $Ba^{2+}$ respectively are 63.55, 88.91, and 137.3. When the atomic weight of the element is large, the radius is large; and the density difference is in the decreasing direction.

To simplify, the density calculation is performed by assuming that the volumes of the central metallic elements are the same. In such a case, because the molecular weight ratio corresponds to the density difference as-is, the density of $(CF_3COO)_2Ba$ is about 1.25 times the density of $(CF_3COO)_2Cu$. On the other hand, if the volume of $(CF_3COO)_3Y$ is taken to be 1.5 times the volume of $(CF_3COO)_2Cu$, the density of $(CF_3COO)_3Y$ is 0.99 times the density of $(CF_3COO)_2Cu$.

Thus, for the three types of metal trifluoroacetates, the density difference caused by the mass is slight. A homogeneous metal ion distribution is confirmed from the results of TOF-SIMS. Therefore, it is considered that it is not the density of the molecule but the Coulomb force that determines the homogeneity of the gel film in TFA-MOD.

It is considered that the difference of the Coulomb force occurs between PFP and TFA because the polarities are different. The methanol in the gel film evaporates in the pre-bake. The evaporation greatly affects the TFA salt and pulls the trifluoroacetic acid group upward. The Coulomb force that acts on the PFP salt is small; and the PFP collects relatively on the substrate side. The separation proceeds particularly markedly in the case where a small amount of a PFP salt exists in the TFA salt.

As a reference example, there is an attempt to replace the PFP with TFA. For example, there is a test in which a PFP salt and a TFA salt are caused to coexist in a thin film superconductor. For example, as a reference example, there is an attempt to directly sprinkle TFA into the PFP salt and return the PFP salt to TFA. Conventionally, it is considered that the replacement of the PFP with TFA did not proceed sufficiently. It is considered that the reason is as follows.

For PFP and TFA, it is considered that the replacement proceeds easily if the dissociation constant of one substance is large. That, is, if the dissociation constant of the TFA is larger than the dissociation constant of the PFP, if is considered that the replacement with TFA proceeds by mixing the TFA and the PFP. However, the pH of TFA is about −0.6; and the pH of PFP is about −1.0. Although the polarity of TFA is strong, TFA is a weaker acid than PFP.

The fluorine of the TFA group removes an electron from the hydrogen or the metallic element bonded to the TFA group. Thereby, the TFA group becomes a strong acid. The number of fluorine of the TFA group that remove an electron is 3. On the other hand, the number of fluorine of PFP is 5. It is considered that the PFP thereby becomes a stronger acid than TFA. This shows that the replacement with TFA does not proceed easily by simply mixing TFA and PFP. Further, in the reference example, the salts are directly mixed without diluting the PFP salt with methanol, etc. It is considered that the PFP and the TFA which is a weak acid were thereby caused to contact in a state in which the dissociation was insufficient; and the replacement did not proceed. The refining of the solution for which the replacement is to be performed is performed in a large amount of the solvent by using a rotary evaporator. Thereby, 40% of the PFP is replaced with TFA. It is considered that in a conventional method, the replacement rate is 10% to 15%.

Sm is trivalent; and three groups (e.g., at least one of PFP or TFA) are bondable with Sm. For example, when three PFPs are bonded to the Sm, the difference between the electronegativities of the TFA and the Sm to which the three PFPs are bonded is large; and these substances do not coexist easily. In the pre-bake, about 30% by volume ratio of methanol exists and evaporates. The methanol evaporates while making hydrogen bonds with substances having fluorine. For example, in the case where all of the three groups bonded to the Sm are groups of the TFA salt, the effect, of the density difference is small; therefore, the TFA salt is affected by the upward stress when evaporating the methanol in the pre-bake. As a result, the homogeneity is maintained.

On the other hand, in the case where $Sm(PFP)_3$ exists and coexists with the TFA salt, the stress applied to the $Sm(PFP)_3$ is small. As a result, a Sm component segregates at the substrate interface. The segregation of the Sm is confirmed when the film formed using the method of the reference example is analyzed. Previously, a Jc value of 7 $MA/cm^2$ (77 K and 0 T) that is considered to be nearly the theoretical value was obtained for a thin film; but it is estimated that the segregation of the Sm was eliminated and good characteristics were obtained because of the thin film.

For example, in the case where the thickness of the superconducting layer is about 250 nm or more (e.g., 220 nm or more) and the segregation of the Sm amount becomes large, it is difficult to eliminate the segregation of the Sm by the pseudo-liquid phase formation in the main bake. Sm is an element that enters the Y sites but does not enter the Ba sites and the Cu sites. The segregation of the Sm may cause a shift of the stoichiometry and may cause the formation of a structure (the non-oriented region) other than the perovskite structure. It is considered that the segregation of the Sm is proportional to the increase of the thickness. It is considered that there is no focus on the segregation of the Sm in conventional technology. Conventionally, the formation process of the non-oriented region was not known. Conventionally, the effects of the non-oriented region also were not known. Therefore, a problem did not exist in conventional technology. In conventional technology, the reproducibility of obtaining good characteristics was low.

It is not simple to replace the PFP group bonded to the Sm with the TFA group. Although it also may be considered to increase the replacement processing, the number of replacement processing cannot be excessively large because the esterification proceeds if the number of replacement processing is increased. In conventional technology, it is difficult to manufacture thick SmBCO having a high Jc value but not including a non-oriented region.

A superconductor that has the characteristics of SmBCO is to be realized. However, separation occurs when a small amount of Sm-PFP is mixed into a Y-TFA-based substance. For example, in the case where a coating solution of YBCO is mixed into a coating solution including Sm-PFP at a proportion of 5% (Sm:Ba:Cu being 1:2:3), the PFP salt in the solution is a PFP salt of Sm. Also, many other metal salts are TFA salts. In such a case, the Sm segregation proceeds more markedly. Therefore, this cannot be solved by simply mixing the SmBCO solution and the YBCO solution.

In the case where the Sm segregates at the substrate vicinity, for example, the concentration of the Sm among the six components is high in the region where the Sm segregates. Thereby, the formation of a pseudo-liquid phase starts at a high temperature. The pseudo-liquid phase is formed when the six elements collect at a constant concentration and are heated. There are cases where the components are insufficient in the pseudo-liquid phase. In the case where a portion of the components are excessive in the pseudo-liquid phase, the pseudo-liquid phase is formed at a higher temperature.

When the non-oriented region is formed by the Sm segregation, a layer is formed and grows in the upper portion of the non-oriented region where the structure is greatly disturbed from the perovskite structure. It is desirable to suppress the segregation toward the interface and to suppress the formation of the non-oriented region. Thereby, a superconductor having high characteristics (the Jc value) for SmBCO and NdBCO is obtained.

According to the embodiments, a superconductor and a method for manufacturing the superconductor can be provided in which it is possible to increase the critical current density.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in superconductor such as substrate and superconducting layer, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all superconductors and all methods for manufacturing the superconductor practicable by an appropriate design modification by one skilled in the art based on the superconductors and the methods for manufacturing the superconductor described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A superconductor, comprising:
a base member; and
a superconducting layer provided on the base member, the superconducting layer having a first surface on the base member side, and a second surface on a side opposite to the first surface,
a lattice constant of the base member substantially matching a lattice constant of the superconducting layer,
the superconducting layer including $REA_{1-x}REB_xBa_2Cu_3O_{7-z}$,
the x being not less than 0.01 and not more than 0.40,
the z being not less than 0.02 and not more than 0.20, the REA including at least one of Y, Eu, Gd, Tb, Dy, Ho, Er, Tm, Yb, or Lu, the REB including at least one of Nd or Sm, the superconducting layer including a first surface-side region including a portion of the first surface, a thickness of the first surface-side region along a first direction being 70% of an average thickness of the superconducting layer along the first direction, the first direction being from the first surface toward the second surface, a length of the first surface-side region along a second direction parallel to the first surface being 2 micrometers, the first surface-side region including:
a first region having an orientation property; and
a second region, an orientation property in the second region being lower than the orientation property in the first region, a length of the second region along the second direction being not more than 0.15 times the length of the first surface-side region.

2. The superconductor according to claim 1, wherein the length of the second region along the second direction is not more than 0.147 times the length of the first surface-side region.

3. The superconductor according to claim 1, wherein at least a portion of the second region is arranged with the first region in a direction crossing the first direction.

4. A superconductor, comprising;
a base member; and
a superconducting layer provided on the base member,
the superconducting layer having a first surface on the base member side, and a second surface on a side opposite to the first surface,
a lattice constant of the base member substantially matching a lattice constant of the superconducting layer,
the superconducting layer including $REA_{1-x}REB_xBa_2Cu_3O_{7-z}$,
the x being not less than 0.01 and not more than 0.40,
the z being not less than 0.02 and not more than 0.20,
the REA including at least one of Y, Eu, Gd, Tb, Dy, Ho, Er, Tm, Yb, or Lu,
the REB including at least one of Nd or Sm,
the superconducting layer including a first surface-side region including a portion of the first surface,
a thickness of the first surface-side region along a first direction being 70% of an average thickness of the superconducting layer along the first direction, the first direction being from the first surface toward the second surface,
a length of the first surface-side region along a second direction parallel to the first surface being 2 micrometers,
the first surface-side region being made of a c-axis orientation region, an a-axis orientation region, and a b-axis orientation region.

5. The superconductor according to claim 1, wherein the base member has one of
a second lattice constant along a direction perpendicular to the first direction, the second lattice constant being not less than 0.93 times and not more than 1.07 times a first lattice constant of the superconducting layer along the perpendicular direction,
a third lattice constant along the perpendicular direction, the third lattice constant being not less than 1.32 times and not more than 1.54 times the first lattice constant, or a fourth lattice constant along the perpendicular direction, the fourth lattice constant being not less than 0.649 times and not more than 0.758 times the first lattice constant.

6. The superconductor according to claim 1, wherein a fluorine concentration in the first surface-side region is not less than $2\times10^{16}$ atoms/cm$^3$ and not more than $5\times10^{19}$ atoms/cm$^3$.

7. The superconductor according to claim 1, wherein a carbon concentration in the first surface-side region is not less than $1\times10^{18}$ atoms/cm$^3$ and not more than $5\times10^{20}$ atoms/cm$^3$.

8. The superconductor according to claim 1, wherein the REB includes Sm.

9. The superconductor according to of claim 1, wherein
the REB includes Nd, and
the x is not less than 0.01 and not more than 0.30.

10. The superconductor according to claim 1, wherein
the average thickness of the superconducting layer along the first direction is 100 nm or more,
the superconducting layer includes a first partial region, a second partial region, and a third partial region,
a center in the first direction of the first partial region is a first center position,
a center in the second direction of the first partial region is the first center position,
a length along the first direction of the first partial region is 2 nm,
a length along the second direction of the first partial region is 2 nm,
a distance along the first direction between the first center position and the first surface is ½ of the average thickness of the superconducting layer along the first direction,
a center in the first direction of the second partial region is a second center position,
a center in the second direction of the second partial region is the second center position,
a length along the first direction of the second partial region is 10 nm,
a length along the second direction of the second partial region is 10 nm,
a distance along the first direction between the second center position and the first surface is ½ of the average thickness of the superconducting layer along the first direction,
a center in the first direction of the third partial region is a third center position,
a center in the second direction of the third partial region is the third center position,
a length along the first direction of the third partial region is 50 nm,
a length along the second direction of the third partial region is 50 nm,
a distance along the first direction between the third center position and the first surface is ½ of the average thickness of the superconducting layer along the first direction,
a variance of a first ratio, a second ratio, and a third ratio being not more than 0.325 times an average of the first ratio, the second ratio, and the third ratio, the first ratio being a ratio of an amount of the REB included in the first partial region to an amount of a metallic element included in the first partial region, the second ratio being a ratio of an amount of the REB included in the second partial region to an amount of a metallic element included in the second partial region, the third ratio being a ratio of an amount of the REB included in the third partial region to an amount of a metallic element included in the third partial region.

11. The superconductor according to claim 1, wherein the average thickness of the superconducting layer along the first direction is 200 nanometers or more.

12. The superconductor according to claim 1, wherein the first surface-side region includes;
a third region; and
a fourth region provided between the third region and the base member,
the fourth region includes the first surface,
a thickness along the first direction of the fourth region is 50 nm,
a fourth region ratio of an amount of the REB included in the fourth region to an amount of a metallic element included in the fourth region is not less than a third region ratio of an amount of the REB included in the third region to an amount of a metallic element included in the third region.

13. The superconductor according to claim 12, wherein the fourth region ratio is not less than 1 times and not more than 3.5 times the third region ratio.

14. The superconductor according to claim 1, wherein the first surface-side region includes:
a third region; and
a fourth region provided between the third region and the base member,
the fourth region includes the first surface,
a thickness along the first direction of the fourth region is 50 nm.
the third region includes a plurality of fifth regions,
a length along the first, direction of each of the plurality of fifth regions is 10 nm,
a length along the second direction of each of the plurality of fifth regions is 10 nm,
each of the plurality of fifth regions has a fifth region ratio of an amount of the REB included in each of the plurality of fifth regions to an amount of a metallic element included in the plurality of fifth regions, and
a variance of the fifth region ratios of the plurality of fifth regions is not more than 0.18 times an average of the fifth region ratios of the plurality of fifth regions.

15. The superconductor according to claim 1, wherein the first region has a perovskite structure.

* * * * *